United States Patent
Rossmann

Patent Number: 5,911,485
Date of Patent: Jun. 15, 1999

[54] PREDICTIVE DATA ENTRY METHOD FOR A KEYPAD

[75] Inventor: Alain Rossmann, Menlo Park, Calif.

[73] Assignee: Unwired Planet, Inc., Redwood City, Calif.

[21] Appl. No.: 08/570,384

[22] Filed: Dec. 11, 1995

[51] Int. Cl.[6] .................................................. H03K 17/94
[52] U.S. Cl. ................................. 34/22; 341/20; 341/23; 379/93.18; 379/93.23; 364/709.12
[58] Field of Search .................................. 341/23, 26, 20, 341/22; 364/709.15, 705.05, 189, 709.12; 345/168, 169, 172; 379/93.17, 93.23, 93.26, 93.27, 354, 355, 356, 93.18

[56] References Cited

U.S. PATENT DOCUMENTS

| | | | |
|---|---|---|---|
| 4,427,848 | 1/1984 | Tsakanikas | 379/93.27 |
| 4,677,659 | 6/1987 | Dargar | 379/93.27 |
| 4,737,980 | 4/1988 | Curtin et al. | 345/168 |
| 4,866,759 | 9/1989 | Riskin | 379/93.27 |
| 5,031,206 | 7/1991 | Riskin | 379/93.27 |
| 5,128,672 | 7/1992 | Kaehler | 341/23 |
| 5,200,988 | 4/1993 | Riskin | 379/93.27 |
| 5,561,710 | 10/1996 | Helms | 379/93.27 |

*Primary Examiner*—Brian Zimmerman
*Assistant Examiner*—Timothy Edwards, Jr.
*Attorney, Agent, or Firm*—Skjerven, Morrill, MacPherson, Franklin & Friel; Edward C. Kwok

[57] ABSTRACT

A predictive data entry method permits a user of a device to efficiently enter data using a keypad where each of a plurality of keys represents a plurality of different characters. When the user presses one of the keys representing multiple characters, the predictive data entry method determines the character within the multiple characters most likely desired by the user. Thus, in most instances, a single key stroke is sufficient to select the desired character.

28 Claims, 36 Drawing Sheets

Microfiche Appendix Included
(6 Microfiche, 369 Pages)

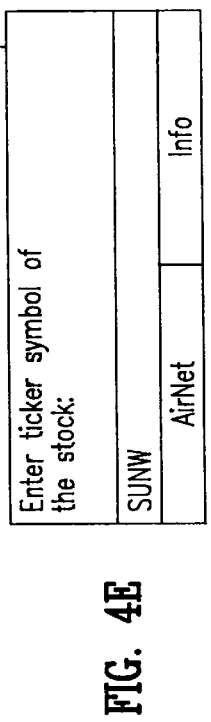
FIG. 4E
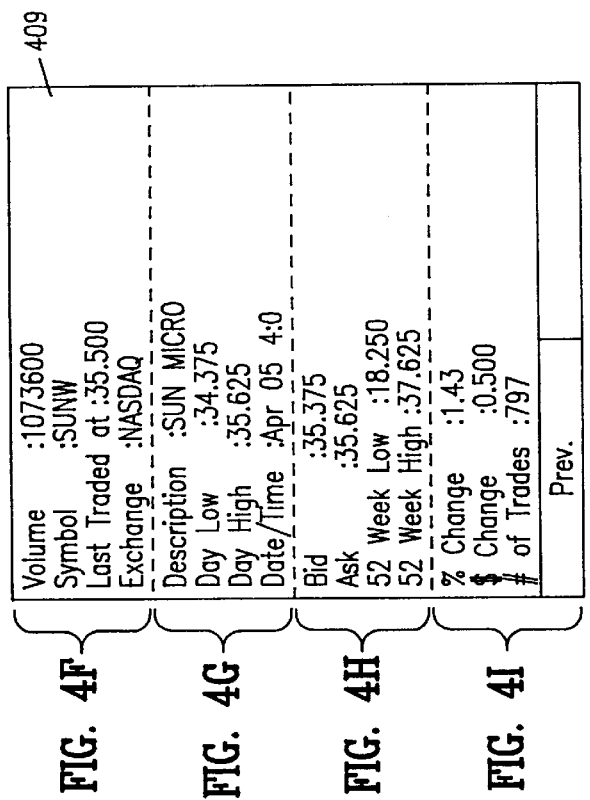
FIG. 4F
FIG. 4G
FIG. 4H
FIG. 4I
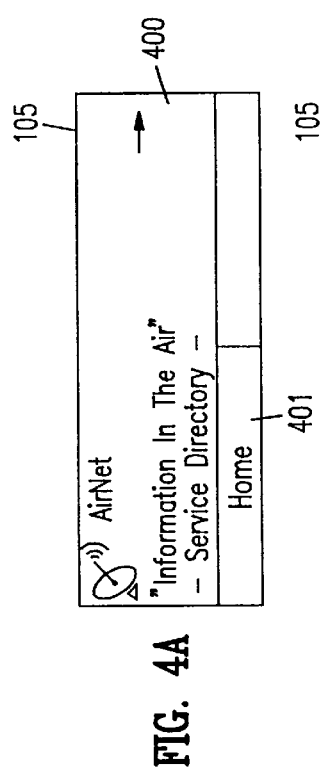
FIG. 4A
FIG. 4B
FIG. 4C
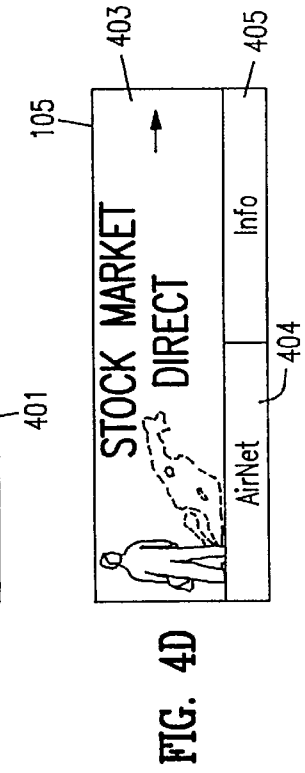
FIG. 4D

| | | 1 | 2 | 3 | 4 | 5 | 6 | 7 | 8 | 9 |
|---|---|---|---|---|---|---|---|---|---|---|
| "- | -" | | | | | | | | | |
| "a | a" | q | a | d | g | j | m | r | t | w |
| "a | b" | q | a | e | i | l | o | r | u | w |
| "a | c" | q | c | e | h | k | m | r | t | w |
| "a | d" | q | a | d | i | j | m | s | v | y |
| "a | e" | q | a | d | g | j | m | p | t | w |
| "a | f" | q | a | f | g | j | m | r | t | w |
| "a | g" | q | a | e | i | j | o | r | t | w |
| "a | h" | q | a | e | g | j | m | p | u | w |
| "a | i" | q | c | d | g | l | n | r | t | w |
| "a | j" | q | a | d | g | j | o | p | t | w |
| "a | k" | q | a | e | i | j | m | s | t | w |
| "a | l" | q | a | e | i | l | o | s | t | w |
| "a | m" | q | a | e | i | l | o | p | u | w |
| "a | n" | q | c | d | g | k | n | s | t | y |
| "a | o" | q | a | d | g | j | m | p | t | w |
| "a | p" | q | a | e | h | l | o | p | t | w |
| "a | q" | q | a | d | g | j | m | s | t | w |
| "a | r" | q | c | e | g | k | o | r | t | y |
| "a | s" | q | c | e | i | k | o | s | t | y |
| "a | t" | q | a | e | i | l | o | s | t | w |
| "a | u" | q | c | d | g | l | m | s | t | w |
| "a | v" | q | a | e | i | j | o | p | t | w |
| "a | w" | q | a | d | g | k | m | p | t | w |
| "a | x" | q | a | e | i | l | m | s | t | w |
| "a | y" | q | b | e | i | j | m | s | t | w |
| "a | z" | q | a | d | i | j | m | p | t | w |
| "a | " | q | a | d | g | j | m | p | t | w |
| "b | a" | q | c | d | g | k | n | s | t | y |
| "b | b" | q | a | d | i | j | m | s | t | y |
| "b | c" | q | a | d | g | j | o | r | t | w |
| "b | d" | q | a | d | g | j | m | s | t | w |
| "b | e" | q | c | e | g | l | n | s | t | x |
| "b | f" | q | a | d | g | j | m | p | t | w |
| "b | g" | q | a | d | g | j | m | p | t | w |
| "b | h" | q | a | d | g | j | m | p | t | w |
| "b | i" | q | c | d | g | l | n | s | t | w |
| "b | j" | q | a | e | g | j | m | p | t | w |

FIG. 10A

| "-  -" | 1 | 2 | 3 | 4 | 5 | 6 | 7 | 8 | 9 |
|---|---|---|---|---|---|---|---|---|---|
| "b k" | q | a | d | g | j | m | p | t | w |
| "b l" | q | a | e | i | j | o | p | t | y |
| "b m" | q | a | d | g | j | m | r | t | w |
| "b n" | q | a | d | g | j | m | p | t | w |
| "b o" | q | a | d | i | j | o | s | u | x |
| "b p" | q | a | d | g | j | m | s | t | w |
| "b q" | q | a | d | g | j | m | p | t | w |
| "b r" | q | a | e | i | j | o | p | u | w |
| "b s" | q | c | d | i | j | o | s | t | w |
| "b t" | q | a | d | g | j | m | p | t | w |
| "b u" | q | a | d | i | l | m | s | t | y |
| "b v" | q | a | d | i | j | m | p | t | w |
| "b w" | q | a | e | g | j | m | p | t | w |
| "b x" | q | a | d | g | j | m | p | t | w |
| "b y" | q | a | d | g | j | m | p | t | w |
| "b z" | q | a | d | g | j | m | p | t | w |
| "b  " | q | a | d | g | j | m | p | t | w |
| "c a" | q | b | d | g | l | n | r | t | w |
| "c b" | q | a | e | g | j | m | p | t | w |
| "c c" | q | a | e | i | j | o | s | t | w |
| "c d" | q | a | d | g | j | m | p | t | w |
| "c e" | q | a | d | i | l | n | s | t | w |
| "c f" | q | a | d | i | j | m | p | t | w |
| "c g" | q | a | d | i | j | m | p | t | w |
| "c h" | q | a | e | i | j | o | r | t | w |
| "c i" | q | a | f | i | l | n | p | t | w |
| "c j" | q | a | d | g | j | m | p | t | w |
| "c k" | q | b | e | i | l | m | s | t | y |
| "c l" | q | a | e | i | j | o | r | u | w |
| "c m" | q | c | d | g | j | m | p | t | w |
| "c n" | q | a | d | g | j | m | p | t | w |
| "c o" | q | a | d | g | l | m | r | u | w |
| "c p" | q | a | d | g | j | m | p | t | w |
| "c q" | q | a | d | g | j | m | p | t | w |
| "c r" | q | a | e | i | j | o | p | u | y |
| "c s" | q | a | d | i | l | o | s | t | w |
| "c t" | q | a | e | i | l | o | r | u | w |

FIG. 10B

| "-" | -" | 1 | 2 | 3 | 4 | 5 | 6 | 7 | 8 | 9 |
|---|---|---|---|---|---|---|---|---|---|---|
| "c | u" | q | b | e | i | l | m | s | t | w |
| "c | v" | q | a | d | g | j | m | p | t | w |
| "c | w" | q | a | d | g | j | m | p | t | w |
| "c | x" | q | a | d | g | j | m | p | t | w |
| "c | y" | q | c | d | g | j | m | p | t | w |
| "c | z" | q | a | d | g | j | n | p | t | w |
| "c | " | q | a | d | g | j | m | p | t | w |
| "d | a" | q | b | d | g | j | n | r | t | y |
| "d | b" | q | a | d | g | j | m | p | t | w |
| "d | c" | q | a | d | g | j | m | p | t | w |
| "d | d" | q | a | e | i | l | m | r | t | w |
| "d | e" | q | a | d | g | l | m | r | v | x |
| "d | f" | q | a | d | i | j | m | p | t | w |
| "d | g" | q | a | e | g | j | m | p | t | w |
| "d | h" | q | a | e | g | j | m | p | t | w |
| "d | i" | z | a | f | g | l | n | s | t | w |
| "d | j" | q | a | d | g | j | m | p | t | w |
| "d | k" | q | a | d | g | j | m | p | t | w |
| "d | l" | q | a | e | i | j | m | p | t | y |
| "d | m" | q | a | d | i | j | m | s | t | w |
| "d | n" | q | a | e | g | j | m | p | t | w |
| "d | o" | q | c | e | i | j | n | p | t | w |
| "d | p" | q | a | d | g | j | m | p | t | w |
| "d | q" | q | a | d | g | j | m | p | u | w |
| "d | r" | q | a | e | i | j | o | p | t | w |
| "d | s" | q | a | e | i | j | m | p | t | w |
| "d | t" | q | a | d | g | j | m | r | t | w |
| "d | u" | q | c | e | g | l | m | r | t | w |
| "d | v" | q | a | d | i | j | m | p | t | w |
| "d | w" | q | a | d | i | j | o | p | t | w |
| "d | x" | q | a | d | g | j | m | p | t | w |
| "d | y" | q | a | d | g | j | m | p | t | w |
| "d | z" | q | a | d | g | j | m | p | t | w |
| "d | " | q | a | d | g | j | m | p | t | w |
| "e | a" | q | c | d | g | l | n | s | t | w |
| "e | b" | q | c | f | g | j | m | r | t | y |
| "e | c" | q | a | e | h | k | o | s | t | w |

FIG. 10C

|  |  | 1 | 2 | 3 | 4 | 5 | 6 | 7 | 8 | 9 |
|---|---|---|---|---|---|---|---|---|---|---|
| "e | d" | q | b | e | i | l | n | s | u | w |
| "e | e" | z | a | d | i | k | n | r | t | w |
| "e | f" | q | a | e | i | l | o | r | t | w |
| "e | g" | q | a | d | i | j | o | r | u | y |
| "e | h" | q | a | e | i | j | m | p | t | w |
| "e | i" | q | a | d | g | j | n | r | v | w |
| "e | j" | q | a | e | g | j | m | p | t | w |
| "e | k" | q | a | e | i | j | m | s | t | w |
| "e | l" | q | a | e | i | l | o | p | v | y |
| "e | m" | q | a | e | i | j | o | s | u | w |
| "e | n" | q | c | d | g | l | o | s | t | w |
| "e | o" | q | a | f | g | j | n | p | u | w |
| "e | p" | q | a | e | h | l | o | r | t | w |
| "e | q" | q | a | d | g | j | m | p | u | w |
| "e | r" | q | a | e | i | l | n | s | v | y |
| "e | s" | q | c | e | i | k | n | s | t | w |
| "e | t" | z | c | e | i | j | m | s | t | w |
| "e | u" | q | a | d | g | j | m | r | t | w |
| "e | v" | q | a | e | i | j | o | p | t | w |
| "e | w" | q | a | e | h | j | o | s | t | w |
| "e | x" | q | a | e | i | j | m | p | t | w |
| "e | y" | q | a | d | g | j | o | s | t | w |
| "e | z" | q | a | e | g | j | m | p | t | w |
| "e | " | q | a | d | g | j | m | p | t | w |
| "f | a" | q | c | d | i | k | m | s | v | x |
| "f | b" | q | a | d | g | j | m | p | t | w |
| "f | c" | q | c | d | g | j | m | p | t | w |
| "f | d" | q | a | d | g | j | m | p | t | w |
| "f | e" | q | a | e | g | l | m | r | t | w |
| "f | f" | q | a | e | i | j | o | s | t | w |
| "f | g" | q | a | d | g | j | m | p | t | w |
| "f | h" | q | a | d | g | j | m | p | t | w |
| "f | i" | q | c | e | g | l | n | r | t | x |
| "f | j" | q | a | d | g | j | m | p | t | w |
| "f | k" | q | a | d | g | j | m | p | t | w |
| "f | l" | q | a | e | i | j | o | p | t | y |
| "f | m" | q | a | d | g | j | m | p | t | w |

FIG. 10D

| "-  -" | 1 | 2 | 3 | 4 | 5 | 6 | 7 | 8 | 9 |
|---|---|---|---|---|---|---|---|---|---|
| "f n" | q | a | d | g | j | m | p | t | w |
| "f o" | q | c | d | g | l | n | r | u | w |
| "f p" | q | a | d | g | j | m | p | t | w |
| "f q" | q | a | d | g | j | m | p | t | w |
| "f r" | q | a | e | i | j | o | p | t | y |
| "f s" | q | a | d | g | j | m | p | t | w |
| "f t" | q | a | e | g | k | m | p | t | w |
| "f u" | q | a | d | g | l | n | r | t | w |
| "f v" | q | a | d | g | j | m | p | t | w |
| "f w" | q | a | d | g | j | m | p | t | w |
| "f x" | q | a | d | g | j | m | p | t | w |
| "f y" | q | a | d | i | j | m | p | t | w |
| "f z" | q | a | d | g | j | m | p | t | w |
| "f  " | q | a | d | g | j | m | p | t | w |
| "g a" | z | a | d | i | l | n | r | t | w |
| "g b" | q | a | d | g | j | m | p | t | w |
| "g c" | q | a | d | g | j | m | s | t | w |
| "g d" | q | a | d | g | j | o | p | t | w |
| "g e" | q | a | d | g | l | n | s | t | w |
| "g f" | q | a | d | g | j | m | p | u | w |
| "g g" | q | a | e | g | l | m | p | t | w |
| "g h" | q | a | e | g | j | o | p | t | w |
| "g i" | q | c | f | g | j | n | s | v | w |
| "g j" | q | a | d | g | j | m | p | t | w |
| "g k" | q | a | d | g | j | m | p | t | w |
| "g l" | q | a | e | i | j | o | p | t | y |
| "g m" | q | a | d | g | l | m | s | t | w |
| "g n" | q | a | e | i | j | o | p | t | w |
| "g o" | q | a | e | i | j | o | p | t | w |
| "g p" | q | a | d | g | j | m | p | t | w |
| "g q" | q | a | d | g | j | m | p | t | w |
| "g r" | q | a | e | g | j | o | p | t | w |
| "g s" | q | a | d | g | j | m | p | t | w |
| "g t" | q | a | e | h | j | o | p | t | w |
| "g u" | q | a | e | i | l | m | r | t | y |
| "g v" | q | a | d | g | j | m | p | t | w |
| "g w" | q | a | d | g | j | m | p | t | w |

FIG. 10E

| "_" | "_" | 1 | 2 | 3 | 4 | 5 | 6 | 7 | 8 | 9 |
|---|---|---|---|---|---|---|---|---|---|---|
| "g" | "x" | q | a | d | g | j | m | p | t | w |
| "g" | "y" | q | a | d | g | j | m | p | t | w |
| "g" | "z" | q | a | d | g | j | m | p | t | w |
| "g" | " " | q | a | d | g | j | m | p | t | w |
| "h" | "a" | q | b | d | i | l | n | s | t | w |
| "h" | "b" | q | a | d | g | j | m | p | t | w |
| "h" | "c" | q | a | d | g | j | o | p | t | w |
| "h" | "d" | q | a | d | g | j | m | r | t | w |
| "h" | "e" | q | c | d | i | l | n | r | t | y |
| "h" | "f" | q | a | d | g | j | m | p | t | w |
| "h" | "g" | q | a | d | g | j | m | p | t | w |
| "h" | "h" | q | a | d | g | j | m | p | t | w |
| "h" | "i" | q | c | e | g | l | n | s | t | w |
| "h" | "j" | q | a | d | g | j | m | p | t | w |
| "h" | "k" | q | a | d | g | j | m | p | t | w |
| "h" | "l" | q | a | d | g | j | m | p | t | y |
| "h" | "m" | q | a | e | g | j | m | p | t | w |
| "h" | "n" | q | a | d | i | j | o | p | t | w |
| "h" | "o" | q | b | d | i | l | n | r | u | w |
| "h" | "p" | q | a | d | g | j | m | p | u | w |
| "h" | "q" | q | a | d | g | j | m | p | t | w |
| "h" | "r" | q | a | e | i | j | o | p | t | w |
| "h" | "s" | q | a | d | g | j | m | p | t | w |
| "h" | "t" | q | a | d | g | l | m | s | t | w |
| "h" | "u" | q | a | d | g | l | m | r | t | w |
| "h" | "v" | q | a | d | g | j | m | p | t | w |
| "h" | "w" | q | a | d | g | j | m | p | t | w |
| "h" | "x" | q | a | d | g | j | m | p | t | w |
| "h" | "y" | q | a | d | g | j | m | p | t | w |
| "h" | "z" | q | a | d | g | j | m | p | t | w |
| "h" | " " | q | a | d | g | j | m | p | t | w |
| "i" | "a" | q | b | d | g | l | n | r | t | w |
| "i" | "b" | q | a | e | i | l | m | r | u | w |
| "i" | "c" | q | a | e | h | k | o | r | t | y |
| "i" | "d" | q | a | e | i | l | n | p | u | w |
| "i" | "e" | q | c | d | g | l | n | r | v | w |
| "i" | "f" | q | a | f | i | j | o | p | t | y |

FIG. 10F

| " - | - " | 1 | 2 | 3 | 4 | 5 | 6 | 7 | 8 | 9 |
|---|---|---|---|---|---|---|---|---|---|---|
| "i | g" | q | a | e | h | j | n | r | u | w |
| "i | h" | q | a | d | g | j | m | p | t | w |
| "i | i" | q | a | d | g | j | m | p | t | w |
| "i | j" | q | a | d | g | j | o | p | t | w |
| "i | k" | q | a | e | g | k | m | p | t | w |
| "i | l" | q | a | e | i | l | o | s | t | y |
| "i | m" | q | a | e | i | j | m | p | u | w |
| "i | n" | q | c | e | g | k | n | s | t | w |
| "i | o" | q | a | d | g | l | n | r | u | w |
| "i | p" | q | a | d | i | l | m | s | t | w |
| "i | q" | q | a | d | g | j | m | p | u | w |
| "i | r" | q | c | e | i | l | n | s | t | w |
| "i | s" | q | c | e | h | k | n | s | t | w |
| "i | t" | q | a | e | h | l | o | s | t | y |
| "i | u" | q | a | d | g | j | m | p | t | w |
| "i | v" | q | a | e | i | j | m | p | t | w |
| "i | w" | q | a | d | g | j | m | p | t | w |
| "i | x" | q | a | e | g | j | m | p | t | w |
| "i | y" | q | a | d | g | j | m | p | t | w |
| "i | z" | q | a | e | i | j | o | p | t | w |
| "i | " | q | a | d | g | j | m | p | t | w |
| "j | a" | q | c | d | g | j | n | p | t | w |
| "j | b" | q | a | d | g | j | m | p | t | w |
| "j | c" | q | a | d | g | j | m | p | t | w |
| "j | d" | q | a | d | g | j | m | p | t | w |
| "j | e" | q | c | d | g | j | m | r | t | w |
| "j | f" | q | a | d | g | j | m | p | t | w |
| "j | g" | q | a | d | g | j | m | p | t | w |
| "j | h" | q | a | d | g | j | m | p | t | w |
| "j | i" | q | a | d | g | j | m | p | t | w |
| "j | j" | q | a | d | g | j | m | p | t | w |
| "j | k" | q | a | d | g | j | m | p | t | w |
| "j | l" | q | a | d | g | j | m | p | t | w |
| "j | m" | q | a | d | g | j | m | p | t | w |
| "j | n" | q | a | d | g | j | m | p | t | w |
| "j | o" | q | b | e | i | j | m | r | t | w |
| "j | p" | q | a | d | g | j | m | p | t | w |

FIG. 10G

| "-" | -" | 1 | 2 | 3 | 4 | 5 | 6 | 7 | 8 | 9 |
|---|---|---|---|---|---|---|---|---|---|---|
| "j | q" | q | a | d | g | j | m | p | t | w |
| "j | r" | q | a | d | g | j | m | p | t | w |
| "j | s" | q | a | d | g | j | m | p | t | w |
| "j | t" | q | a | d | g | j | m | p | t | w |
| "j | u" | q | a | d | g | l | m | s | t | w |
| "j | v" | q | a | d | g | j | m | p | t | w |
| "j | w" | q | a | d | g | j | m | p | t | w |
| "j | x" | q | a | d | g | j | m | p | t | w |
| "j | y" | q | a | d | g | j | m | p | t | w |
| "j | z" | q | a | d | g | j | m | p | t | w |
| "j | " | q | a | d | g | j | m | p | t | w |
| "k | a" | q | a | d | g | j | n | s | t | y |
| "k | b" | q | a | d | g | j | o | p | t | w |
| "k | c" | q | a | d | g | j | m | p | t | w |
| "k | d" | q | a | d | g | j | o | p | t | w |
| "k | e" | q | a | d | g | l | n | s | t | y |
| "k | f" | q | a | d | g | j | m | p | t | w |
| "k | g" | q | a | d | g | j | m | r | t | w |
| "k | h" | q | a | d | g | j | m | p | t | w |
| "k | i" | q | a | d | g | l | n | p | t | w |
| "k | j" | q | a | d | g | j | m | p | t | w |
| "k | k" | q | a | d | g | j | o | p | t | w |
| "k | l" | q | a | d | i | j | m | p | t | y |
| "k | m" | q | a | d | g | j | m | p | t | w |
| "k | n" | q | a | d | g | j | o | p | t | w |
| "k | o" | q | a | d | g | l | n | p | t | w |
| "k | p" | q | a | d | g | j | m | p | t | w |
| "k | q" | q | a | d | g | j | m | p | t | w |
| "k | r" | q | a | d | g | j | m | p | t | w |
| "k | s" | q | a | d | g | j | m | p | t | w |
| "k | t" | q | a | d | g | j | m | p | t | w |
| "k | u" | q | a | d | g | j | m | p | t | w |
| "k | v" | q | a | d | g | j | m | p | t | w |
| "k | w" | q | a | d | g | j | m | p | t | w |
| "k | x" | q | a | d | g | j | m | p | t | w |
| "k | y" | q | a | d | g | j | m | p | t | w |
| "k | z" | q | a | d | g | j | m | p | t | w |

FIG. 10H

| "-" | -" | 1 | 2 | 3 | 4 | 5 | 6 | 7 | 8 | 9 |
|---|---|---|---|---|---|---|---|---|---|---|
| "k | " | q | a | d | g | j | m | p | t | w |
| "l | a" | q | b | d | i | j | n | r | t | y |
| "l | b" | q | a | d | g | j | o | p | t | w |
| "l | c" | q | a | d | g | j | o | p | t | w |
| "l | d" | q | a | e | i | j | n | s | t | w |
| "l | e" | q | a | d | g | l | m | s | t | x |
| "l | f" | q | a | d | g | j | m | p | t | w |
| "l | g" | q | a | d | g | j | m | p | t | w |
| "l | h" | q | a | d | g | j | m | p | t | w |
| "l | i" | z | c | e | g | k | n | s | t | w |
| "l | j" | q | a | d | g | j | m | p | t | w |
| "l | k" | q | a | e | i | j | m | s | t | w |
| "l | l" | q | c | e | i | j | o | s | u | y |
| "l | m" | q | a | d | g | j | o | s | t | w |
| "l | n" | q | a | e | g | j | m | p | t | w |
| "l | o" | q | c | d | g | j | o | s | t | w |
| "l | p" | q | a | d | h | j | m | s | t | w |
| "l | q" | q | a | d | g | j | m | p | t | w |
| "l | r" | q | a | e | g | j | m | p | t | w |
| "l | s" | q | a | e | i | j | o | p | t | w |
| "l | t" | q | a | e | i | j | o | s | t | w |
| "l | u" | q | c | d | g | l | m | s | t | w |
| "l | v" | q | a | e | i | j | m | p | t | w |
| "l | w" | q | a | e | g | j | m | p | t | w |
| "l | x" | q | a | d | g | j | m | p | t | w |
| "l | y" | z | a | d | i | j | n | s | t | w |
| "l | z" | q | a | d | g | j | m | p | t | w |
| "l | " | q | a | d | g | j | m | p | t | w |
| "m | a" | q | c | d | i | k | n | r | t | y |
| "m | b" | q | a | e | i | l | m | p | t | y |
| "m | c" | q | c | d | i | j | o | p | t | w |
| "m | d" | q | a | d | g | j | m | p | t | w |
| "m | e" | q | a | e | g | l | n | s | t | w |
| "m | f" | q | a | d | g | j | o | p | t | w |
| "m | g" | q | a | d | g | j | m | p | t | w |
| "m | h" | z | a | d | g | j | m | p | t | w |
| "m | i" | z | c | d | g | l | n | s | t | x |

FIG. 10I

| "_" | "_" | 1 | 2 | 3 | 4 | 5 | 6 | 7 | 8 | 9 |
|---|---|---|---|---|---|---|---|---|---|---|
| "m" | "j" | q | a | d | g | j | m | p | t | w |
| "m" | "k" | q | a | d | g | j | m | p | t | w |
| "m" | "l" | q | a | e | g | j | m | p | t | y |
| "m" | "m" | q | a | e | i | j | o | p | u | w |
| "m" | "n" | q | a | d | g | j | m | p | t | w |
| "m" | "o" | q | b | d | i | j | n | r | v | w |
| "m" | "p" | q | a | e | i | l | o | r | t | w |
| "m" | "q" | q | a | d | g | j | m | p | t | w |
| "m" | "r" | q | a | d | g | j | m | p | t | w |
| "m" | "s" | q | a | e | g | j | m | p | t | w |
| "m" | "t" | q | a | d | g | j | m | p | t | w |
| "m" | "u" | q | c | d | g | l | n | s | t | w |
| "m" | "v" | q | a | d | g | j | m | p | t | w |
| "m" | "w" | q | a | d | h | j | m | p | t | w |
| "m" | "x" | q | a | d | g | j | m | p | t | w |
| "m" | "y" | q | c | d | g | j | m | s | t | w |
| "m" | "z" | q | a | d | g | j | m | p | t | w |
| "m" | " " | q | a | d | g | j | m | p | t | w |
| "n" | "a" | q | b | d | g | l | m | r | t | w |
| "n" | "b" | q | a | d | g | j | m | p | t | w |
| "n" | "c" | q | a | e | i | l | o | r | t | y |
| "n" | "d" | q | a | e | i | l | o | s | t | y |
| "n" | "e" | q | c | e | i | l | n | s | t | w |
| "n" | "f" | q | a | e | i | j | o | s | u | w |
| "n" | "g" | q | a | e | i | l | m | s | u | w |
| "n" | "h" | q | a | d | g | j | m | p | t | w |
| "n" | "i" | z | c | e | g | l | n | s | t | x |
| "n" | "j" | q | a | d | g | j | m | p | u | w |
| "n" | "k" | q | a | e | i | j | n | s | t | w |
| "n" | "l" | q | a | e | i | j | o | p | t | y |
| "n" | "m" | q | a | e | g | j | m | p | t | w |
| "n" | "n" | q | a | e | i | j | o | p | u | y |
| "n" | "o" | q | b | d | g | l | n | r | t | w |
| "n" | "p" | q | a | d | g | j | o | p | u | w |
| "n" | "q" | q | a | d | g | j | m | p | u | w |
| "n" | "r" | q | a | d | g | j | m | p | t | w |
| "n" | "s" | q | a | e | i | l | m | p | t | w |

FIG. 10J

| "-" | -" | 1 | 2 | 3 | 4 | 5 | 6 | 7 | 8 | 9 |
|---|---|---|---|---|---|---|---|---|---|---|
| "n | t" | q | a | e | i | l | o | s | u | y |
| "n | u" | q | a | f | g | j | m | s | t | x |
| "n | v" | q | a | e | i | j | o | p | t | w |
| "n | w" | q | a | e | g | j | m | p | t | w |
| "n | x" | q | a | d | g | j | m | p | t | w |
| "n | y" | q | b | d | h | j | m | p | t | w |
| "n | z" | q | a | d | g | j | m | p | t | w |
| "n | " | q | a | d | g | j | m | p | t | w |
| "o | a" | q | b | d | g | l | m | s | t | w |
| "o | b" | q | a | e | i | l | o | s | t | w |
| "o | c" | q | a | e | h | k | o | s | u | w |
| "o | d" | q | a | e | i | l | o | s | u | y |
| "o | e" | q | a | d | g | j | m | s | t | w |
| "o | f" | q | a | f | g | j | m | p | t | w |
| "o | g" | q | a | e | i | j | o | r | t | y |
| "o | h" | q | a | d | g | j | n | p | t | w |
| "o | i" | q | c | d | g | l | n | p | t | w |
| "o | j" | q | a | e | g | j | m | p | t | w |
| "o | k" | q | a | e | i | j | m | s | t | w |
| "o | l" | q | b | d | i | l | o | s | u | w |
| "o | m" | q | a | e | i | l | m | p | t | w |
| "o | n" | q | a | e | g | l | n | s | t | y |
| "o | o" | q | a | d | g | k | n | s | t | w |
| "o | p" | q | a | e | h | l | m | p | t | y |
| "o | q" | q | a | d | g | j | m | p | t | w |
| "o | r" | q | a | e | g | k | m | r | t | w |
| "o | s" | q | c | e | i | j | o | s | t | y |
| "o | t" | q | a | e | h | j | o | s | t | y |
| "o | u" | q | c | d | g | l | n | r | t | y |
| "o | v" | q | a | e | i | j | m | p | t | w |
| "o | w" | q | a | e | i | j | n | s | t | w |
| "o | x" | q | a | d | i | j | m | p | t | w |
| "o | y" | q | a | e | g | j | m | s | t | w |
| "o | z" | q | a | d | g | j | m | p | t | w |
| "o | " | q | a | d | g | j | m | p | t | w |
| "p | a" | q | c | d | g | l | n | r | t | y |
| "p | b" | q | a | e | g | j | m | p | t | w |

FIG. 10K

| "-" | -" | 1 | 2 | 3 | 4 | 5 | 6 | 7 | 8 | 9 |
|---|---|---|---|---|---|---|---|---|---|---|
| "p | c" | q | a | d | g | j | m | s | t | w |
| "p | d" | q | a | d | g | j | m | p | t | w |
| "p | e" | q | c | d | g | j | n | r | t | w |
| "p | f" | q | a | d | g | j | m | r | t | w |
| "p | g" | q | a | d | g | j | m | p | t | w |
| "p | h" | q | a | e | i | j | o | s | t | y |
| "p | i" | q | c | d | g | l | n | r | t | x |
| "p | j" | q | a | d | g | j | m | p | t | w |
| "p | k" | q | a | d | g | j | m | p | t | w |
| "p | l" | q | a | e | i | j | o | p | u | y |
| "p | m" | q | a | e | g | j | m | p | t | w |
| "p | n" | q | a | d | g | j | m | p | t | w |
| "p | o" | q | c | d | i | l | n | r | t | w |
| "p | p" | q | a | e | i | l | o | p | t | y |
| "p | q" | q | a | d | g | j | m | p | t | w |
| "p | r" | q | a | e | i | j | o | p | t | y |
| "p | s" | q | a | d | g | j | m | p | t | w |
| "p | t" | q | c | e | i | j | o | s | t | w |
| "p | u" | q | b | d | g | j | m | r | t | w |
| "p | v" | q | a | d | g | j | m | p | t | w |
| "p | w" | q | a | d | g | j | m | p | t | w |
| "p | x" | q | a | d | g | j | m | p | t | w |
| "p | y" | q | a | d | g | j | m | r | t | w |
| "p | z" | q | a | d | g | j | m | p | t | w |
| "p | " | q | a | d | g | j | m | p | t | w |
| "q | a" | q | a | d | g | j | m | p | t | w |
| "q | b" | q | a | d | g | j | m | p | t | w |
| "q | c" | q | a | d | g | j | m | p | t | w |
| "q | d" | q | a | d | g | j | m | p | t | w |
| "q | e" | q | a | d | g | j | m | p | t | w |
| "q | f" | q | a | d | g | j | m | p | t | w |
| "q | g" | q | a | d | g | j | m | p | t | w |
| "q | h" | q | a | d | g | j | m | p | t | w |
| "q | i" | q | a | d | g | j | m | p | t | w |
| "q | j" | q | a | d | g | j | m | p | t | w |
| "q | k" | q | a | d | g | j | m | p | t | w |
| "q | l" | q | a | d | g | j | m | p | t | w |

FIG. 10L

| "-  | -" | 1 | 2 | 3 | 4 | 5 | 6 | 7 | 8 | 9 |
|---|---|---|---|---|---|---|---|---|---|---|
| "q | m" | q | a | d | g | j | m | p | t | w |
| "q | n" | q | a | d | g | j | m | p | t | w |
| "q | o" | q | a | d | g | j | m | p | t | w |
| "q | p" | q | a | d | g | j | m | p | t | w |
| "q | q" | q | a | d | g | j | m | p | t | w |
| "q | r" | q | a | d | g | j | m | p | t | w |
| "q | s" | q | a | d | g | j | m | p | t | w |
| "q | t" | q | a | d | g | j | m | p | t | w |
| "q | u" | q | a | e | i | j | o | p | t | w |
| "q | v" | q | a | d | g | j | m | p | t | w |
| "q | w" | q | a | d | g | j | m | p | t | w |
| "q | x" | q | a | d | g | j | m | p | t | w |
| "q | y" | q | a | d | g | j | m | p | t | w |
| "q | z" | q | a | d | g | j | m | p | t | w |
| "q | " | q | a | d | g | j | m | p | t | w |
| "r | a" | q | c | d | g | l | n | p | t | w |
| "r | b" | q | a | d | g | j | o | p | t | w |
| "r | c" | q | a | e | h | l | m | p | u | w |
| "r | d" | q | a | e | i | j | n | s | v | w |
| "r | e" | q | a | e | g | l | n | s | v | w |
| "r | f" | q | a | e | g | j | o | p | t | w |
| "r | g" | q | a | e | i | j | m | s | u | w |
| "r | h" | q | a | e | g | j | o | p | t | w |
| "r | i" | z | c | e | g | l | n | p | t | w |
| "r | j" | q | a | d | g | j | m | p | t | w |
| "r | k" | q | a | e | i | l | m | s | t | y |
| "r | l" | q | a | d | i | j | o | p | t | y |
| "r | m" | q | a | e | i | j | m | s | t | w |
| "r | n" | q | a | e | i | j | o | s | t | w |
| "r | o" | q | b | d | g | l | m | p | u | w |
| "r | p" | q | a | d | g | j | o | r | t | w |
| "r | q" | q | a | d | g | j | m | p | t | w |
| "r | r" | q | a | e | i | j | o | p | t | y |
| "r | s" | q | a | e | i | j | o | p | t | w |
| "r | t" | z | a | e | h | j | n | s | u | w |
| "r | u" | q | c | e | g | l | n | s | t | w |
| "r | v" | q | a | e | i | j | m | p | t | w |

FIG. 10M

| " - " | " - " | 1 | 2 | 3 | 4 | 5 | 6 | 7 | 8 | 9 |
|---|---|---|---|---|---|---|---|---|---|---|
| "r | w" | q | a | d | i | j | o | p | t | w |
| "r | x" | q | a | d | g | j | m | p | t | w |
| "r | y" | q | b | d | i | j | m | p | t | w |
| "r | z" | q | a | d | g | j | m | p | t | w |
| "r | " | q | a | d | g | j | m | p | t | w |
| "s | a" | q | b | d | g | l | m | p | v | y |
| "s | b" | q | a | d | g | j | m | p | t | w |
| "s | c" | q | a | d | h | l | o | r | u | w |
| "s | d" | q | a | d | g | j | n | p | t | w |
| "s | e" | q | c | e | g | l | n | r | t | y |
| "s | f" | q | a | e | g | j | m | p | u | w |
| "s | g" | q | a | d | g | j | m | r | t | w |
| "s | h" | q | a | e | i | l | o | r | t | w |
| "s | i" | z | c | d | g | l | n | s | t | x |
| "s | j" | q | a | d | g | j | m | p | t | w |
| "s | k" | q | a | e | i | j | m | p | t | w |
| "s | l" | q | a | e | i | j | o | p | t | y |
| "s | m" | q | a | e | i | j | o | s | t | w |
| "s | n" | q | a | e | g | j | m | p | t | w |
| "s | o" | q | c | f | g | l | m | r | u | w |
| "s | p" | q | a | e | g | l | o | r | t | w |
| "s | q" | q | a | d | g | l | m | p | u | w |
| "s | r" | q | c | d | g | j | m | p | t | w |
| "s | s" | q | a | e | i | j | o | p | u | w |
| "s | t" | q | a | e | i | l | o | r | u | y |
| "s | u" | q | b | e | g | l | m | p | t | w |
| "s | v" | q | a | d | g | j | m | p | t | w |
| "s | w" | q | a | e | i | j | o | p | t | w |
| "s | x" | q | a | d | g | j | m | p | t | w |
| "s | y" | q | a | d | g | j | m | s | t | w |
| "s | z" | q | a | d | g | j | m | p | t | w |
| "s | " | q | a | d | g | j | m | p | t | w |
| "t | a" | q | c | f | i | l | n | r | t | y |
| "t | b" | q | a | d | g | j | m | p | t | w |
| "t | c" | z | a | d | h | j | o | p | t | w |
| "t | d" | q | a | d | g | j | m | p | t | w |
| "t | e" | q | c | d | g | l | m | r | u | x |

FIG. 10N

| "-" | -" | 1 | 2 | 3 | 4 | 5 | 6 | 7 | 8 | 9 |
|---|---|---|---|---|---|---|---|---|---|---|
| "t | f" | q | a | d | i | j | o | p | t | w |
| "t | g" | q | a | e | g | j | o | p | t | w |
| "t | h" | q | a | e | i | l | o | r | u | w |
| "t | i" | z | c | e | g | l | o | s | v | w |
| "t | j" | q | a | d | g | j | m | p | t | w |
| "t | k" | q | a | e | g | j | m | p | t | w |
| "t | l" | q | a | e | i | j | m | p | t | y |
| "t | m" | q | a | e | g | l | o | p | t | w |
| "t | n" | q | a | e | g | j | m | p | t | w |
| "t | o" | q | c | d | g | l | m | r | u | w |
| "t | p" | q | c | d | g | j | m | p | u | w |
| "t | q" | q | a | d | g | j | m | p | t | w |
| "t | r" | q | a | e | i | j | o | p | u | y |
| "t | s" | q | c | e | i | j | o | p | u | w |
| "t | t" | q | a | e | i | l | o | p | t | y |
| "t | u" | q | a | f | i | j | n | r | t | w |
| "t | v" | q | a | d | g | j | m | p | t | w |
| "t | w" | q | a | e | i | j | o | p | t | w |
| "t | x" | q | a | d | g | j | m | p | t | w |
| "t | y" | q | a | d | g | l | m | p | t | w |
| "t | z" | q | a | d | g | j | m | p | t | w |
| "t | " | q | a | d | g | j | m | p | t | w |
| "u | a" | q | a | d | g | l | n | r | t | w |
| "u | b" | q | a | e | i | j | m | s | t | w |
| "u | c" | q | c | e | h | k | m | p | t | w |
| "u | d" | q | a | e | i | j | o | p | t | y |
| "u | e" | q | a | d | g | j | n | s | t | w |
| "u | f" | q | a | f | g | j | m | p | t | w |
| "u | g" | q | a | e | h | j | m | s | t | w |
| "u | h" | q | a | d | g | j | m | p | t | w |
| "u | i" | q | c | d | g | l | n | r | t | w |
| "u | j" | q | a | d | g | j | m | p | t | w |
| "u | k" | q | a | d | g | j | m | p | t | w |
| "u | l" | q | a | d | g | l | m | p | t | y |
| "u | m" | q | b | e | i | j | m | p | t | w |
| "u | n" | q | c | d | i | l | n | s | t | w |
| "u | o" | q | a | d | g | j | m | p | t | w |

FIG. 100

| "-    -" | 1 | 2 | 3 | 4 | 5 | 6 | 7 | 8 | 9 |
|---|---|---|---|---|---|---|---|---|---|
| "u   p" | q | a | d | i | l | o | p | t | y |
| "u   q" | q | a | d | g | j | m | p | t | w |
| "u   r" | q | c | e | i | l | n | s | t | y |
| "u   s" | q | a | e | i | l | m | s | t | y |
| "u   t" | q | a | e | i | l | o | s | t | w |
| "u   u" | q | c | d | g | j | m | p | t | w |
| "u   v" | q | a | d | g | j | m | p | t | w |
| "u   w" | q | a | d | g | j | m | p | t | w |
| "u   x" | q | a | d | g | j | m | p | t | w |
| "u   y" | q | a | e | g | j | m | s | t | w |
| "u   z" | q | a | d | g | j | m | p | t | w |
| "u    " | q | a | d | g | j | m | p | t | w |
| "v   a" | q | c | d | i | l | n | r | t | w |
| "v   b" | q | a | d | g | j | m | p | t | w |
| "v   c" | q | a | d | g | j | m | s | t | w |
| "v   d" | q | a | d | g | j | m | p | t | w |
| "v   e" | q | a | d | g | l | n | r | t | w |
| "v   f" | q | a | d | g | j | m | p | t | w |
| "v   g" | q | a | d | g | j | m | p | t | w |
| "v   h" | q | a | d | g | j | m | p | t | w |
| "v   i" | q | c | e | g | j | n | s | t | w |
| "v   j" | q | a | d | g | j | m | p | t | w |
| "v   k" | q | a | d | g | j | m | p | t | w |
| "v   l" | q | a | d | g | j | m | s | t | w |
| "v   m" | q | a | d | g | j | m | p | t | w |
| "v   n" | q | a | d | g | j | m | p | t | w |
| "v   o" | q | a | d | i | l | o | r | t | w |
| "v   p" | q | a | d | g | j | m | p | t | w |
| "v   q" | q | a | d | g | j | m | p | t | w |
| "v   r" | q | a | d | g | j | m | p | t | w |
| "v   s" | q | a | d | g | j | m | p | t | w |
| "v   t" | q | a | d | g | j | m | p | t | w |
| "v   u" | q | a | d | g | j | m | p | t | w |
| "v   v" | q | a | d | g | j | m | p | t | w |
| "v   w" | q | a | d | g | j | m | p | t | w |
| "v   x" | q | a | d | g | j | m | p | t | w |
| "v   y" | q | a | d | g | j | m | p | t | w |

FIG. 10P

| "_" | "_" | 1 | 2 | 3 | 4 | 5 | 6 | 7 | 8 | 9 |
|---|---|---|---|---|---|---|---|---|---|---|
| "v" | z" | q | a | d | g | j | m | p | t | w |
| "v" | " | q | a | d | g | j | m | p | t | w |
| "w" | a" | q | b | d | i | l | n | r | v | y |
| "w" | b" | q | a | d | g | j | m | p | t | w |
| "w" | c" | q | a | e | g | j | m | p | t | w |
| "w" | d" | q | a | f | g | j | m | p | t | w |
| "w" | e" | q | b | e | i | l | n | r | v | w |
| "w" | f" | q | a | d | g | j | m | p | t | w |
| "w" | g" | q | a | d | g | j | m | p | t | w |
| "w" | h" | q | a | e | i | j | o | p | t | y |
| "w" | i" | q | c | d | g | l | n | s | t | w |
| "w" | j" | q | a | d | g | j | m | p | t | w |
| "w" | k" | q | a | d | g | j | m | p | t | w |
| "w" | l" | q | a | d | g | j | m | p | t | w |
| "w" | m" | q | a | d | g | j | m | p | t | w |
| "w" | n" | q | a | d | g | l | m | s | t | w |
| "w" | o" | q | a | d | g | j | n | r | u | w |
| "w" | p" | q | a | d | h | j | m | p | t | w |
| "w" | q" | q | a | d | g | j | m | p | t | w |
| "w" | r" | q | a | d | i | j | o | p | t | w |
| "w" | s" | q | a | e | g | j | m | p | t | w |
| "w" | t" | q | a | d | g | j | m | p | t | w |
| "w" | u" | q | a | d | g | j | m | p | t | w |
| "w" | v" | q | a | d | g | j | m | p | t | w |
| "w" | w" | q | a | d | g | j | m | p | t | w |
| "w" | x" | q | a | d | g | j | m | p | t | w |
| "w" | y" | q | a | d | g | j | m | p | t | w |
| "w" | z" | q | a | d | g | j | m | p | t | w |
| "w" | " | q | a | d | g | j | m | p | t | w |
| "x" | a" | q | c | d | g | j | m | p | t | w |
| "x" | b" | q | a | d | g | j | m | p | t | w |
| "x" | c" | q | a | e | h | j | m | p | t | w |
| "x" | d" | q | a | d | g | j | m | p | t | w |
| "x" | e" | q | c | d | g | l | m | s | t | x |
| "x" | f" | q | a | d | g | j | m | p | t | w |
| "x" | g" | q | a | d | g | j | m | p | t | w |
| "x" | h" | q | a | d | g | j | m | p | t | w |

FIG. 10Q

|  |  | 1 | 2 | 3 | 4 | 5 | 6 | 7 | 8 | 9 |
|---|---|---|---|---|---|---|---|---|---|---|
| "_ | _" |  |  |  |  |  |  |  |  |  |
| "x | i" | q | c | d | g | j | n | s | t | w |
| "x | j" | q | a | d | g | j | m | p | t | w |
| "x | k" | q | a | d | g | j | m | p | t | w |
| "x | l" | q | a | d | i | j | m | p | t | w |
| "x | m" | q | a | d | g | j | m | p | t | w |
| "x | n" | q | a | d | g | j | m | p | t | w |
| "x | o" | q | a | d | g | j | m | p | t | w |
| "x | p" | q | a | e | i | l | o | p | t | w |
| "x | q" | q | a | d | g | j | m | p | t | w |
| "x | r" | q | a | d | g | j | m | p | t | w |
| "x | s" | q | a | e | i | j | m | p | t | w |
| "x | t" | q | a | e | g | j | m | r | u | w |
| "x | u" | q | a | d | g | j | m | p | t | w |
| "x | v" | q | a | d | g | j | m | p | t | w |
| "x | w" | q | a | d | g | j | m | p | t | w |
| "x | x" | q | a | d | g | j | m | p | t | w |
| "x | y" | z | a | d | g | j | m | p | t | w |
| "x | z" | q | a | d | g | j | m | p | t | w |
| "x | " | q | a | d | g | j | m | p | t | w |
| "y | a" | q | a | d | g | j | m | p | t | w |
| "y | b" | q | a | e | i | j | o | p | t | w |
| "y | c" | q | a | d | g | l | o | p | t | w |
| "y | d" | q | a | d | g | j | m | p | t | w |
| "y | e" | q | a | e | g | j | m | s | t | w |
| "y | f" | q | a | d | g | j | m | p | t | w |
| "y | g" | q | a | d | g | j | m | p | t | w |
| "y | h" | q | a | d | g | j | o | p | t | w |
| "y | i" | q | c | d | g | j | n | p | t | w |
| "y | j" | q | a | d | g | j | m | p | t | w |
| "y | k" | q | a | d | g | j | m | p | t | w |
| "y | l" | q | a | e | g | j | m | p | t | w |
| "y | m" | q | a | e | g | j | o | p | t | w |
| "y | n" | q | c | d | g | j | m | p | t | x |
| "y | o" | q | a | d | g | j | n | r | u | w |
| "y | p" | q | a | e | i | j | m | p | t | w |
| "y | q" | q | a | d | g | j | m | p | t | w |
| "y | r" | q | a | d | i | j | m | p | t | w |

FIG. 10R

| | | 1 | 2 | 3 | 4 | 5 | 6 | 7 | 8 | 9 |
|---|---|---|---|---|---|---|---|---|---|---|
| "y | s" | q | c | e | i | j | m | p | t | w |
| "y | t" | q | a | e | h | j | m | p | t | w |
| "y | u" | q | a | d | g | k | m | r | t | w |
| "y | v" | q | a | d | g | j | m | p | t | w |
| "y | w" | q | a | d | h | j | m | p | t | w |
| "y | x" | q | a | d | g | j | m | p | t | w |
| "y | y" | q | a | d | g | j | m | p | t | w |
| "y | z" | q | a | e | g | j | m | p | t | w |
| "y | " | q | a | d | g | j | m | p | t | w |
| "z | a" | q | a | d | g | j | m | p | t | w |
| "z | b" | q | a | d | g | j | m | p | t | w |
| "z | c" | q | a | d | g | j | m | p | t | w |
| "z | d" | q | a | d | g | j | m | p | t | w |
| "z | e" | q | a | d | g | j | n | r | t | w |
| "z | f" | q | a | d | g | j | m | p | t | w |
| "z | g" | q | a | d | g | j | m | p | t | w |
| "z | h" | q | a | d | g | j | m | p | t | w |
| "z | i" | q | a | d | g | j | n | p | t | w |
| "z | j" | q | a | d | g | j | m | p | t | w |
| "z | k" | q | a | d | g | j | m | p | t | w |
| "z | l" | q | a | d | g | j | m | p | t | w |
| "z | m" | q | a | d | g | j | m | p | t | w |
| "z | n" | q | a | e | g | j | m | p | t | w |
| "z | o" | q | a | d | g | j | n | p | t | w |
| "z | p" | q | a | d | g | j | m | p | t | w |
| "z | q" | q | a | d | g | j | m | p | t | w |
| "z | r" | q | a | d | g | j | m | p | t | w |
| "z | s" | q | a | d | g | j | m | p | t | w |
| "z | t" | q | a | d | g | j | m | p | t | w |
| "z | u" | q | a | d | g | j | m | p | t | w |
| "z | v" | q | a | d | g | j | m | p | t | w |
| "z | w" | q | a | d | g | j | m | p | t | w |
| "z | x" | q | a | d | g | j | m | p | t | w |
| "z | y" | q | a | d | g | j | m | p | t | w |
| "z | z" | q | a | d | g | j | m | p | t | w |
| "z | " | q | a | d | g | j | m | p | t | w |
| " | a" | q | c | d | i | l | n | r | t | w |

FIG. 10S

|     |      | 1 | 2 | 3 | 4 | 5 | 6 | 7 | 8 | 9 |
|-----|------|---|---|---|---|---|---|---|---|---|
| "-  | -"   |   |   |   |   |   |   |   |   |   |
| "   | b"   | q | a | e | i | l | o | r | u | y |
| "   | c"   | q | a | e | h | l | o | r | u | y |
| "   | d"   | q | a | e | i | j | o | r | u | w |
| "   | e"   | q | a | d | i | l | n | s | v | x |
| "   | f"   | q | a | e | i | l | o | r | u | w |
| "   | g"   | q | a | e | i | l | o | r | u | w |
| "   | h"   | q | a | e | i | j | o | p | t | w |
| "   | i"   | q | c | f | g | j | n | s | t | w |
| "   | j"   | q | a | e | g | j | o | p | u | w |
| "   | k"   | q | b | e | i | j | n | p | t | w |
| "   | l"   | q | a | e | i | l | o | p | u | y |
| "   | m"   | q | a | e | i | k | o | s | u | y |
| "   | n"   | q | a | e | i | j | o | p | u | w |
| "   | o"   | z | b | f | g | k | n | r | u | w |
| "   | p"   | q | a | e | h | l | o | r | u | w |
| "   | q"   | z | a | d | g | j | m | p | u | w |
| "   | r"   | q | a | e | i | j | o | s | u | w |
| "   | s"   | q | c | e | h | l | o | p | t | y |
| "   | t"   | q | a | e | h | j | o | r | u | w |
| "   | u"   | q | a | d | i | k | n | s | t | w |
| "   | v"   | q | a | e | i | l | o | p | t | w |
| "   | w"   | q | a | e | i | j | o | r | t | w |
| "   | x"   | q | a | d | g | j | m | p | t | y |
| "   | y"   | q | a | e | i | j | o | p | u | w |
| "   | z"   | q | a | e | i | j | o | p | t | y |
| "   | "    | q | a | f | i | l | o | s | t | w |

FIG. 10T

PREDICTIVE DATA ENTRY METHOD FOR A KEYPAD

CROSS REFERENCE TO MICROFICHE APPENDIX

Appendix A, which is a part of the present disclosure, is a microfiche appendix consisting of 6 sheets of microfiche having a total of 369 frames. Microfiche Appendix A is a listing of one embodiment of the client module of this invention, which is described more completely below, and a server, as described more completely below, to communicate and interact with the client module of this invention.

A portion of the disclosure of this patent document contains material, that includes, but is not limited to, Microfiche Appendix A, Appendix I, Appendix II, and FIGS. 10A to 10T, which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

1. Field of the Invention

This invention relates generally to data entry using a keypad, and in particular to data entry using a keypad where one or more keys represents two or more different characters.

2. Description of Related Art

For at least the last five years, the wireless communication industry has tried to merge computing with wireless communications. This industry wide effort has held the promise of bringing software intelligence to telecommunication devices including mobile wireless communications devices such as cellular telephones and two-way pagers as well as standard telephones.

After years of research and development, and hundreds of millions of dollars' investment by some of the largest companies in the field such as Motorola, AT&T, Sony, Matsushita, Phillips and IBM, the results have been nothing but disappointing. Typically, the intelligent communication devices resulting from these efforts include both the hardware necessary for a computer module and the hardware for a wireless communications module. Examples of such products are Simon from IBM and Bell South, MagicLink from Sony, and Envoy from Motorola.

Fundamental design and cost problems arising directly from the approach taken by the designers of these intelligent communication devices have limited widespread market acceptance of these devices. The combination of a wireless communication module with a computing module leads to a device that is too bulky, too expensive, and too inflexible to address the market requirements.

The combination of the two modules is too large and too heavy to fit in a user's pocket. Pocket size is a key requirement of the mobile communication market which remains unmet by these devices.

In addition, the cost of these devices is close to the sum of the cost of the computer module and of the communications module, which is around a one thousand dollar end-user price. Market research indicates that the market for intelligent wireless communications devices is at prices around $300. Even with a 20% compound cost decline, it would take five years for the combination units to meet today's customers' price requirements. It is therefore unlikely that devices designed by combining a computer and a wireless module, no matter how miniaturized and cost reduced, can satisfy the cost requirement of the market during this decade.

To succeed in the market place, intelligent wireless communication devices must be able to support a wide variety of applications specific to each market segment. Typically, these applications must be added to the device by the end-user after purchase. Thus, the device must provide a method for loading the initial application and for subsequent updating of the application.

The price sensitivity for intelligent communication devices and the size limitations means that an intelligent communication device cannot support the amount of core memory (RAM), a hard disk or non-erasable memory, or a traditional floppy disk drive, commonly found on computers. These limitations close the traditional routes for delivering new applications or updates to intelligent communications devices.

As a result, the current crop of intelligent communication devices run only the few applications which were burned into their ROMs at the factory or which are contained in a ROM card plugged into a slot designed for this purpose. This scheme lacks the flexibility needed to run the thousands of applications required to address the fragmented requirements of the market and provides no simple method for updating the applications after the device has been sold.

Two other communication oriented attempts at bringing intelligence to telephones are Short Messaging Service (SMS) and Analog Display Service Interface (ADSI). SMS specifies how messages are delivered to and from a cellular telephone and how the cellular telephone should store the messages. SMS also defines some simple processing which the cellular telephone can perform on the message, such as calling a telephone number embedded in the message.

SMS's architecture is similar to that of paging networks with the difference that devices implementing the SMS architecture operate over the control channel of the cellular telephone network. SMS is deployed primarily in Europe over the GSM network.

SMS messages are not delivered in real time. The time delays can range from 30 seconds up to 10 minutes, which makes SMS unsuitable for real time applications. The main purpose of SMS is the delivery of messages. SMS does not specify an application protocol or cellular telephone application module which further restricts its usefulness in running applications on cellular telephones. After a few years of deployment in Europe, SMS implementations have been limited to notification services such as two-way paging and voice mail notification.

SMS as a medium is unsuited to building applications which allows the retrieval, manipulation, and storage of information. This is the reason why the industry giants have not turned to SMS in their quest to add intelligence to cellular telephones, but have consistently attempted to combine a computer module with a wireless communications module.

ADSI was designed as an extension to Interactive Voice Response Systems. ADSI allows a smart telephone with a small screen to display prompts to assist users in choosing among various options. By using visual prompts instead of cumbersome voice prompts, ADSI is thought to make the use of interactive voice services easier and faster.

ADSI allows data to be sent from the service provider to the telephone in the form of screens. ADSI also allows the telephone to respond through touch tone signaling with a special coding to describe the full alphanumeric character set. With ADSI, a telephone is primarily a passive device. Services send text screens to the telephone, and the telephone sends back short strings indicating the choices the user made from the text screen.

ADSI makes no provisions for performance of processing in the telephone. As a result, ADSI generates a high traffic load on the telephone network since each user input is sent back to the service for processing. This makes ADSI unsuitable for wireless networks where bandwidth is at a premium and "air efficiency" is one of the most sought after qualities. The lack of processing capability in the telephone and the high bandwidth requirements of ADSI have prevented it from being considered by the industry for implementing intelligent wireless devices.

Up to now, intelligent communication devices have combined a computing module with a wireless communications module. However, to gain widespread acceptance, a two-way data communication device with processing capability and the ability to run a wide variety of differing user applications is needed. In addition, such a device should be comparable in size, cost, and weight to a cellular telephone.

SUMMARY OF THE INVENTION

According to the principles of this invention, a predictive data entry method permits a user of a device to efficiently enter data using a keypad where each of a plurality of keys represents a plurality of different characters. When the user presses one of the keys representing multiple characters, the predictive data entry method determines the character within the multiple characters most likely desired by the user. Thus, in most instances, a single key stroke is sufficient to select the desired character. This is in sharp contrast to prior art methods that required at least two key strokes to determine the desired character on a keypad.

The predictive data entry method of this invention allows devices with a limited keypad to function in a manner similar to devices with a full keypad, i.e., only a single keystroke is required to enter a character from the limited keypad. The generation of smaller computing devices has been limited by the necessity of either providing a full key board in a limited size package, or providing a sophisticated user interface that allowed the user to control the operation either with a pointing device or by writing on the display screen. The predictive data entry method of this invention eliminates the need for a full keyboard and requires only a limited amount of computer memory and so can be easily incorporated in a cellular telephone, for example. In contrast, it is not practical to implement a sophisticated user screen interface that supports either a pointing device, or a handwriting recognition system in a cellular telephone.

In one embodiment, the predictive data entry method is implemented in a device having a keypad wherein the keypad includes a plurality of keys and each key in the plurality of keys represents a plurality of different characters. The predictive data entry method generates a table index using at least one character in a memory buffer of the device in combination with information characterizing a key pressed by a user where the pressed key is one of the plurality of keys. The method retrieves at least one predictive character entry from a table of predictive character entries stored in a memory using the table index wherein the at least one predictive character entry represents a character in the plurality of characters represented by the pressed key.

Alternatively, the at least one character in the buffer memory is included in a plurality of characters in the memory buffer, and the plurality of characters are used in generating the table index. In one embodiment, the plurality of characters used in generating the table index comprises two characters.

In this method, each character in the plurality of characters in the memory buffer is a character in a set of characters. Each character in the set of characters is represented by a unique number and the unique numbers range from 0 to (N−1) where N is a number of characters in the set. The set of characters can include an alphabet, or an alphabet and a space element, for example.

The plurality of keys comprises M keys where M is an integer. Each key in the plurality of keys is assigned a unique number from one to M.

To retrieve a predictive character entry from the table, an index i0 for a first character in the two characters used to generate the table index is defined as the unique number representing the first character. An index i1 for a second character in the two characters is defined as the unique number representing the second character. The information characterizing a key pressed by a user is an index i2. Specifically, index i2 is defined as the unique number assigned to the pressed key minus one.

With this definitions, the table index is a TABLE_INDEX defined as:

$$TABLE\_INDEX = (((i0*N)+i1)*M)+i2.$$

This definition of the table index permits each predictive character entry in the table of predictive character entries to be stored as an S bit entry where S is an integer and is selected such that S is the smallest value such that 2**S if greater than or equal to a maximum plurality of characters represented by a key in the keypad. For example, if the maximum number of characters associated with a key is five each entry is stored as a three-bit entry.

For a telephone keypad having key number zero through key number nine with key number one representing letter Q and Z and key number zero representing a space element, predictive data entry process utilizes two bits for each predictive table entry, N is 27, and M is 9. The table of predictive data entries is stored in about 1641 bytes.

BRIEF DESCRIPTION OF THE DRAWINGS

FIGS. 4A to 4I are illustrations of a series of screen displays of the two-way data communication device of this invention that illustrate yet another application of the principles of this invention.

FIGS. 10A to 10T are one embodiment of a letter frequency table.

Herein, objects with the same reference numeral are the same object. Also, the first number of a reference numeral indicates the Figure where the object first appeared.

DETAILED DESCRIPTION

Figure 1:
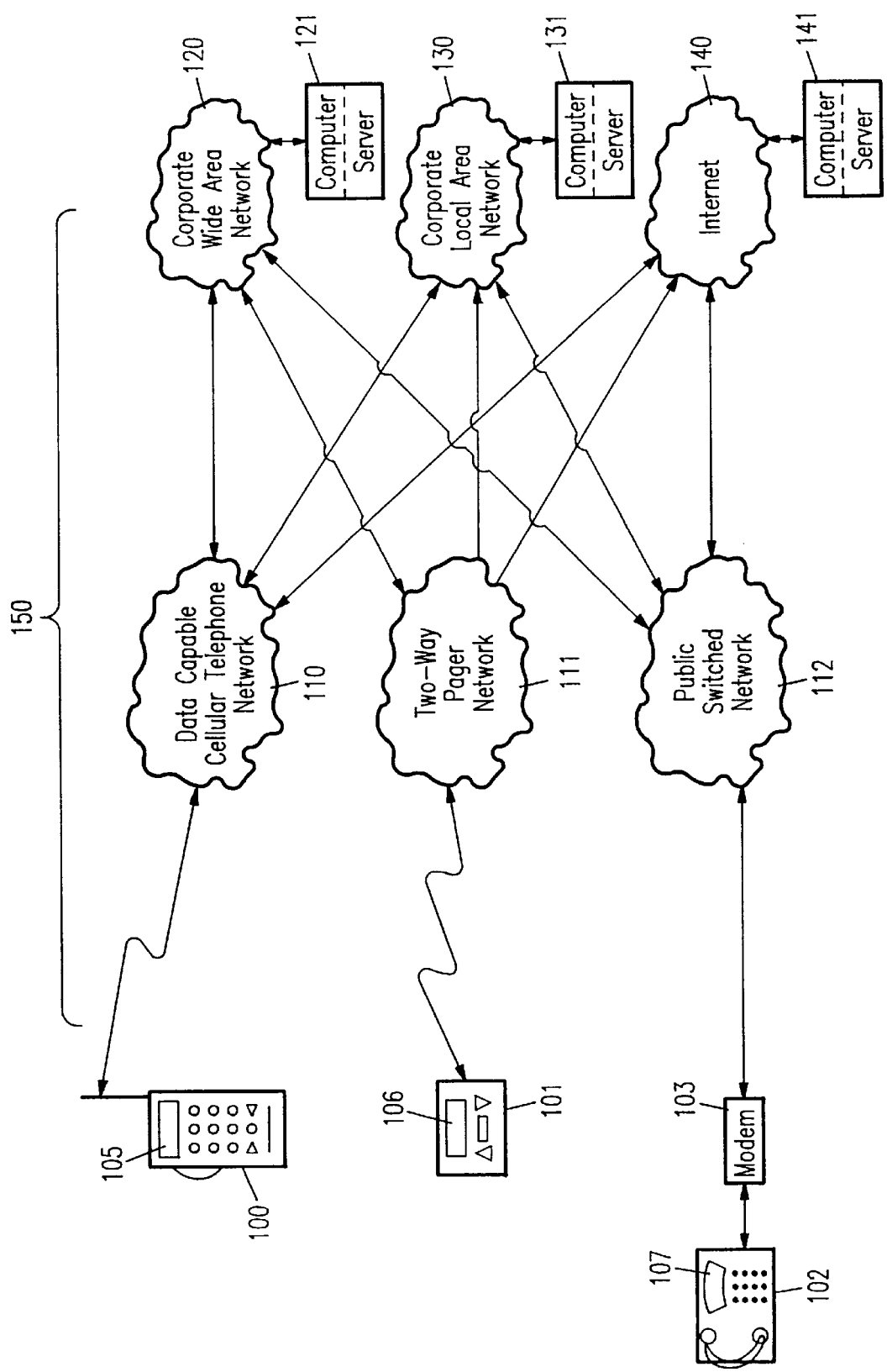
FIG. 1 illustrates one embodiment of the airnet network of this invention that includes the two-way data communication devices of this invention.

According to the principles of this invention, a novel airnet network 150, i.e., a two-way data communication network, interconnects any one, any combination, or all of two-way data communication devices 100, 101, or 102, that each include this invention, with a wide variety of computer networks 120, 130, and 140, for example. As explained more completely below, each two-way data communication device 100, 101, and 102 can be configured to transmit data to and receive data from any desired combination of computers on computer networks 120, 130, and 140. Airnet network 150 is the two-way data communication path from the two-way data communication device to the particular computer that is accessed by the user of that two-way data communication device.

Each wireless communication device 100 that includes this invention can communicate over airnet network 150 with any server computer 121, 131, and 141 on airnet network 150 that includes at least one application that communicates and interacts with the processes of this invention that are included within device 100. Thus, device 100 can access information on the computer network and provide information to the computer network. Similarly, a two-way pager 101, and a telephone 102 with a modem 103, that each include this invention, can communicate over airnet network 150 with any of server computers 121, 131, and 141 that includes at least one application that communicates and interacts with the processes of this invention that are included within devices 101 and 102.

As explained more completely below, an application on a server computer can be accessed by any two-way data communication device that can communicate with that server computer. The application is independent of the particular type of two-way data communication device that is used to access the application and independent of the particular two-way data communication network used. This means that a user can access an application from anywhere so long as the user has a two-way data communication device that can communicate with the server computer.

In one embodiment, a process on wireless communication device 100 is configured as a client process and the applications on server computers 121, 131 and 141 on airnet network 150, that communicate with the client process, are server processes. This architecture allows some of the processing burden to be moved away from cellular telephone 100, across airnet network 150, to a server module on any computer on airnet network 150.

Specifically, a wireless communication device 100 e.g., a cellular telephone, with a telephone like keypad, communicates via a data capable cellular telephone network 110, e.g., a cellular digital packet data telephone network, with an application on a server computer on a computer network that has an interface to data capable cellular telephone network 110. For example, the computer network can be a corporate wide area network 120, a corporate local area network 130, or perhaps the Internet 140.

Similarly, a two-way pager 101 communicates via a two-way pager network 111 with an application on a server computer on a computer network that has an interface to two-way pager network 111. Again, for example, the computer network can be a corporate wide area network 120, a corporate local area network 130, or perhaps the Internet 140. Finally, a telephone 102 communicates via a modem 103 and public switched telephone network 112 with an application on a server computer on a computer network that has an interface to public switched telephone network 112. As with the other two-way data communication devices, the computer network can be, for example, a corporate wide area network 120, a corporate local area network 130, or perhaps the Internet 140.

In each of two-way data communication devices 100, 101, and 102, the client process is stored as a client module in the device and the execution of the client module on a microcontroller in the device is sometimes referred to as the client process. The client process performs important processing functions locally. This allows the communication between the client process, hereinafter sometimes referred to as simply client, and the server process, hereinafter sometimes referred to as server, to be minimized and the server computing requirements to grow slowly as the number of clients, i.e., users, grows.

The client module is small, e.g., under 64 KByte, and requires only low processing power congruent with the memory chips and built-in microcontrollers in two-way data communication devices such as cellular telephone 100, two-way pager 101, and telephone 102. Thus, unlike the prior art attempts at an intelligent telephone, the cost, size, and battery life of either cellular telephones, two-way pagers, or telephones that incorporate this invention are not adversely affected.

While client/server architectures have been used extensively in computer networks, a client/server architecture implemented using two-way communication data devices such as cellular telephone 100, two-way pager 101, or telephone 102 yields new and unexpected results. This invention allows for the first time a wide variety of two-way data communication devices including but not limited to cellular telephones, two-way pagers, and telephones to become open application platforms which in turn empowers software developers to deliver value added applications and services to any two-way data communication device which incorporates the principles of this invention.

This is a radical shift from the current situation where cellular telephones, two-way pagers, and telephones are closed, proprietary systems. Consequently, an even playing field is created for the market to invent new uses for cellular telephones and data capable cellular networks, for two-way pagers and two-way pager networks, and for telephones on the public switched network.

Any entity from corporations to individuals can make new applications available to the installed base of data ready cellular telephones, two-way pagers, and telephones, that include this invention without physical modification or addition to the devices. Years after purchase, a two-way data communication device with this invention can run all the applications which were developed since its purchase. Further, all these applications are available without the user having to add anything or make any modification to the two-way data communication device. These features of the invention are a significant departure from prior art systems. Typically, in the prior art, use of a particular application on a particular platform required that the application be compatible with the operating system on that platform. Further, each time a new version of the application was released, the user was required to take steps to update the application on the user's platform. Further, if the user of the platform did not modify the operating system as new versions of the operating system were released, at some point in time, the platform would no longer be capable of processing a new version of an application that required a current version of the operating system.

Also, small devices, such as cellular telephones or pagers, usually do not have card slots, floppy or hard disk drives, or other means commonly found on computers to add or update applications. This limitation has led prior art attempts at intelligent communication devices to design closed systems with fixed functionality. Such devices can neither adapt nor be adapted to the fast changing requirements of the market place and so have not met with market success.

This invention eliminates these problems. The client process in the two-way data communication device functions as an interpreter. The application on the server computer provides all information necessary for the interpreter to generate a user interface on the two-way data communication device, and in response to user selections or data input using the user interface, to route messages to an appropriate server, i.e, either the server that sent the original information or another server.

Thus, the client process only interprets this information and interacts appropriately with the hardware of the two-way data communication device. Consequently, to update an application requires only changes on the server computer and not changes in each two-way data communication device that communicates with that server computer. This invention eliminates the usual requirement for distribution of application software, and application software updates to the end user of the two-way data communication device.

For example, if initially, two-way pager 101 receives a response to a message from an application on server computer 121 on corporate wide area network 120, the interpreter in two-way pager 101 generates a user interface on display screen 106 using information in the message. As described more completely below, options presented in the user interface can allow the user to access information, or provide information to any one, any combination of, or all of networks 120, 130, and 140.

Specifically, in the response to the message from two-way pager 101, the application initially accessed on server computer 121 included resource locators for applications on each of networks 120, 130, 140, typically common gateway interface programs, accessible to the user of pager 101 as well as information required to generate the user interface. Consequently, when the user makes a particular selection or enters data, the interpreter accesses the appropriate resource locator and appends any necessary data to the resource locator. The client transmits a message including the resource locator to the appropriate server.

As shown by this example, the applications on networks 120, 130, 140 send to the two-way data communication device all information necessary to generate a user interface, and to process all user input. Consequently, only an application must be changed to update the information provided to the two-way data communication device.

In addition, since all the information needed by the client to generate a user interface and all information necessary for the client process to respond to any input data is included in the message, the computer server does not retain any state information concerning the information transmitted to the client process. Consequently, the computer server is stateless.

Each two-way data communication device 100, 101, and 102 that utilizes airnet network 150, includes a data communication capability, a display screen, preferably a multi-line display screen, and storage capability for the processes of this invention in an on-board memory, and for the message being processed. Nearly every data capable cellular telephone, e.g., a telephone that utilizes a cellular digital packet data network, includes excess on-board memory capacity and a multi-line display screen. These hardware resources are often available, but unused in a data capable cellular telephone because of the indivisibility of memory chip packages. The inclusion of the processes of this invention in such cellular telephones therefore has very little effect on the cost, size, and power consumption of the cellular telephone. Similarly, the inclusion of the processes of this invention in two-way pagers and telephones, that include a microcontroller and memory, has very little affect on the cost, size, and power consumption of these devices.

Thus, unlike prior art approaches that attempted to combine a computer module and a wireless communication module in a single package, this embodiment of the invention preferably utilizes the memory and processing power that currently exists in the cellular telephone 100, two-way pager 101, telephone 102 or other wireless or landline two-way data communication devices. This approach limits the cost of the resulting device and overcomes many of the problems of the prior art devices, e.g., the size and weight of the two-way data communication device is not changed, and, as explained above, updating user applications is removed from cellular telephone 100, two-way pager 101, and telephone 102.

In particular, unlike devices produced by previous industry attempts at combining computing modules and a wireless cellular module, two-way data communication devices which incorporate this invention are size and cost competitive with voice-only telephones and can, for the first time, satisfy the market cost and size requirements for an intelligent cellular telephone, for example.

The incremental cost of supporting interactive applications on cellular telephone 100, two-way pager 101, and telephone 102 is reduced to at most a slightly larger screen that is required to display the application to the user. This is a fraction of the cost of adding a complete computer module to a cellular telephone, for example.

The incremental power consumption required to support this invention is also very small, as the incremental memory and screen required are small consumers of power compared to the cellular radio itself. Intelligent two-way data communication devices built according to the principles of this invention are not expected to have a significantly lower battery life than standard cellular telephones, or two-way pagers, for example.

The configuration and processes of the client process in two-way data communication devices 100, 101, and 102 are similar when the differences in the devices and the two-way data communication network over which the devices communicate are considered. Consequently, in the following description, the operation of data-ready cellular telephone 100 is considered. The same or similar operations can be performed on two-way data communication devices 101, and 102. The main difference is that some device dependent features within the client module must be changed to accommodate the particular hardware used in the two-way communication device. However, the client module architecture described more completely below limits the number of changes that must be made.

As indicated above, in response to user actions, wireless communication device 100 transmits a message, typically a data request, to a server computer 121 on computer network 120 and receives a response to the message. Alternatively, the user action can result in directions to server computer 121 on computer network 120 to transmit the response to the message to another location or to another user. Also, wireless communication device 100 can receive a message from any one of the computers coupled to airnet network 150.

An important aspect of this invention is that the client module interpreter in wireless communication device 100 generates a user interface by which the user can both initiate and receive messages from a variety of applications. The interactions take place in real-time and are not limited by the client module interpreter. The uses of wireless communication device 100 are limited only by the availability of applications on server computers.

The applications available are determined by application developers. Prior to considering one implementation of the invention in further detail, several illustrative examples of applications that can be implemented according to the principles of this invention are described. These applications are illustrative only and are not intended to limit the invention to the particular applications and features described.

In one use, the user configures cellular telephone 100 to access server computer 121 on XYZ corporate wide area network 120. In response to the access by the user, server computer 121 transmits a card deck to cellular telephone 100 over data capable cellular telephone network 110. As explained more completely below, a card deck includes one or more cards, and each card is interpreted by the client module to generate a user interface screen.

Figure 2A:
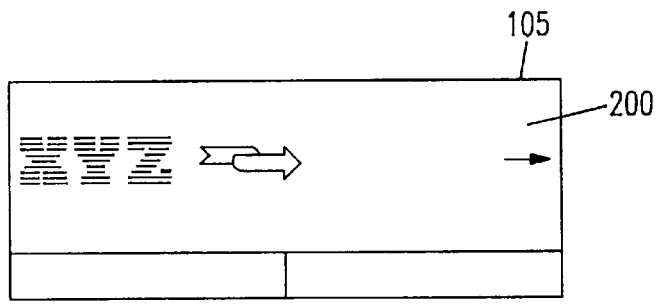
FIGS. 2A to 2H are illustrations of a series of screen displays of the two-way data communication device of this invention that illustrate one application of the principles of this invention.

In the embodiment illustrated in FIG. 2A, the initial card deck transmitted to cellular telephone 100 includes an introductory display card and a choice card. FIG. 2A is an example of introductory screen display 200 that is generated on display screen 105 by the client process in cellular telephone 100 by interpreting the display card. As used herein, a display screen is the physical display apparatus in a two-way communication device. A screen display is the image presented on the display screen.

In this embodiment, display screen 105 is a pixel display that displays graphics. In another embodiment, display screen 105 displays only text and so the graphics would not appear on display screen 105. Screen display 200, and other screen displays described more completely below, include a horizontal arrow, i.e., a multi-card deck indicator, to communicate to the user that the current deck includes another card. The inclusion of screen indicators, such as the multi-card deck indicator, to communicate with the user is optional. The functionality of this invention is independent of such screen indicators.

Figure 2B:
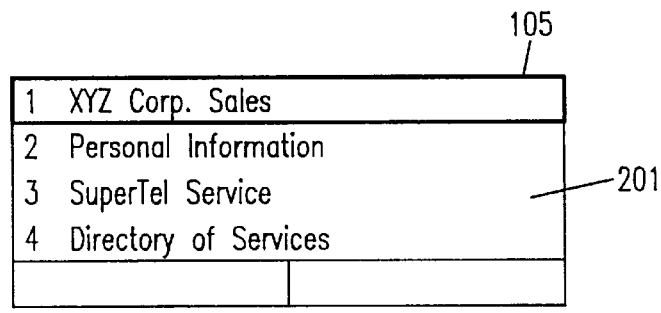

When the user presses a predetermined key, or key sequence, the client process in cellular telephone 100 interprets the next card in the card deck, i.e., the choice card, and in turn generates a menu 201 (FIG. 2B) of items that can be accessed by the user. In this embodiment, each of the menu items is available on server computer 121 to the user who, in this example, is a representative of XYZ corporation visiting ABC Designs.

As explained more completely below, each of the menu items is associated with a resource locator that includes an address of the particular object associated with that menu item, typically an address to a common gateway interface program on server computer 121. In general, a resource locator includes an address and may include appended data. The address can be to a local object within the two-way data communication device or to a remote object on a server computer. As is known to those skilled in the art, the common gateway interface is an Internet standard that is used to dynamically generate information, e.g., cards. In view of this disclosure, other techniques to generate dynamic cards could be used.

Initially, the highlighting of the first line of menu 201 is not present. When a key on the keypad of cellular telephone 100 is pressed, the menu item corresponding to that key is highlighted on screen 105. Thus, menu 201 shows the first item highlighted to indicate that the one key was pressed by the user. However, highlighting a selected item is a feature that is specific to this example, and in general is not required to implement the invention. Other methods can be used to indicate the user's choice on display screen 105 such as an arrow pointing at the choice, if such an indication is desired.

After the one key is pressed, the user presses a predetermined key, e.g., an enter key, to verify the selection. Alternatively, in another embodiment, the verification of the selection is not required. In both embodiments, the resource locator for the selection is transmitted to server computer 121 by the client process in cellular telephone 100 over data capable cellular telephone network 110. In response to the selection, server computer 121 processes the message containing the selection, and in this embodiment, transmits another card deck to cellular telephone 100.

Figure 2C:
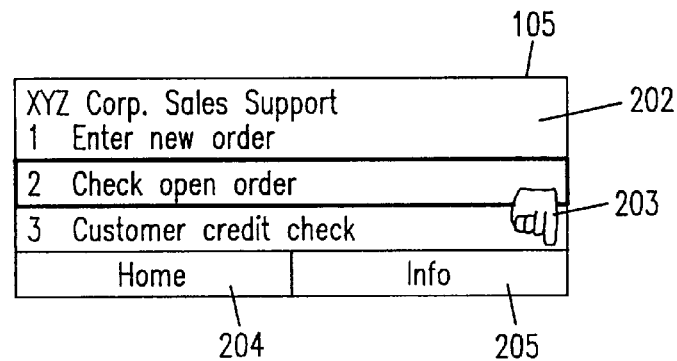

The client process in cellular telephone 100 interprets the first card in the deck received from server computer 121, which is a choice card, and generates a screen display 202, that includes a second menu as illustrated in FIG. 2C, on display screen 105. Initially, none of the items in the second menu are highlighted.

Notice that screen display 202 includes a header, that describes the selection made by the user on screen display 201, in addition to the second menu of choices available to the user. A multi-display screen card indicator 203, e.g., in this embodiment, a hand icon with a finger pointing down, shows that the screen associated with the current choice card includes additional items that are not shown on display screen 105. Herein, a screen can be larger than the number of lines available on display screen 105 and so the user must scroll the screen display to view the complete screen.

Thus, to view the additional items, the user presses a first screen scroll key, e.g., a next key, on cellular telephone 100.

In this embodiment, when the first screen scroll key is pressed, each line of the display is rolled up one line. The resulting display has an icon with a finger pointing up (not shown) if the menu requires only two screen displays. If the menu requires more than two screen displays, the second screen display of the menu would have two icons, one with a finger pointing up, and another with a finger pointing down. To scroll between the various lines in the second menu, the user uses the first screen scroll key, and a second screen scroll key.

If the user displays the last line of a card, e.g., the last line in the second menu, and presses the first screen scroll key nothing happens. In this embodiment, the user must make a choice before the next card is available.

Screen display 202 also includes representations of two soft keys, a home key 204, and an info key 205. In this example, these soft keys are defined only for the card used to generate screen display 202. When the user presses a predetermined key sequence, the home key is highlighted to indicate the selection. In this embodiment, when the home key is selected, the user is returned to screen display 200. In another embodiment, the user could be returned, for example, to a home screen display that is displayed each time the user activates cellular telephone 100 for use on airnet network 150.

The home key is associated with a pointer, that in one embodiment is a resource locator, and the card addressed by the pointer is displayed by the client process when the home key is selected by the user. Specifically, if the pointer is to a card in the current deck, the client process simply displays that card. If the pointer is to other than a card in the current deck, the client process in cellular telephone 100 retrieves the deck containing the card at the location identified by the pointer. The location could be, for example, either a memory in cellular telephone 100, or a memory in computer 121.

Similarly, when the user presses another predetermined key sequence, the info key is highlighted to indicate the selection. In this embodiment, when the info key is selected, a help screen is displayed for the user that describes the possible selections. The particular contents of the help screen are determined by the provider of the service. Specifically, a pointer is associated with the info key and when the info key is depressed by the user, the information stored at the location identified by the pointer is retrieved and interpreted by the client process in cellular telephone 100.

Returning to the menu in FIG. 2C, since the user wants to determine the status of an order, the user pushes the two key on the keypad of cellular telephone 100. In response to the key press, the second choice in the menu is highlighted as shown in FIG. 2C. In response to verification of the key press, e.g., the user presses a predetermined key sequence, cellular telephone 100 transmits a check open order request to computer 121, i.e, the client process transmits a message that includes a resource locator associated with the menu item selected by pressing the two key.

Figure 2D:
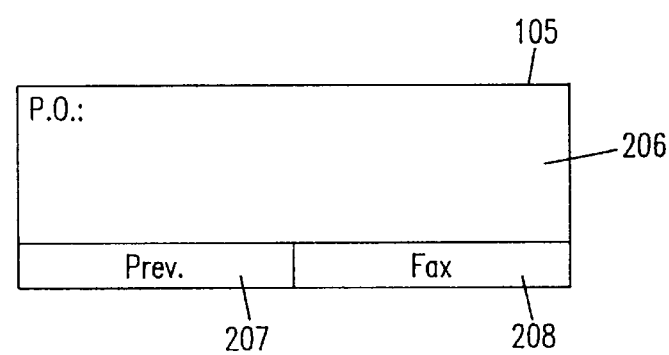

In response to the check open order request, computer 121 transmits yet another card deck to cellular telephone 100. The client process in cellular telephone 100 interprets this deck, that is an entry card, and in turn generates a purchase order number entry screen display 206 (FIG. 2D) on display screen 105. Notice that screen display 206 has a previous soft key 207 and a fax soft key 208. Again, each of these soft keys has an associated pointer and the information stored at the location identified by the pointer is retrieved and interpreted by the client process when the user selects the soft key.

Figure 2E:
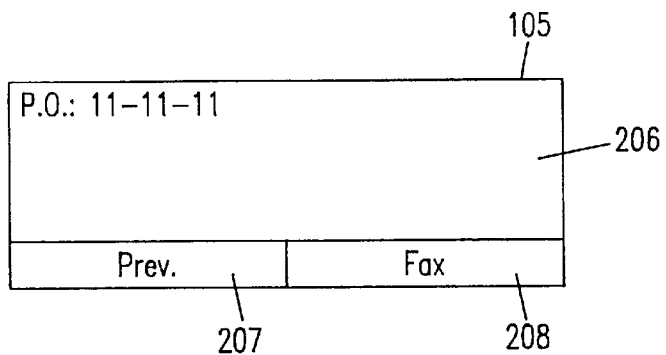

In this example, the user does not select a soft key, but rather the user enters the purchase order number as shown in FIG. 2E using the keypad of cellular telephone 100. The user enters only the various numbers. The client process formats the number and inserts the dashes as shown in FIG. 2E.

After the purchase order is entered, the user presses a predetermined key sequence to indicate to the client process that entry of the purchase order number is complete. Notice that the user is entering data and not simply selecting a menu item. The user is utilizing cellular telephone 100 as if cellular telephone 100 was a computer connected to network 120, but, as explained more completely below, cellular telephone 100 is similar to a standard digital data capable cellular telephone that communicates over data capable cellular telephone network 110. Specifically, cellular telephone 100 is not a combination of a computer module and a wireless communication module as in prior art attempts to create an intelligent telephone.

In addition, the user enters data using only the standard cellular telephone keypad. Thus, cellular telephone 100 eliminates the need for a computer keyboard or for a sophisticated touch screen that recognizes motion of a pointing object. This is important to maintaining the size, weight, and power requirements of cellular telephone 100 similar to those of a voice-only cellular telephone. In one embodiment, to facilitate data entry, as explained more completely below, cellular telephone 100 includes a text prediction process that reduces the number of key strokes required to enter text data. In this embodiment, the text prediction process is turned on or off for each entry card.

In response to entry of the purchase order number, the client process transmits a request to server computer 121 for the particular purchase order. Specifically, the client process appends the entered data to a resource locator and transmits a message containing the resource locator to server computer 121. Server computer 121, in response to the message, retrieves the appropriate purchase order and transmits the purchase order as a card deck to the client process in cellular telephone 100 over airnet network 150.

Figure 2F:
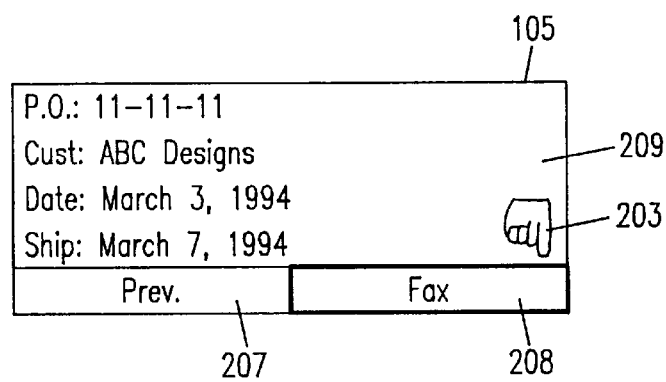

The client process interprets the card deck and generates a screen display 209 (FIG. 2F). Initially, fax key 208 is not highlighted in screen display 209.

Notice that screen display 209 includes multi-display screen card indicator 203 to show the user that the purchase order screen contains more information that can be displayed at one time on display screen 105.

After the user reviews the purchase order, the user presses the key sequence for fax key 208 and in response, fax key 208 is highlighted as illustrated in FIG. 2F.

Figure 2G:
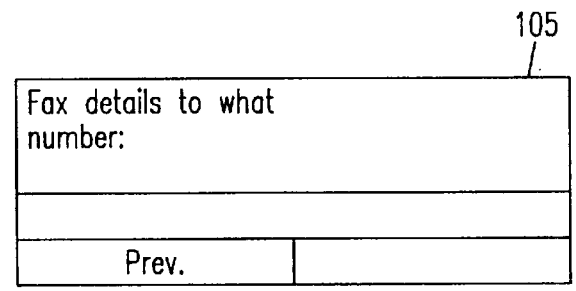

In response to selection of fax key 208, the client process retrieves the card deck at the location identified by the pointer associated with fax key 208. If the location is on server computer 121, the client process transmits a message including a resource locator to server computer 121 and in response to the message, server computer 121 transmits back yet another card deck. If the location is on a server computer other than server computer 121, the client process transmits a message including a resource locator to that server computer and in response to the message, that server computer transmits back yet another card deck. If the location identified by the pointer is within cellular telephone 100, the client process simply retrieves the deck. In either case, fax form 210 (FIG. 2G), that is an entry card, is displayed on display screen 105 by cellular telephone 100. This example demonstrates the information accessed by the client process can be located in any number of locations. The resource locator associated with the fax key identifies the appropriate location.

Figure 2H:
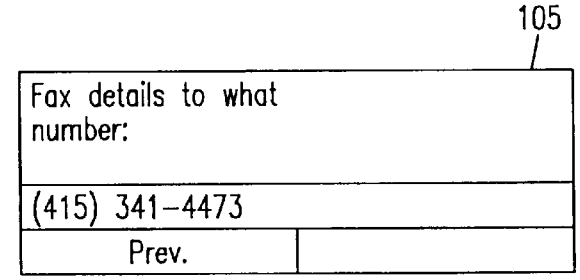

When fax form 210 is displayed, the user enters the facsimile machine telephone number at ABC Designs, as shown in FIG. 2H, using the cellular telephone keypad. In this embodiment, the telephone number is automatically formatted by the client process. After the telephone number is entered, the client process appends the telephone number to a resource locator and transmits the information to server computer 121.

When server computer 121 receives the information, server computer 121 executes a common gateway interface application (CGI) pointed to by the resource locator. The CGI application grabs the necessary information and transmits the information via e-mail to a fax gateway. The fax gateway, upon receipt of the e-mail, converts the information to a fax and sends the information to the specified telephone number. Thus, cellular telephone 100 requires neither a printer connection nor a print driver, but yet can print using the facsimile machine at ABC Designs.

As illustrated in this example, cellular telephone 100 transmitted a request for a particular purchase order, and scheduled transmission of data responsive to the request to a local machine capable of printing the data. Thus, the processes of this invention, as described more completely below, in cellular telephone 100 in combination with data capable cellular telephone network 110 and server computer 121 permit cellular telephone 100 to effectively utilize an application on server computer 121 on network 120 even though cellular telephone 100 utilizes only a microcontroller found in telephone 100 and does not required a separate computer module as in the prior art.

In addition, the client process using the information transmitted from server computer 121, i.e, the cards, generates a wide-variety of user interfaces as illustrated in FIGS. 2A to 2H. The particular configuration of the various user interfaces is defined by the cards transmitted in a card deck. Consequently, the user interface is not fixed to one particular format such as an E-mail type format, but rather the format is variable and can be redefined by each card that is interpreted by the client process. Also, in general, the user interface for one application on a server computer is independent from the user interface for another application on that server computer.

Specifically, the application accessed on server computer 121 generates the card deck and so in turn defines each of the various user interfaces. Each user interface permits the user to identify a particular selection. Each particular selection could result in generation of a different user interface with different selections. Thus, the user interfaces are limited only by the applications accessible to the two-way data communication device.

As shown below, a wide variety of applications can be provided on a server computer. Despite the robustness of the client module in interpreting a wide variety of application, typically, the client process is lightweight and thus requires only lightweight resources, e.g., 60 Kbytes of read-only memory (ROM) for the client module, 10 Kbytes of random access memory (RAM), and less than one million instructions per second (MIPS) of processing power. Since the client process needs only these lightweight resources in a two-way data communication device, the client can use existing resources in such a device and therefore does not add to the cost of the two-way data communication device such as data capable cellular telephone 100.

In another embodiment, the user can configure cellular telephone 100 to access server computer 131 on corporate local area network 130. In response to the access by the user, computer 131 transmits a home card (not shown) to cellular telephone 100 which in turn generates a home screen display on display screen 105.

When the user selects personal information on the home screen display or on a subsequent screen display associated with the home card, a message including a resource locator for a personal information deck is transmitted from cellular telephone 100 to computer 131. In response to the message, computer 131 transmits a card deck that includes a display card and a choice card to cellular telephone 100. In these examples, the card deck is described as including one of three cards, a display card, a choice card, and an entry card. However, these examples are illustrative only, and are not intended to limit the invention to those particular embodiments of cards. In view of this disclosure, those skilled in the art will be able to form combinations of these types of cards and define other types of cards, if such cards are appropriate for the particular application.

Figure 3A:
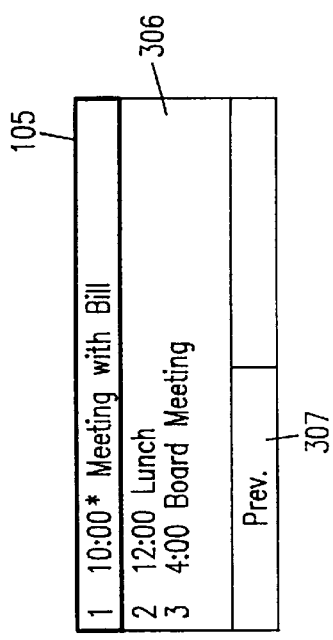
FIGS. 3A to 3F are illustrations of a series of screen displays of the two-way data communication device of this invention that illustrate a second application of the principles of this invention.

The client process in cellular telephone 100 interprets the display card that includes image and text data and generates screen display 300 on display screen 105 (FIG. 3A). Screen display 300 includes a home key 301, and an info key 302. When the user selects home key 301, the user is returned to the home screen. Info key 302 functions in a manner similar to that described above for info key 205.

Figure 3B:
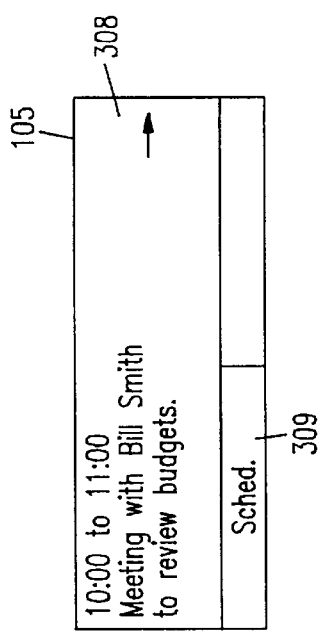
Figure 3C:
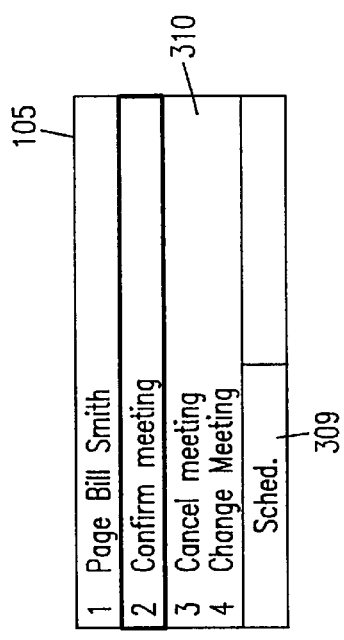

When the user presses a predetermined key, the client process interprets the choice card and a second screen display 304 (FIG. 3B) is driven on display screen 105. Screen display 304 is a menu of the personal information that is stored on server computer 131 for use by the user of cellular telephone 100. Multi-display screen card indicator 203, e.g., the hand with a finger pointing down, illustrates to the user that the list has additional items that appear on the next screen display. Screen display 304 also indicates the number of E-mail messages, faxes, and voice messages waiting for the user.

The user scrolls the screen display line by line until screen display 305 is on display screen 105. Initially, the fourth item in the menu is not highlighted. In this example, the user presses the four key on the keypad of cellular telephone 100 to view the user's schedule. In response to the key press, the client module in cellular telephone 100 transmits a message, including a resource locator associated with the menu item selected by pressing the four key, to server computer 131 using data capable cellular telephone network 110 and corporate local area network 130.

In response to the message, server computer 131 executes the application identified in the resource locator. Upon completion of the execution, server computer 131 transmits, over corporate local area network 130 and data capable cellular telephone network 110 to cellular telephone 100, a card deck that includes a choice card that describes the user's schedule for that day.

In this embodiment, when server computer 131 completes the transmission, server computer 131 has completed the response to the message and has transmitted all necessary information to cellular telephone 100. Therefore, server computer 131 does not retain any state information concerning the transmitted information and so is referred to as a stateless server computer 131. In this embodiment, the client process can only request a card deck. However, as demonstrated herein, card decks and the two-way interactive data communication system of this invention provide the user with a new level of capability.

Figure 3D:
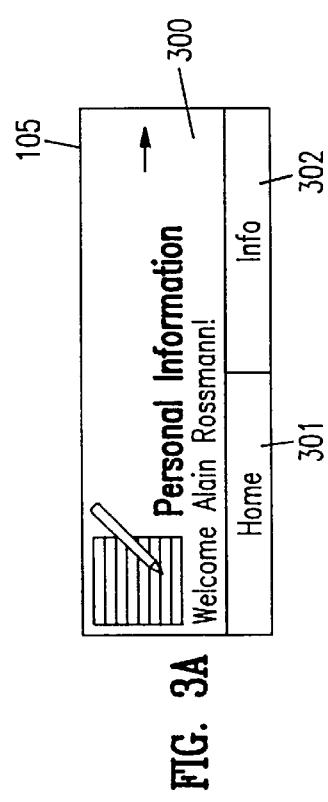
Figure 3E:
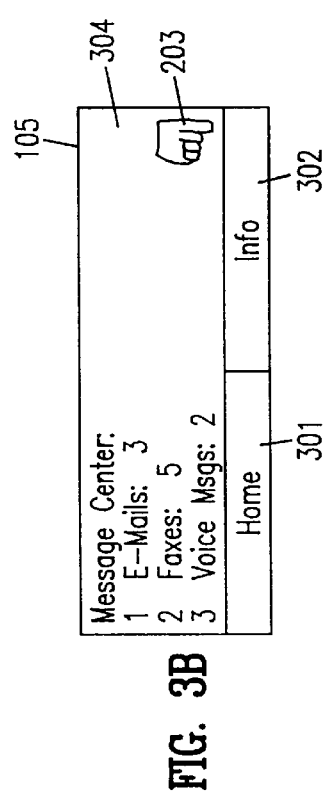

When cellular telephone 100 receives the card deck, the client process in cellular telephone 100 interprets the choice card and drives screen display 306 (FIG. 3D) on display screen 105. Initially, the first item in the menu of screen display 306 is not highlighted. When the user depresses the one key on the keypad of cellular telephone 100, cellular telephone 100 highlights the first item in the menu. Cellular telephone 100 generates screen display 308 (FIG. 3E) upon the user subsequently depressing a predetermined key. Screen display 308 includes a schedule key 309, that when selected returns the user to screen display 306 (FIG. 3D). Screen display 308 also includes a more detailed description of the 10:00 a.m. meeting.

Figure 3F:
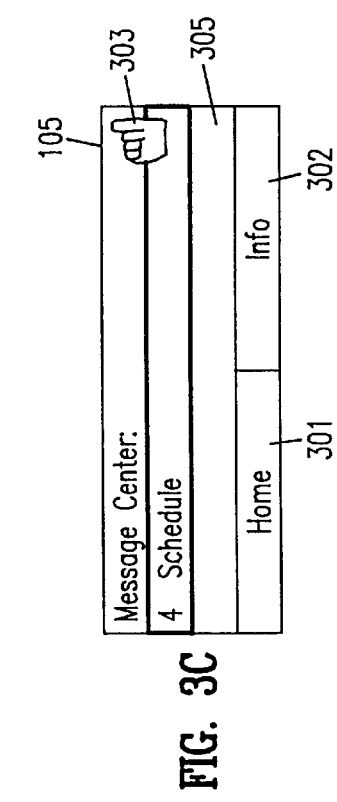

While screen display 308 is active, if the user depresses a predetermined key, the user is presented with the options in screen display 310 (FIG. 3F). Initially, item two in screen display 310 is not highlighted.

In this example, the user depresses key two on the keypad of cellular telephone 100 and so cellular telephone 100 sends a message including a resource locator to server computer 131 to send an E-mail message to Bill Smith confirming the meeting at 10:00 a.m. When server computer 131 executes the application addressed by the resource locator, an E-mail message is sent.

In another example, the user of cellular telephone 100 connects to Internet service provider computer 141 on Internet 140 using data capable cellular telephone network 110. Upon connection of cellular telephone 100, service provider 141 transmits to cellular telephone 100 a card deck to generate FIGS. 4A to 4C.

The client process in cellular telephone 100 interprets the first card in the card deck from computer 141 and generates screen display 400 (FIG. 4A). When the user presses a predetermined key, cellular telephone 100 displays screen display 401 (FIG. 4B). Screen display 401 provides the user with a series of choices that group services alphabetically.

When the user depresses the seven key on the keypad of cellular telephone 100, cellular telephone 100 displays a list of the services that have letters P, R, or S as the first letter in the service name. In this embodiment, screen displays 401 and 402 are a single card, e.g., a single screen. Each of the various services associated with a key has an index and when a particular choice is made by the user, the choice defines an index. The client process then displays all of the services with the index that corresponds to the index defined by the user's choice.

In screen display 402, the user is given a series of choices of services that are available to the user under tab seven. Initially, item three in screen display 402 is not highlighted. In this example, the user depresses the three key on the keypad of cellular telephone 100 to select the stock quotes and item three in screen display 402 is highlighted.

In response to this selection, cellular telephone 100 transmits a request for a stock quote, i.e, a message including a resource locator, over cellular telephone network 100 and internet 140 to service provider 141. In response to the request, service provider computer 141 executes the application addressed by the resource locator. The application retrieves a card deck that, in turn is transmitted to cellular telephone 100. The card deck includes a display card and an entry card.

Upon receiving the card deck, the client process in cellular telephone 100 interprets the display card and generates screen display 403 (FIG. 4D). When the user depresses a predetermined key, entry screen display 406 (FIG. 4E) is generated on display screen 105 of cellular telephone 100.

Initially, the box with letters SUNW in screen display 406 is empty. The letters SUNW are entered in the box by the user to indicate the ticker symbol of the stock for which the user wants information. After the user has entered the stock ticker symbol, the user presses the predetermined key to indicate that the entry is complete.

In response to the entry by the user, the client module appends the stock ticker symbol to the resource locator and transmits the resource locator to service provider computer 141 which, in turn, executes an application addressed by the resource locator to retrieve the latest stock market information for the stock ticker symbol. Service provider 141 uses the retrieved information to generate a card deck that contains the information and then transmits the card deck to cellular telephone 100.

The client process in cellular telephone 100 interprets the first card in the deck and generates screen display 409 (FIG. 4F). For convenience, the FIGS. 4F to 4I are grouped together and separated by a dotted line. However, at any given time, in this embodiment, display screen 105 can display any four adjacent lines and so the grouping of lines in FIGS. 4F to 4I is for convenience only to demonstrate the level of information that can be retrieved and displayed by the client process. The use of a four line display screen is illustrative only. The client process of this invention can work with any size display screen, even a one line display screen. However, a multi-line display screen is preferred.

In the Figures discussed above, the display screen is a pixel display and so can display images. In another embodiment, the display screen only displays text and is smaller in size. For such an embodiment, the various entries are abbreviated and only text is displayed, but the general operation is identical to that just described. Also, the various computer networks can be interlinked so that a user with access to one computer network can obtain information on another computer network. Moreover, the embodiments described above are merely illustrative. One important aspect of this invention is that cellular telephone 100 can interact with any type of server application that is configured to communicate with and interact with the client process in cellular telephone 100. Thus, the user is no longer limited to only a few services offered by a telephone network provider.

In FIG. 1, the cellular telephone user must address, i.e., connect to, each computer of interest to access the different services. Consequently, each computer requires the information necessary to communicate with cellular telephone 100. In another embodiment, not illustrated, cellular telephone 100 contacts a single central computer over data capable cellular telephone network 110. This computer is connected to each of the other networks illustrated in FIG. 1. Consequently, the user of cellular telephone 100 sends a message including a resource locator to the central computer, the central computer processes the message and retrieves the information addressed by the resource locator from the appropriate network shown in FIG. 1. After the requested information is retrieved, the central computer generates a card deck and transmits the card deck to cellular telephone 100. In this embodiment, only one computer must be configured to communicate with cellular telephone 100. However, that same computer must be configured to communicate with all other computer networks that are of interest to the user of cellular telephone 100.

Hence, according to the principles of this invention, the client process on a two-way data communication device can initiate an interaction with a particular server computer. The server computer transmits (i) information to the client process to generate a user interface, and (ii) a resource locator for each possible selection by the user from the user interface. The resource locators can address applications on the server computer, applications on over server computers, or an application on the server computer that in turn accesses other server computers. Consequently, the user of a two-way data communication device is limited only by the applications provided on the server computers.

Further, the user can be provided new and/or updated capabilities by modifying the applications on the server computers. There is no requirement that the client process be changed for a new or updated application. The client process must only interpret the information received from an application and transmit a message for additional information. These operations are unaffected by a new or updated application. Consequently, as noted above, this invention does not require distribution of application updates or new applications to the end user of the two-way data communication device.

Figure 5:
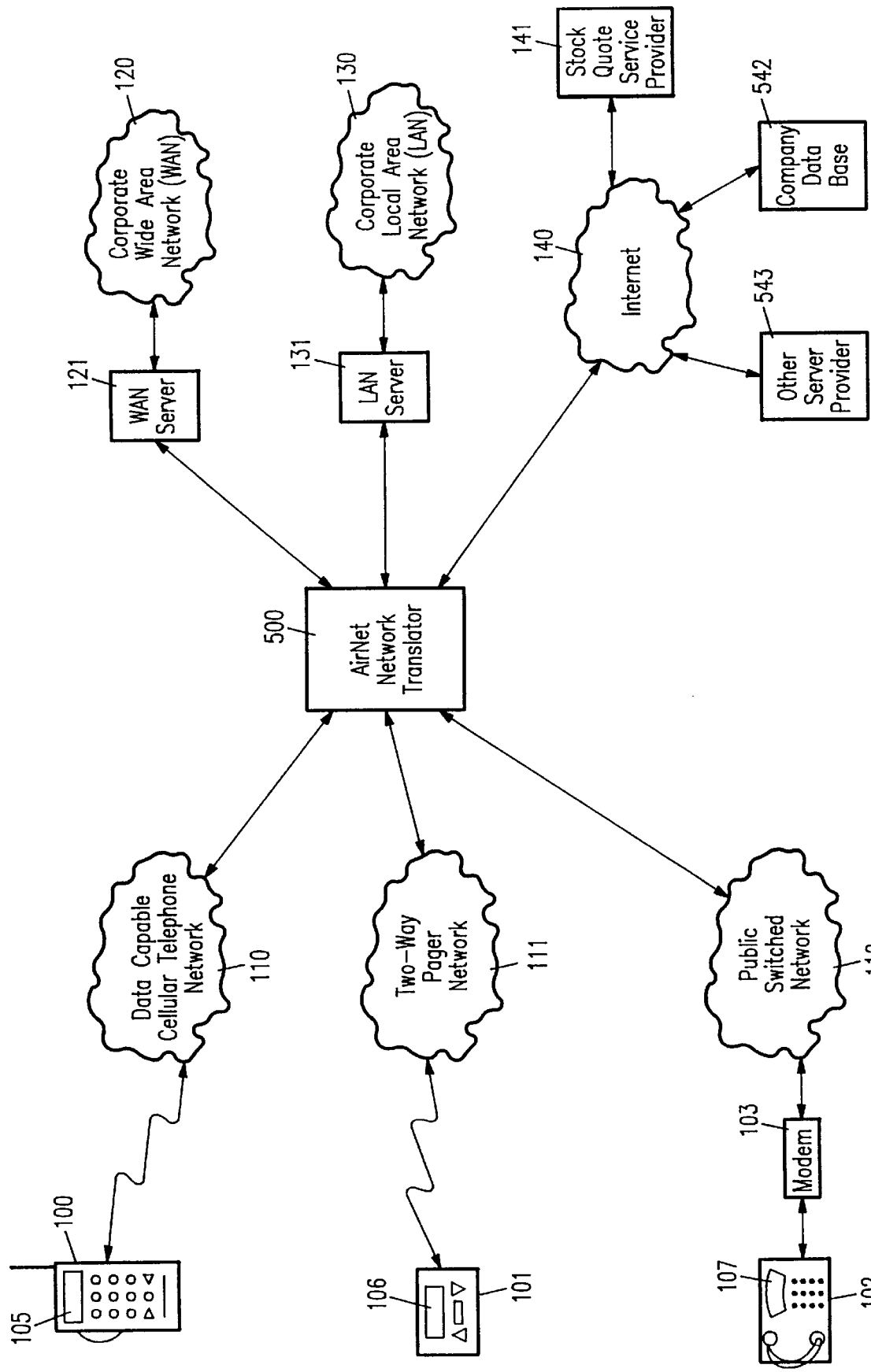
FIG. 5 illustrates another embodiment of the airnet network of this invention that includes the two-way data communication devices of this invention and an airnet network translator.

FIG. 5 is an illustration of another embodiment of airnet network 150. In this embodiment, the messages from a two-way data communication device, e.g., devices 100, 101, and 102 are directed to an airnet network translator 500. Airnet network translator 500 and a particular two-way data communication device, e.g., any one of devices 100, 101, and 102 communicate using the protocol for point-to-point communication on the particular network linking airnet network translator 500 and that two-way data communication device. For example, if data capable cellular telephone network 110 is a cellular digital packet data network, either the transmission control protocol (TCP) or the user datagram protocol (UDP) can be used.

Airnet network translator 500 transfers data between the two-way data communication device and the selected computer network after translator 500 validates the communication path, as explained more completely below, and encrypts the message transferred to the computer network if necessary. In addition, airnet network translator 500 collects transaction and billing information concerning the communication between the two-way data communication device and the designated computer network. Specifically, airnet network translator 500 provides access control for paying services and a logging mechanism for billing. Airnet network translator 500 can also provide a directory service to users.

Figure 6:
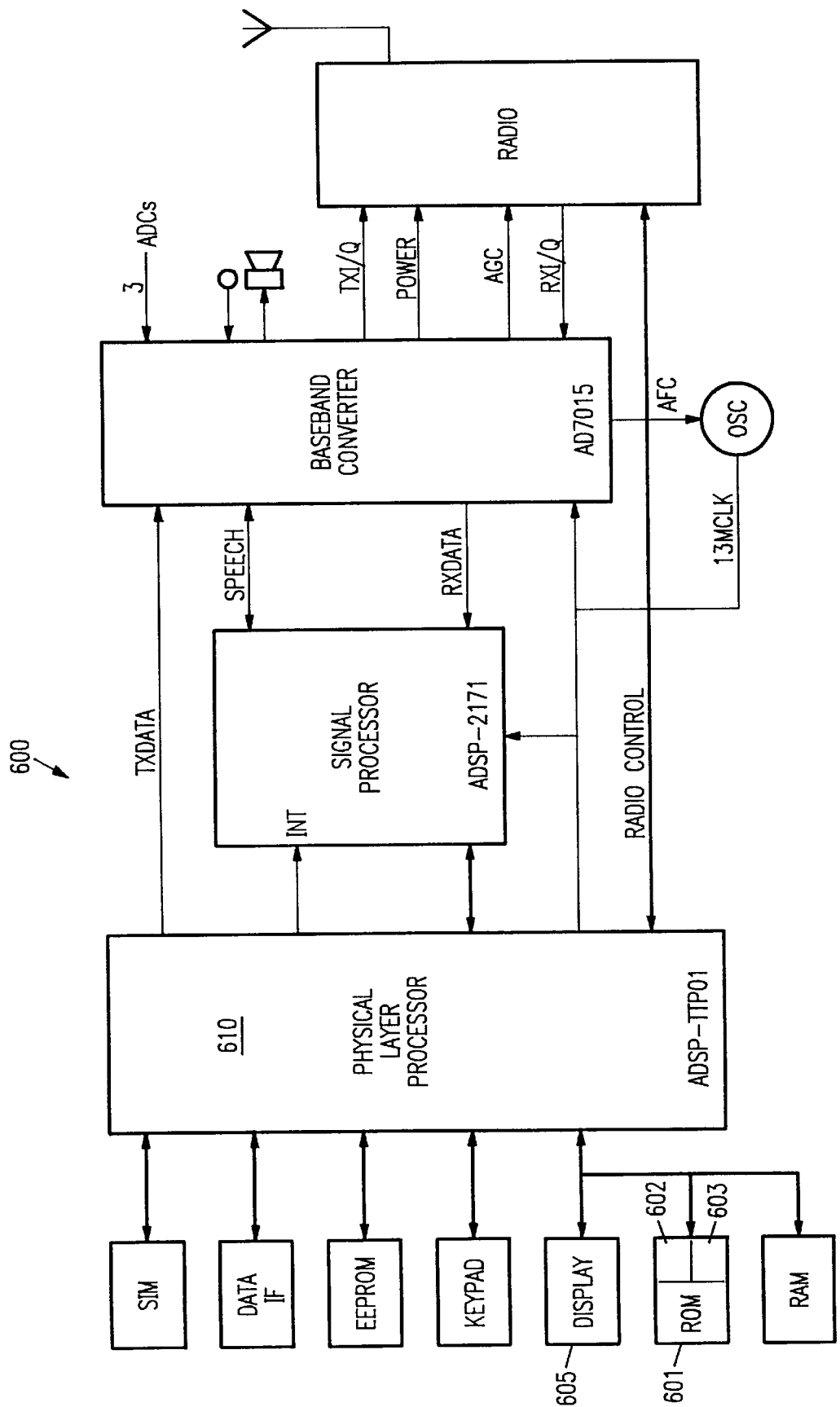
FIG. 6 is a block diagram of a mobile wireless communication device that includes the client and support modules of this invention.

FIG. 6 is a block diagram of a typical GSM digital cellular telephone. Each of the hardware components in cellular telephone 600 is known to those skilled in the art and so the hardware components are not described in detail herein. The compiled and linked processes of this invention are stored in ROM 601 as a client module 602 and support modules 603. Upon activation of a predetermined key sequence utilizing the keypad, physical layer processor 610, that is sometimes referred to herein as a microcontroller, initiates a client process using client module 602 in ROM 601.

In this embodiment, client module 602 includes a plurality of manager modules, as explained more completely below. The particular manager modules utilized is determined by the characteristics of the particular cellular telephone 100 in which client module 602 is implemented. Client module 602 must include manager modules to interface with modules that control the particular hardware in cellular telephone 100, a manager module to interface with the particular cellular telephone network protocol used by cellular telephone 100, and a manager module to interpret the card decks received. Therefore, the particular manager modules described herein are only illustrative of the principles of this invention and are not intended to limit the invention to the specific modules described more completely below.

In this embodiment, the client process controls the operations of a plurality of cellular telephone dependent support processes that are stored in ROM 601 such as a display module, a keypad module, and a network and terminal control module, that were referred to above collectively as support modules 603. The combination of the client process, display process, keypad process, and network and terminal control process are considered foreground tasks by the microkernel in cellular telephone 600. Also, herein module and process are used interchangeably, but those skilled in the art will appreciate that the module is the computer software as stored in a memory, preferably, a ROM, of cellular telephone 600 and the corresponding process is the execution of the module by the microcontroller in cellular telephone 600. Again, note that this invention does not require a separate processor and instead can utilize the processing power that already exists in cellular telephone 600, because as described above, the client process of this invention is so lightweight.

The user interface for cellular telephone 600 determines the version of the user interface manager module that is stored in ROM 601. In one embodiment, the parameters used to define the user interface level are the display resolution, the pixel access of the display, and the support of soft keys. One definition of the user interface levels is given in Table 1.

TABLE 1

| USER INTERFACE LEVEL DEFINITIONS | |
| --- | --- |
| Level 1 | Text only; 1 or more lines; 12 to 15 characters per line; and no soft keys. |
| Level 2 | Text only; 4 or more lines; 20 to 25 characters per line; and soft keys. |
| Level 3 | Pixel access; 150 by 75 pixels or larger; and soft keys. |

The user interface manager module presents data to the display module which in turn drives display screen 605; and captures data entered by the user on display screen 605. In response to this information, the client process prepares a message for transmission by a network manager module.

Figure 7:
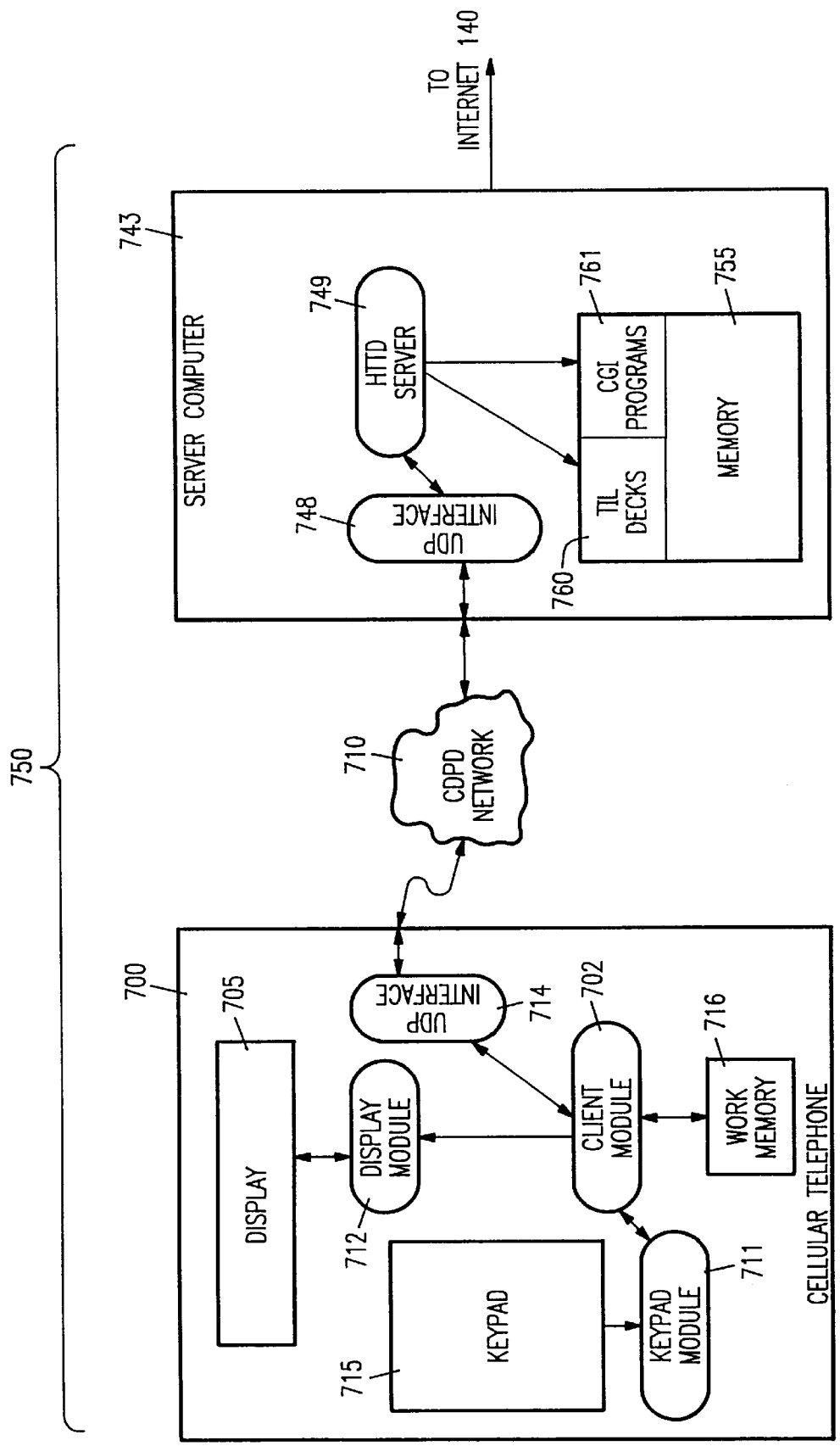
FIG. 7 is a more detailed diagram of the mobile wireless communication device and a server computer within the airnet network architecture of this invention.

To more completely explain the operations performed over airnet network 150, FIG. 7 is a block diagram that illustrates the various components in one embodiment of this invention of cellular telephone 700. Those skilled in the art will appreciate that cellular telephone 700 includes circuitry and software similar to that illustrated in cellular telephone 600 for voice and data operations supported by cellular telephone 700 in addition to the modules for operation on airnet network 750. Similarly, server computer 743 includes other software and hardware that is known to those skilled in the art and so is not illustrated in FIG. 7 for clarity.

In this embodiment, client module 702 in digital cellular telephone 700, that is executing on the microcontroller of telephone 700, communicates with server computer 743 over cellular digital packet data (CDPD) network 710. Cellular digital packet data network 710 is used to illustrate one embodiment of this invention on one two-way data communication network. The principles of this invention can be used with a wide variety of two-way data communication networks. For example other two-way data communication networks for cellular telephones that may be used include TDMA, CDMA, and GSM circuit switched data networks; and the AMPS analog cellular network with a modem. Similarly, for two-way pagers, two-way data communication networks include PACT, or other priority two-way paging networks with data transport capability.

Prior to considering the operation of this configuration of airnet network 750 in more detail, another aspect of this invention is required. Specifically, a technique is required for conveying instructions from digital cellular telephone 700 to a server application on server computer 743, and conversely.

A tele<u>p</u>hone <u>i</u>nteraction <u>d</u>escription <u>l</u>anguage (PIDL) is defined for use by service developers. A <u>t</u>rminal <u>i</u>nteraction <u>l</u>anguage (TIL) is a distillation of the telephone interaction description language and describes the same interaction to digital cellular telephone 700 as the telephone interaction description language describes to computer 743.

With the exceptions described more completely below, a process in the terminal interaction language is a compressed version of the same process written in the telephone interaction description language. The terminal interaction language allows easy parsing on the two-way data communication device, which in turn makes the client smaller than a client for the telephone interaction description language that is readable by humans, but is not optimized for parsing by a machine.

The compression from the telephone interaction description language to the terminal interaction description language is done typically at run time because some cards are computed cards and so cannot be precompiled. A wide variety of techniques can be used to convert the telephone interaction description language to terminal interaction language. The important aspect is that, if bandwidth across the cellular telephone network is limited, a compressed form of the telephone interaction description language is used.

Preferably, each data type is compressed to facilitate optimal transfer over the two-way data communication network. For example, the verbs in the telephone interaction description language are compressed using a binary tokenization. Graphics are compressed using run length limited compression and text is compressed using any one of the well-known techniques for text compression. While compression of the telephone interaction description language is not required to implement this invention, compression makes the invention more efficient by utilizing the bandwidth of the network more effectively.

Instructions in the telephone interaction description language and in the terminal interaction language are grouped into a deck and a card. Each deck includes one or more cards. A card includes the information, i.e., a set of telephone interaction description language, required to generate a screen. As indicated above, a screen can be larger than the number of lines in a display screen. Other equivalent terms for a card include a page and an atomic interaction. Thus, a card deck is simply a group of screens. The number of cards in a card deck is selected to facilitate efficient use of the resources in the two-way data communication device and in the airnet network.

For simplicity, in this embodiment, each card is a single operation. Herein, an operation is defined as a related set of actions such that the user does not encounter an unanticipated delay in moving from one action to the next, i.e, the user does not have to wait for client module 702 to retrieve another card deck from computer 743. Also, a deck may include definitions of soft keys that stay in force while the deck is active, i.e, being executed by the cellular telephone microcontroller.

Computer 743 may contain stored static telephone interaction description language decks. Computer 743 also generates telephone interaction description language decks in response to data from, or choices made by, the user of cellular telephone 700.

In the embodiment shown in FIG. 7, computer 743 converts a telephone interaction description language deck to a terminal interaction language deck, that in turn is transmitted to cellular telephone 700. The terminal interaction language is designed so that decks can be stored unaltered in memory 716 of cellular telephone 700 and referenced directly with little or no parsing. While telephone interaction description language decks on computer 743 may contain references to images, a terminal interaction language deck contains the images at the end of the deck. Thus, if a particular two-way data communication device does not support display of images, the images are easily stripped from the terminal interaction language deck before the deck is transmitted to that particular two-way data communication device.

As indicated above, each interaction with the user of cellular telephone 700 is described by a deck or a series of decks. Logically, the user retrieves a terminal interaction language deck stored in a memory 716 of cellular telephone 700 after receipt from computer 743 over CDPD network 710. The user reviews the information displayed by cards in the deck and makes choices and/or enters requested information and then requests another deck, as described above with respect to FIGS. 2A to 2H, for example.

When the user receives a deck, the first card of information is displayed on display screen 705. Typically, as shown above, the first card is text, an image, or a combination of an image and text. After the user has reviewed the first card, the user hits a NEXT key to view the next card in the deck. Similarly, a user can return to a previous card in the deck by using a PREV key. Thus, using the NEXT and PREV keys, the user can navigate back and forth through the deck. Within a card, the user uses a scroll key or keys to move the portion of the card displayed up and down. This description of a particular method used to navigate through a deck and within a card is not intended to limit the invention to this particular method. In view of this disclosure, those skilled in the art will be able to use a wide variety of ways to navigate through a deck and within a card.

Cards, in this embodiment, are one of three types, a display card, a choice card, and an entry card. Independent of the type of card, the card can contain text and images. In addition, the invention is not limited to these three particular types of cards. The definition of the three particular types of cards is used to facilitate a description of the invention and to assist the developer's in organizing applications.

A display card gives information to the user to read. The display content can include any one of, or any combination of text, an image, and a soft key. The soft key is in effect only while the display card is active.

A choice card displays a list of choices for the user. The choices are automatically presented in a format specified on the choice card. See Appendix I, which is a part of the present disclosure and is incorporated herein by reference in its entirety. As explained above, the user makes a choice by depressing the key corresponding to the choice.

An entry card is used to obtain input data from the user. An entry card displays one or more entry lines. Typically, each entry line includes a display followed by an entry line. The entry line, in this embodiment, can be for either numeric or text data.

In this embodiment, choice and entry cards prevent the user from moving to the next card until the user has entered the requested information. When the user reaches the last card in a deck and hits the NEXT key, a request for a new deck is initiated. The deck requested is determined by either the deck that the user has completed, or by the choices made by the user. Also, when the deck is completed, the choices and/or data entered by the user typically are transmitted along with the request for the new deck to computer 743.

Appendix I is one embodiment of a syntax for the telephone interaction description language and the terminal interaction language of this invention. In one embodiment, the telephone interaction description language is described using a subset of the standard generalized markup language. Only a subset of the standard generalized markup language is utilized so that telephone interaction description language parsers also can be written easily using simple tools like lex and yacc.

Returning to operation over airnet network 750, cellular telephone 700 includes a display module 712, a keyboard module 711, a client module 702, and a UDP interface module 714. In this embodiment, module 702 is stored in a non-volatile memory (not shown) of telephone 700 and is executed by the microcontroller (not shown) in telephone 700. Modules 711, 712, and 714 operate under the control of client module 702.

Client module 702 includes instructions that direct the microcontroller in cellular telephone 700 to perform the operations described more completely below with respect to FIGS. 8A to 8D. The operations include sending uniform resource locator (URL) requests to HyperText Transfer Protocol (HTTP) server 749, parsing and displaying a TIL deck or decks returned by HTTP server 749, and generating new URLs based on the user's key presses. For a description of HTTP server software and platforms that can run the HTTP server software, see, for example, Ian S. Graham, *The HTML Sourcebook,* John Wiley & Sons, Inc., New York, Chapt. 8, (1995), which is incorporated herein by reference.

User datagram protocol (UDP) interface module 714 couples CDPD network 710 to client module 702, and allows client module 702 to communicate using UDP over CDPD network 710. The user datagram protocol is well known to those skilled in the art and is documented extensively. UDP interface module 714 supports transmission of simple stand-alone messages between the connection partners.

Display module 712 is a display driver that couples client module 702 to display screen 705 and so allows client module 702 to specify the information presented on display screen 705. The user interface manager module within client module 702 converts the display information in a card to instructions for display module 704 which in turn provides signals that drive the hardware that controls the operation of display screen 705. For example, if the TIL deck includes an image, the user interface manager module determines whether the active card calls for display of the image. If the active card directs the user interface manager module to display the image, the user interface manager module passes the image in memory 716 to display module 712, which in turn displays the image on display screen 705.

Keyboard module 705 couples keypad 715 to client module 702, and stores data representing keys pressed by the user on physical keypad 715 in memory 716. Keyboard module 705 notifies client module 702 when the user has pressed a key.

When client module 702 is notified of a key press, the user interface manager module within client module 702 passes information about the key press to display module 712 that in turn displays the appropriate character on display screen 705, if an entry card is active. If the user interface manager module determines that a choice card is active, and the key press corresponds to one of the choices, the user interface manager module sends instructions to display module 712 that result in the choice being identified for the user, e.g., highlighted as described above.

In addition to HTTP server 749, host computer 743 includes a UDP interface module 748, CGI programs 761 stored in a memory 755 of host computer 743, and TIL decks 760 stored in memory 755.

HTTP server 749 uses UDP interface module 748 to send data to and receive data from CDPD network 710. TIL decks 760 are TIL decks that can be accessed by HTTP server 749. Static files containing PIDL decks are converted to TIL decks only once on HTTP server 749. CGI programs 761 are common gateway interface programs that produce PIDL decks that are used by HTTP server 749 to produce TIL decks that in turn are transmitted via UDP interface modules 748 and 714 and cellular telephone network 710 to client module 702. In this embodiment, the services available over airnet network 750 are applications accessible by HTTP server 749 on Internet 140 for which a service developer has written a PIDL deck, or a CGI script that in turn generates a PIDL deck, and is stored on computer 743.

The architecture in FIG. 7 demonstrates some important aspects of this invention. First, the applications, the PIDL decks and CGI scripts in this embodiment, are independent of the particular two-way data communication network. For HTTP server 749 to communicate over a different two-way data communication network that does not support UDP, only UDP interface module 748 must be changed. The applications are unaffected by such a change.

Second, the applications on HTTP server 749 are independent of the two-way data communication device with which HTTP server 749 is interacting. An application on HTTP server 749 can communicate with any two-way data communication device that includes the appropriate client and a module to transmit and receive data over the two-way data communication network. These two facts mean that an investment in developing an application is insulated from either advances in two-way data communication devices, or advances in two-way data communication network technology.

FIGS. 8A to 8D are a process flow diagram for one embodiment of this invention. Initially, when the user initiates communication over airnet network 750, client module 702 initializes a work space in memory 716 of cellular telephone 700 and then, in get home URL process 801, stores a URL in the work space. According to the principles of this invention, in one embodiment, each cellular telephone that utilizes the airnet network has a home URL stored in a non-volatile memory that is used to retrieve a home card deck for the cellular telephone. In another embodiment, the cellular telephone obtains the home URL from server 749. Thus, in get home URL process 801, client module 702 obtains the home URL. Herein, a URL is an example of a specific embodiment of a resource locator.

For example, in get home URL process 801, client module 702 obtains a home URL, such as http://www.libris.com/airnet/home.cgi and stores the home URL in the work space. The portion of the home URL, http:/www.libris.com, identifies a particular HTTP server, i.e, server 749, on the world-wide web. The portion of the URL, /airnet/home.cgi, specifies a particular common gateway interface program within CGI programs 761. The use of a URL pointing to a server on the world-wide web is illustrative only is not intended to limit the invention to applications on the world-wide web. In general, cellular telephone 700 obtains an identifier, i.e, a resource locator, of a home application on a home server that is executed by the server when the cellular telephone initially becomes active on airnet network 750, and stores the resource locator in the work space.

Next in create HTTP request process 802, client module 702 converts the URL in the work space to a HTTP request. For example, for the above URL, create HTTP request process 802 generates a method field, such as

---

GET /airnet/home.cgi HTTP/1.0

---

The GET method is part of HTTP. Thus, the format for the GET method is known to those skilled in the art. Also, this particular form of the method is used because a specific server connection is established by cellular telephone 700 and so identification of the server is unnecessary. Nevertheless, briefly, this command instructs server 749 to execute application home.cgi and execution of application home.cgi in turn results in generation of a home deck and a subsequent transmission of the home deck to cellular telephone 700. HTTP/1.0 specifies the HTTP version used by client module 702 in cellular telephone 700.

In addition to the method field, client module 702 in process 802 could also generate appropriate HTTP request fields to pass information to server 749 about the capabilities of client module 702. The request fields can include information such as lists of the MIME content-types acceptable to the client; lists of data encoding types acceptable to the client; user authentication and encryption scheme information for the server; the length in bytes of the message being sent to the server; and the Internet mail address of the user accessing the server. This list of information is illustrative only and is not intended to limit the invention to the particular request fields described herein. Any request field defined by HTTP can be utilized by client module 702. However, in this embodiment, the defaults are utilized and so no HTTP request fields are generated.

Typical HTTP methods that can be generated in HTTP request process 802 are a GET method for requesting either a TIL deck from server 749, or execution of a common gateway interface program on server 749; and a GET method request to a common gateway interface program with data, e.g., a query string appended to the URL. In either case, a URL is transmitted to server 749 within the particular message. After create HTTP request process 802 is complete, client process transfers to transmit request process 804.

However, if the transmission control protocol is used instead of UDP, client module 702 would access a TCP module in establish server connection process 803 that replaced UDP module 714. Since, in this embodiment, UDP is used, establish connection process 803 is enclosed by a dashed line in FIG. 8A to indicate that this process is unnecessary when using UDP.

In establish server connection process 803, a virtual connection would be made over CDPD network 710 between TCP interface module 714 and a TCP interface module in HTTP server 749 SO that data could be transmitted between cellular telephone 700 and computer 743 using TCP, e.g., buffers to support data exchange are defined. The establishment of a TCP connection is well-known and so is not described further.

Figure 8A:
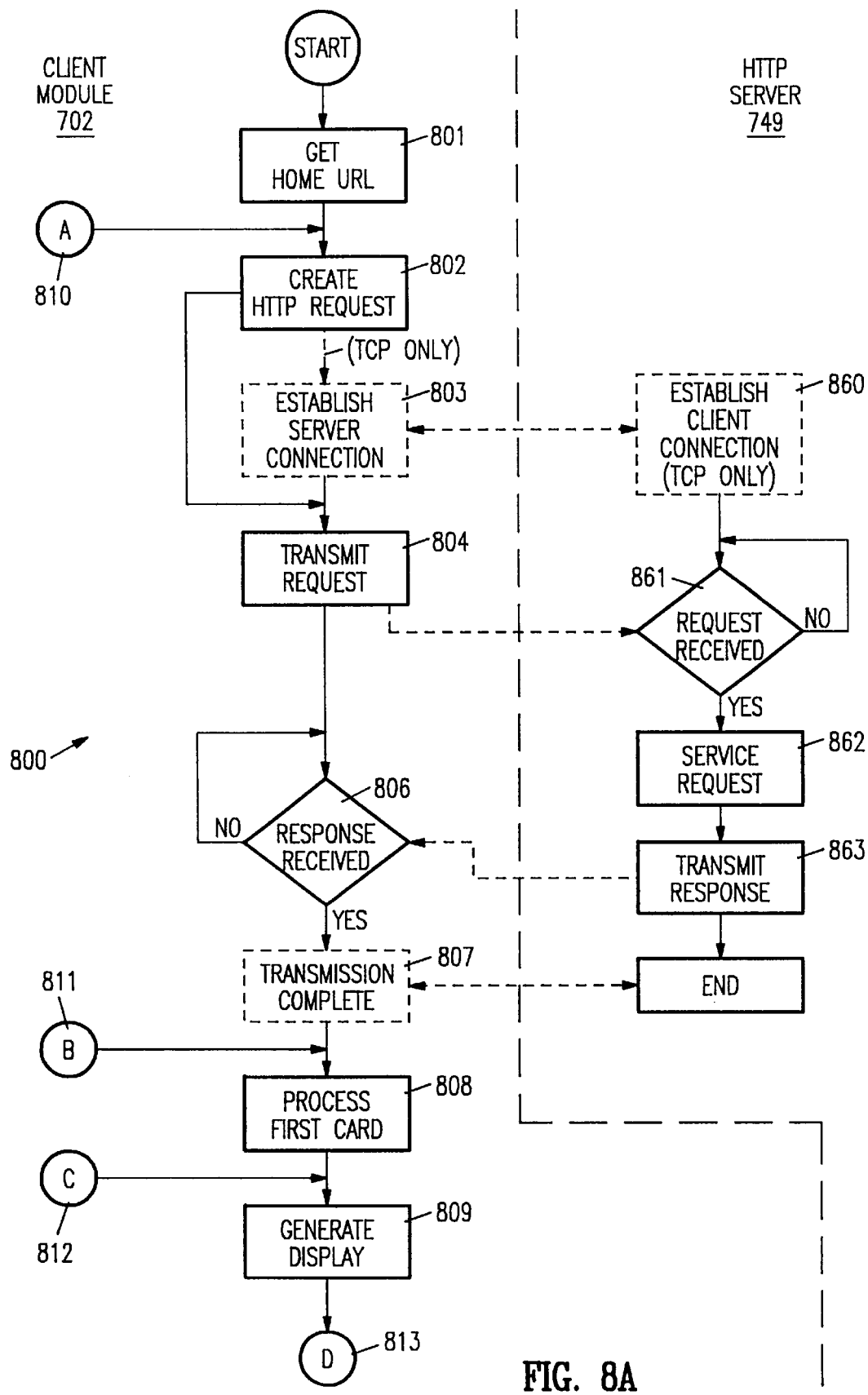
FIGS. 8A to 8D are a process flow diagram showing the process performed by the client in the mobile wireless communication device and the server on the server computer of FIG. 7.

In FIG. 8A, a dashed line connects establish server connection process 803 with establish client connection process 860, that is also dashed, that is performed by HTTP server 749. This indicates that both client module 702 and server 749 are required to complete process 803.

When the TCP virtual connection is established, client module 702 transfers processing from establish server connection process 803 to transmit request process 804. Similarly, server 749 transfers to request received check 861, in which server 749 waits until a request is received. Establish client connection process 860 is not needed for UDP and so HTTP server 749 initiates processing in request received check process 861. Process 860 is enclosed within a dashed line box to indicate that the process is used only for TCP.

In transmit request process 804, the HTTP request is sent from the work area in telephone 700 to HTTP server 749. Again, a dashed line connects process 804 of client module 702 to request received check 861 that is performed by HTTP server 749 to indicate that the check is dependent upon information from client module 702. When the transmission of the request is complete, client module 702 transfers to response received check 806.

Upon receipt and storage of the HTTP request, request received check 861 transfers to service request process 862 in which HTTP server 749 initiates service of the received request. In service request process 862, if the HTTP request only seeks transfer of a static deck, HTTP server 749 retrieves the requested static deck from TIL decks 760. Conversely, if the request requires server 749 to obtain data from the Internet or to append data to a particular file, server 749 launches the common gateway interface application addressed in the request, and passes the data in the HTTP request to this application for further processing.

For example, if the user of cellular telephone 700 requested a fax as in FIG. 2F, the HTTP request identifies a common gateway interface application in CGI programs 761 that accepts as input data the telephone number and grabs the information to be faxed. The CGI application generates an e-mail transmission to the fax gateway. Similarly, for a stock quote, server 749, in response to the HTTP request, launches a common gateway interface application that sends out a stock query over Internet 140 to a stock quote service provider using the ticker tape symbol passed as input data by server 749 to the common gateway interface application. When the response to the stock query is received, the common gateway interface application builds a PIDL deck that includes the data in the response to the stock query.

Upon completion of servicing the request, HTTP server 749 converts the PIDL deck to a TIL deck and returns the TIL deck to client module 702 using UDP in transfer response process 863, that is connected by a dotted line to response received check 806 in client module 702. As the TIL deck is transferred, client module 702 stores the deck in memory 716.

After the TIL deck is transferred, HTTP server 749 closes the process for responding to the message from cellular telephone 700. All the information needed by client module 702 to generate a user interface on display screen 705 and for responding to any selection or data entry presented in the user interface is included in the TIL deck. Consequently, client module 702 only has to interpret the TIL deck and interpret the user input to transmit the next message to HTTP server 749. The state for the HTTP server is defined in the next message. Consequently, HTTP server 749 is stateless because HTTP server 749 does not retain state information concerning a response to a message after the message is transmitted.

However, in another embodiment (not shown), a server could retain state information concerning each interaction with a client module. For example, if the server transmitted a choice card to the client module, the server would retain state information indicating that a choice was pending from the client module. In this embodiment, when the user makes a choice, e.g., depresses key two to indicate choice two, the choice is transmitted to the server which in turn accesses the URL associated with choice two. If this URL addresses another application, the server executes that application. Thus, in this embodiment, the server retains state information concerning each interaction with a client module. In view of this disclosure, those skilled in the art can implement the principles of this invention utilizing a server that retains state information when such a client/server combination is advantageous.

Returning to the present embodiment, when the TIL deck is received, client module 702 leaves response received check process 806 and transfers to process first card 808. However, if TCP is used instead of UDP, client module 702 upon leaving check 806 would close the virtual TCP connection in transmission completed process 807. Upon closing the virtual TCP connection, processing would transfer to process first card 808. Again, transmission complete process 807 is enclosed within a dashed line box to indicate that process 807 is used only with TCP.

In process first card 808, client module 702 parses the TIL deck and interprets the first card. Processing transfers from process first card 808 to generate display process 809.

In generate display process 809, client module 702 passes the data to be displayed in the first card to display module 712. Display module 712, in response to the data, drives the text and images in the data on display screen 705. Generate display process 809 transfers processing to key press check 820 through node 813. In FIGS. 8A to 8D, any circular node with the same alphanumeric character and reference numeral is the same node. The circular nodes are used to establish connections between the various processes in the method of FIGS. 8A to 8D without cluttering the figures with a number of connection lines.

Client module 702 waits in key press check 820 for the user to press a key on keypad 715 of cellular telephone 700. In this embodiment, cellular telephone 700 is assumed to have the capability to support two soft keys, a scroll-up key, a scroll-down key, a previous key, a next key, and keys zero to 9 that are configured in the standard telephone keypad configuration. In view of the following disclosure, if one or more of these keys are not present, one of skill in the art can alter the method for the particular configuration of the cellular telephone keypad, or other two-way data communication device keypad. For example, if the cellular telephone included a home key, the key press processing described more completely below would include a check that detected when the home key was pressed and would in turn transfer to get home URL process 801.

Figure 8B:
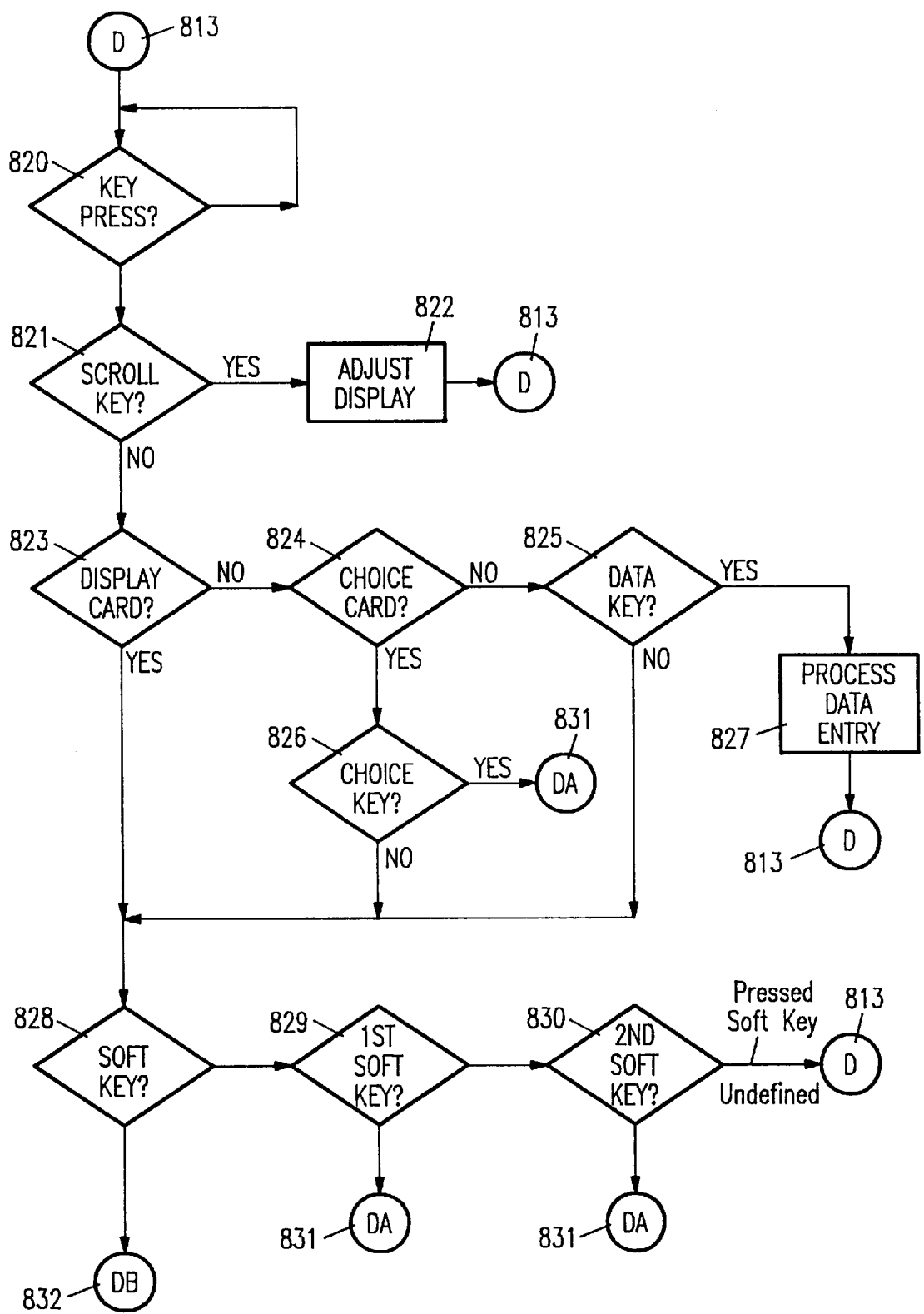
Figure 8C:
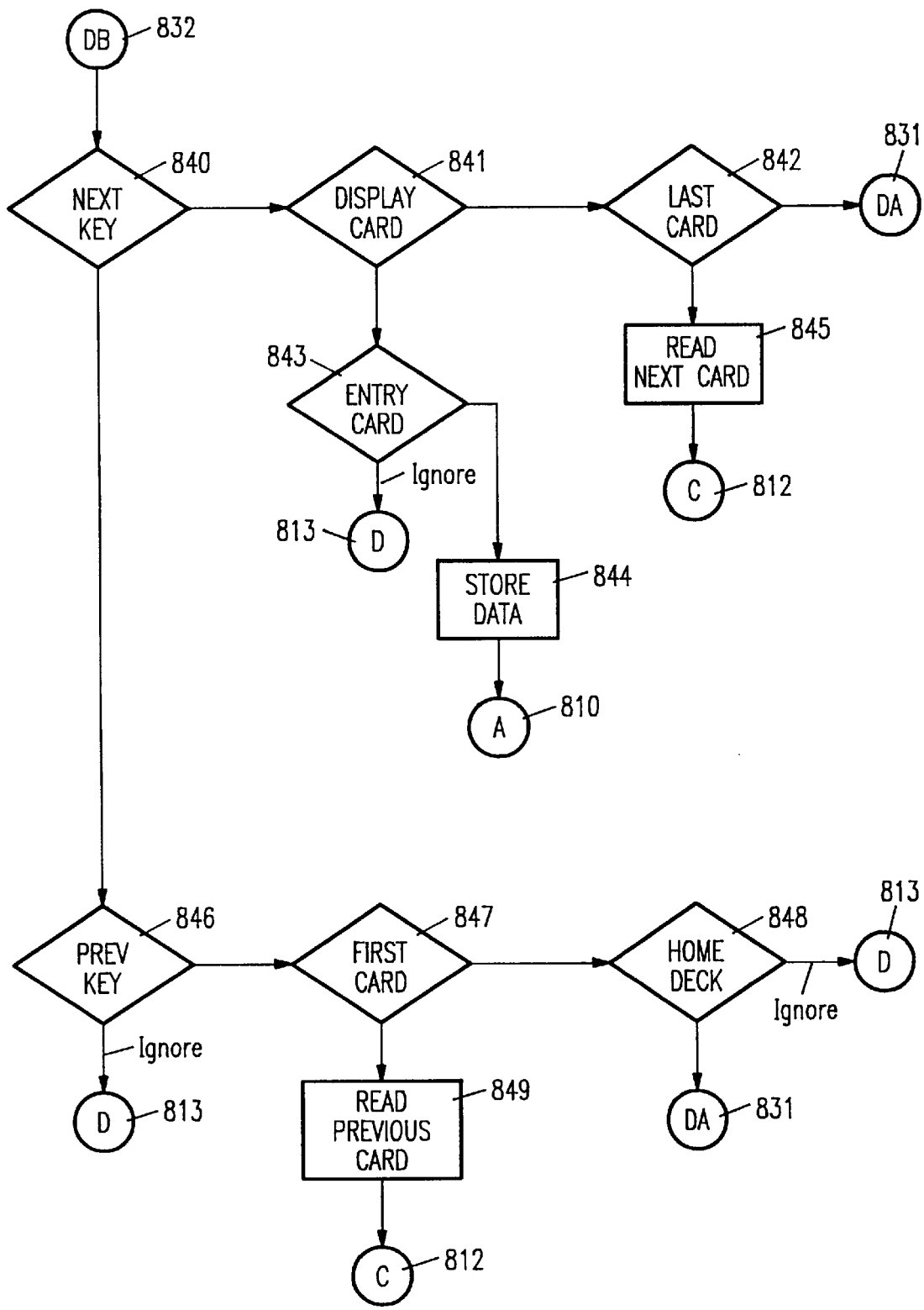

Briefly, the processes in FIGS. 8B to 8C, identify the key pressed by the user, identify the action required, and then transfer to a process that implements the action required. Specifically, when a key on the keypad is pressed, keypad module 711 stores an identifier for the key in work memory 716 and notifies client module 702 of the key press. Upon receipt of the notification from keypad module 711, client module 702 reads the storage location in work memory 716 to determine the key pressed and transfers processing from key press check 820 to scroll key check 821.

In scroll key check 821, client module 702 determines whether the user pressed either of the scroll keys. If a scroll key was pressed, processing transfers to adjust display process 822 and otherwise to display card check 823.

In adjust display process 822, client module 702 determines which of the scroll-up or scroll-down keys was pressed. Client module 702 then sends information to display module 712 so that the current display is either scrolled-up one line or scrolled-down one line. If the scroll key would move the display beyond a boundary of the current card, the scroll key press is ignored in adjust display process 822.

In response to the information from client module 702, display module 712 adjusts the screen display on display screen 705. Client module 702 transfers processing from adjust display process 822 to key press check 820 through node 813.

If a scroll key was not pressed, processing is passed through scroll key check 821 to display card check 823. Client module 702 takes action that depends on the particular type of card that is currently being displayed on display screen 705. If the current card is a display card, client module 702 passes through display card check 823 to soft key check 828, and otherwise transfers to choice card check 824.

Assuming for the moment that the current card is not a display card, choice card check 824 determines whether the current card is a choice card. If the current card is a choice card, client module 702 passes through choice card check 824 to choice key check 826, and otherwise transfers to data key check 826.

Assuming for the moment that the current card is neither a display card nor a choice card, the current card must be an entry card, because in this embodiment only three card types are defined. Thus, client module 702 does not check for an entry card. Rather, data key check 826 determines whether a valid data key was pressed. In this embodiment, the data keys are keys zero to nine on the key pad, and the # key. In other embodiments, other combinations of keys could be defined as data keys. If the pressed key was one of the data keys, data key check 826 transfers to process data entry 827 and otherwise transfers to soft key check 828.

In process data entry 827, client module 702 knows whether the predictive text entry process is turned-on, because one of the parameters on the entry card specifies whether to use the predictive text entry process, as described in Appendix I, which is incorporated herein by reference in its entirety.

If the predictive text entry process is not turned-on, client module 702 in process data entry 827 enters the pressed key value in a text entry buffer in work memory 716 at the appropriate location. Also, client module 702 sends information to display module 712 so the value of the pressed key is displayed in the appropriate location on display screen 705 by display module 712.

If the predictive text entry process is turned-on, client module 702 uses the novel predictive text entry process in process data entry 827, as described more completely below with respect to FIGS. 9, 10A to 10T, and 11, to determine the letter to select from the set of letters associated with the pressed key. After the predictive text entry process determines the appropriate letter, a value representing the letter is stored at the appropriate location in the text buffer in work memory 716. Also, client module 702 sends information to display module 712 so that the letter is displayed in the appropriate location on display screen 705. Upon completion of process data entry 827, client module 702 transfers processing through node 813 to key press check 820.

The previous description assumed that the current card was an entry card, but if the current card is a choice card, choice card check 824 transferred to choice key check 826. In generate display process 804 for the choice card, each of the choices are labeled according to information on the choice card and some or all of the choices are displayed on display screen 705. Thus, choice key check 826 determines whether the pressed key corresponds to one of the choices. If the pressed key is one of the choices, client module 702, in one embodiment, sends information to display module 712 to indicate the selected choice. Client module 702 also transfers from choice key check 826 through node 831 to store identifier process 850 (FIG. 8D), that is described more completely below. Conversely, if the pressed key is not one of the choices, choice key check 826 transfers to soft key check 828.

Soft keys can be specified both for a deck as a whole and per card, i.e., a physical key on the keypad is specified as a soft key as described more completely in Appendix I. Each soft key specification includes an identifier that defines the action to be taken when the soft key is pressed.

When a soft key is specified for a deck, the soft key remains in effect for the entire deck. However, when a soft key is specified for a card, the card soft key specification temporarily overrides the corresponding deck soft key specification, i.e., the deck soft key specification for the same physical key as the card soft key specification, while the card is visible, i.e., displayed on display screen 705. This override is done independently for the two soft keys. Thus, soft key check 828 transfers processing to first soft key check 829 if the key pressed is one of the two possible physical soft keys. Conversely, soft key check 828 transfers processing to next key check 840 (FIG. 8C), if neither of the two possible physical soft keys is pressed by the user.

In first soft key check 829, client module 702 determines whether the pressed key corresponds to the first soft key. If the pressed key is the first soft key, check 829 passes the active identifier for the first soft key to store identifier process 850 through node 831. Conversely, if the pressed key is not the first soft key, processing transfers from check 829 to second soft key check 830.

If the pressed key is the second soft key, check 830 passes the active identifier for the second soft key to store identifier process 850 through node 831. Conversely, if the pressed key is not the second soft key, e.g., a physical key that can be defined as a soft key was pressed but neither the current deck nor the current card defines a soft key for that physical key, processing transfers from check 830 to key press check 820 through node 813.

When processing transfers to next key check 840, client module 702 determines whether the pressed key was the next key. If the next key was pressed, processing transfers to display card check 841 and otherwise to previous key check 846.

If a display card is the current card, the next key is used to move to another card in a deck, or alternatively to another deck. Thus, display card check 841 transfers processing to last card check 842 when a display card is the current card, and otherwise to entry card check 843.

Last card check 842 determines whether the current card is the last card in the deck. If the current display card is not the last card in the deck, last card check 842 transfers processing to read next card process 845, which in turn reads the next card in the deck and transfers through node 812 to generate display process 809.

If the current display card is the last card in the deck, the deck includes an identifier that specifies the location to transfer to from the last card. This identifier can be a URL to another deck, to a common gateway interface program, or an address for a card within the current deck, for example. Thus, last card check 842 transfers through node 831 to store identifier process 850 when the current display card is the last card in the deck.

If the current card is not a display card but is an entry card, display card check 841 transfers to entry card check 843. In this embodiment, the next key is the predetermined key used to indicate that all the data for an entry on an entry card has been entered. Thus, if the current card is an entry card, entry card check 843 transfers processing to store data process 844.

Store data process 844 stores the data entered in at an appropriate location in memory that is specified in the current entry card. Typically, the data is combined as an argument with a URL and stored. Upon completion, store data process 844 transfers through node 810 to create HTTP request process 802 (FIG. 8A).

When the next key is pressed, if the current card is neither a display card nor an entry card, the current card is a choice card. However, as indicated above, in this embodiment client module 702 requires that the user make a choice and does not allow use of the next key. Consequently, if the current card is not an entry card, entry card check 843 transfers processing through node 813 to key press check 820.

The previous discussion assumed that the next key was pressed and so next key check 840 transferred processing to display card check 841. However, if the next key was not pressed, next key check 840 transfers processing to previous key check 846. If the previous key was pressed, check 846 transfers to first card check 847 and otherwise returns processing to key press check 820.

First card check 847 determines whether the current card is the first card of a deck. If the current card is not the first card, processing transfers from first card check 847 to read previous card 849, which in turn reads the previous card and transfers to generate display process 809 through node 813. Conversely, if the current card is the first card, processing transfers to home deck check 848.

If the current card is the first card in the home deck, there is not a previous card and so home deck check transfers processing to key press check 820 through node 813 and so the previous key press is ignored. If the current deck is not the home deck, home deck check 848 retrieves the identifier for the previous deck and transfers through node 831 to store identifier process 850.

Store identifier process 850 is reached through node 831 from several different points. The operations in store identifier process 850 are the same irrespective of the particular process that transfers to process 850. In each instance, an identifier is passed to store identifier process 850 and process 850 saves the identifier in working memory 716. The identifier can be, for example, a pointer to another location in the current card, an address of another card in the current deck, a URL to a deck stored in working memory 716, a URL to a TIL deck in TIL decks 760 on computer 743, or perhaps, a URL to a common gateway interface program in CGI programs 761 on computer 743. Thus, process 800 checks the stored identifier to determine the action required.

Specifically, in identifier to current deck check 851, client module 702 determines whether the identifier is to a card in the current deck. If the identifier points to the current deck, check 851 transfers processing to retrieve data process 852 and otherwise to URL to local deck check 853.

In retrieve data process 852, client module 702 retrieves the information stored at the location indicated by the identifier from working memory 716 and processes the information. Retrieve data process 852 transfers through node 812 to generate display 809 (FIG. 8A) that was described above.

URL to local deck check 853 determines whether the identifier is a URL to a deck that is stored in working memory 716, e.g., cached. If the deck is stored locally, check 853 transfers to retrieve local deck 854 which in turn moves the local deck into the storage location for the current deck. Retrieve local deck 854 transfers processing through node 811 to process first card 808 (FIG. 8A), that was described above.

If the identifier is neither to a location in the current deck, nor to a local deck, the identifier is a URL to an object on computer 743. Thus, in this case, check 853 returns processing to create HTTP request 802 through node 810. through node 810.

Process 800 continues so long as the user continues to enter and process the information provided. In this embodiment, process 800 is terminated, for example, either by the user powering-off cellular telephone 700, selecting a choice or entry card that discontinues operations of client module 702, or remaining inactive for a time longer than a time-out period so that client module 702 shuts itself down.

To further illustrate the operations in process 800, consider the following example which is returned to client module 702 as a TIL deck in response to a HTTP request generated by process 802. For readability, Table 2 presents the deck in PIDL. In this example, all of the choices are for applications on the same server. However, in another embodiment, each URL could address any desired combination of servers.

TABLE 2

EXAMPLE OF PIDL CHOICE DECK

<PIDL>
<CHOICE>
<CE URL = http://www.libris.com/airnet/nnn>News
<CE URL = http://www.libris.com/airnet/www>Weather
<CE URL = http://www.libris.com/airnet/sss>Sports
</CHOICE>
</PIDL>

In process first card 808, client module 702 interprets the information in Table 2 and transfers to generate display process 809. In generate display process 809, client module 702 sends information to display module 712 so that the user is presented with a list of three choices on display screen 705, i.e, a user interface for the choice card is generated:
 1. News
 2. Weather
 3. Sports Generate display process 809 (FIG. 8A) transfers to key press check 820 (FIG. 8B). When the user presses the two key on keypad 715, key press check 820 transfers through check 821 to display card check 823.

Figure 8D:
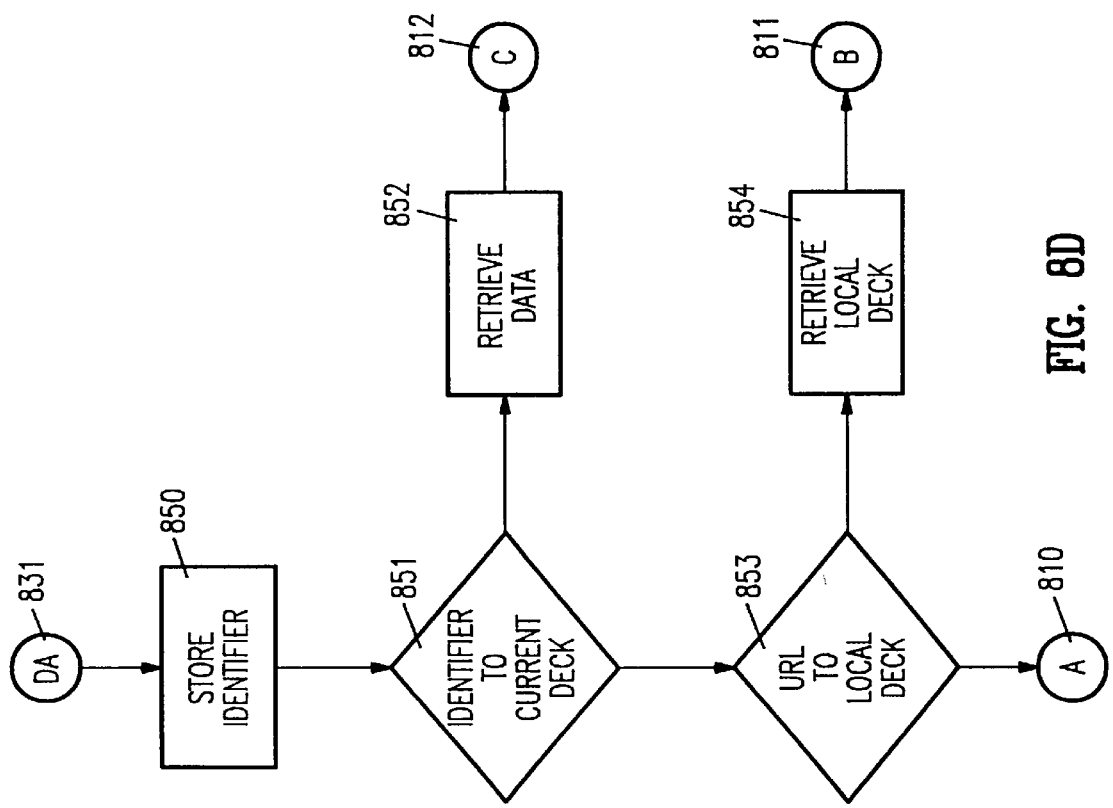
Figure 11:
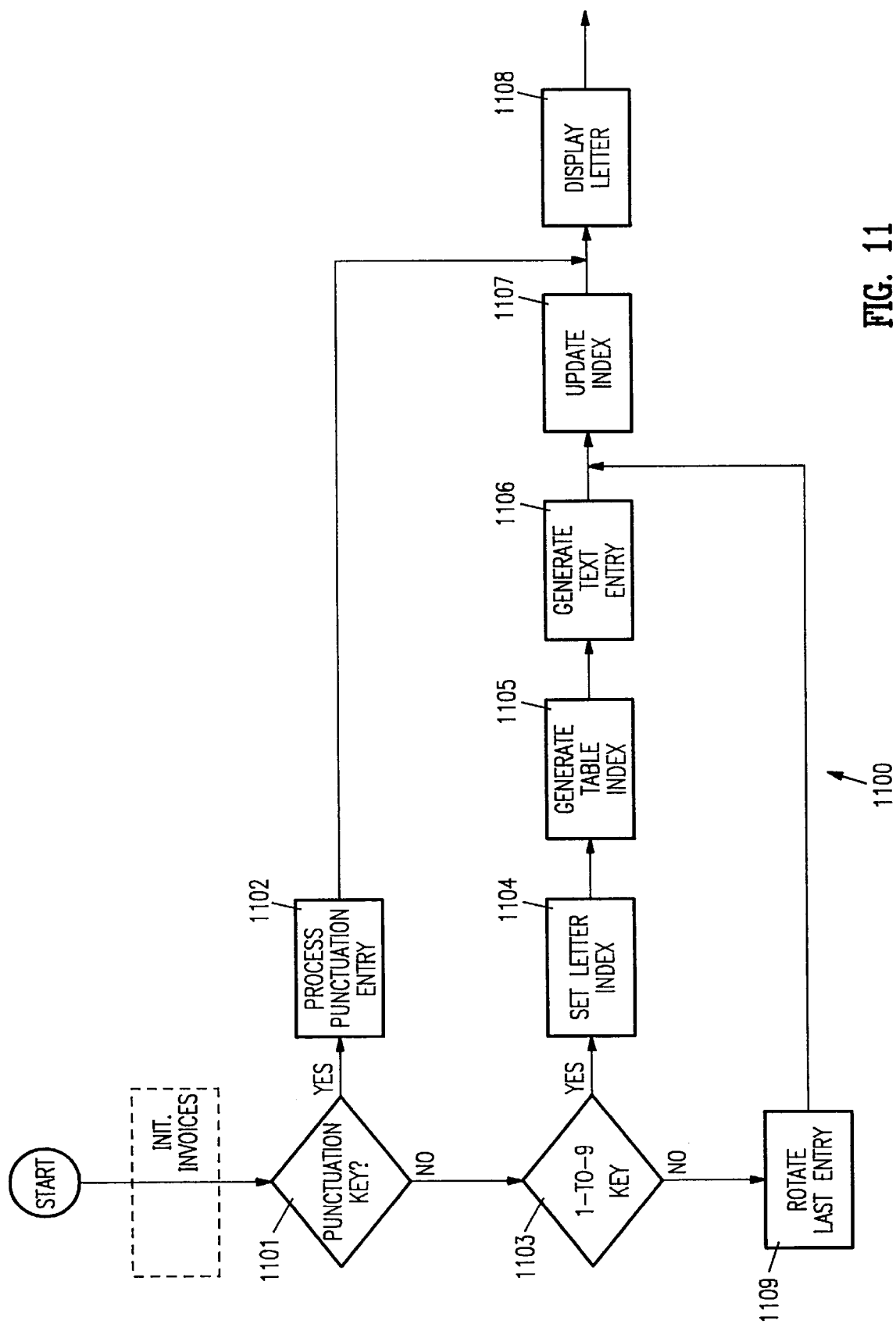
FIG. 11 is a process flow diagram for one embodiment of a data entry process that includes the novel predictive data entry process of this invention.

Since the current card is a choice card, check 823 transfers processing to choice card check 824, which in turn transfers to choice key check 826. Since the two key was pressed and that key is a choice key, check 826 transfers processing to store identifier process 850 (FIG. 8D). In process 850, client module 702 stores the URL corresponding to two, i.e, URL=http://www.libris.com/airnet/www in working memory 716.

Since this URL is to an object on computer 743, processing transfers through checks 851 and 853 to create HTTP request process 802, which in turn generates the request. When the HTTP request is transmitted to server 749, as described above with respect to process 804, server 749 in service request process 862 retrieves deck www from TIL decks 760. An example of the deck is given in Table 3. Again for readability, the deck in present herein in PIDL.

TABLE 3

EXAMPLE OF A SECOND PIDL CHOICE DECK

<PIDL>
<CHOICE>
<CE URL = http://www.libris.com/airnet/www-1>World
<CE URL = http://www.libris.com/airnet
             /www-2>National
<CE URL = http://www.libris.com/airnet/www-3>State
<CE URL = http://www.libris.com/airnet/www-4>Local
</CHOICE>
</PIDL>

The deck in Table 3 is transmitted to cellular telephone 700 and stored in memory 716, as described above with respect to process 806. The choice card is processed in process 808 and displayed in process 809. As a result of process 809, the user is presented with a list of choices:
 1. World
 2. National
 3. State
 4. Local.

When the user makes another selection, the same sequence of processes as described above for the first choice card is executed by client module 702, and another URL is stored that points to a program on server 749 that retrieves the desired weather information and generates a deck with that information. This deck is transferred to cellular telephone 700 and displayed.

As described above, if the current card is an entry card and a key is pressed, client process 702 reaches data key press check 826 (FIG. 8B). If the pressed key is a valid data key, check 826 transfers to process data entry 827.

In one embodiment, process data entry 827 uses a novel predictive text entry process for text entry. Recall that on a typical telephone keypad, the keys are labeled with both a number and two or three letters. For example, the two key is also labeled abc. This leads to some ambiguity when using the telephone keypad to enter text. Is the user attempting to enter an a, b, or c when the two key is pressed?

In one prior art method, two keystrokes were required to enter each letter of text. The first keystroke identified the first key and the second key stroke identified the specific letter desired on the first key. For example, to enter the letter s, the user would first press the seven key that is labeled with letters p, r, and s. Next, the user would press the three key to select the letter s. While this method may work well for short sequences that consist of only three or four letters, the method does not work well for English text. For example, if the user has already entered th and then presses the three key that is labeled with letters d, e, and f, almost always the desired next letter is the letter e. Therefore, making the user press the two key is an extra and unnecessary step.

Client module 702 of this invention utilizes a novel predictive text entry process to reduce the number of key strokes required to enter text using a telephone keypad, or any similar keypad. Using this process, in most cases a single key stroke suffices to enter a single letter.

While this embodiment of the invention is described in terms of a telephone keypad, the principles of the invention are not limited to only a telephone keypad. In general, the process described more completely below, can be extended to any keypad where a single key is used to enter two or more letters. Further, the process is not limited to only letters, but rather is applicable to any keypad where a single key is used to represent two or more characters. In view of the following disclosure, those skilled in the art can use the principles of the predictive text entry process in a wide variety of applications.

The system for predictive text entry includes a predictive text entry module 901 that in this embodiment is included in client module 702, keyboard module 711, and a letter frequency table 902 that is loaded into memory 716, when client module 702 is activated. Predictive text entry module 901 is used in process data entry 827 when specified by the current entry card. Predictive text entry module 901 performs routine buffer management processes, that are known to one of skill in the art and so are not described further to avoid detracting from the process.

Predictive text entry module 901 stores a letter entry for each letter entered in a text buffer 903 in memory 716. In this embodiment, letters Q and Z are assigned to the one key and the zero key is used to enter a space, period, and comma, i.e., the zero key provides punctuation. However, these assignments are illustrative only, and are not intended to limit the invention to this particular embodiment.

The first letter entered is placed at the left end of the buffer and each additional letter is placed in the left most unused space in buffer 903. Thus, the last letter entered in text buffer 903 is the right most character. Letter frequency table 902, sometimes referred to as a table of predictive letter entries, is a look-up table where each entry in the look-table is addressed by three indices. The first two indices represent the two most recently entered letters in text buffer 903 and the third index represents the key that was pressed. Each predictive letter entry stored in letter frequency table 902 defines which of the letters associated with the pressed key to use given the previous two letters. For example, since the is a commonly occurring string, the entry in table 902 addressed by (t, h, 3) returns e, or more concisely that the predictive letter entry 2 is returned to indicate that the second letter of the group of letters d, e, and f associated with the three key is the predicted letter. Of course, letter frequency table 902 could be altered to return more than a single letter.

In this embodiment, letter frequency table 902 was empirically generated using a collection of e-mail. Appendix II is a computer program listing that was used to generate letter frequency table 902 that is illustrated in FIGS. 10A to 10T. Briefly, the computer program implements a process that sequentially steps through the data provided and (i) for each possible single letter determines the most likely letter that follows for each key on the keypad; and (ii) for each possible combination of two letters determines the most likely letter that follows for each key on the keypad. In this embodiment, the most likely letter is the letter having the greatest frequency after the single letter. Similarly, the most likely letter is the letter having the greatest frequency after the combination of two letters. If there is a tie in the frequency, the first letter associated with a key is selected. Of course, other measures of likelihood could be used to generate the entries in table 902.

Thus, in FIGS. 10A to 10T, the first of the ten columns, i.e., the left most column, is the two letter sequence and the first row, i.e., the top row is the keys on the key pad used to enter text. A combination of an entry in the first column and a key in the top row is used to select the predicted text entry. Thus, using the example of th, this two key sequence appears in the first column of FIG. 10O. When the three key is pressed, the letter in the row with th as the first entry and in the column with three as the first entry, i.e., e, is retrieved. Alternatively, if the four key is pressed, letter i is retrieved from the table.

In this embodiment, table 902 is a buffer of two bit numbers. Each two bit number has a value in the range of zero to three, and the two bit number represents a predicted letter for the pressed key. Thus, for a two key labeled with letters A, B and C, a zero represents A; a one represents B; and a two represents C. In general, the number of bits used is determined by the key that represents the maximum number of characters. In this embodiment, the maximum number of characters represented by a key is three. The number of storage bits required is an integer S where S is the smallest number such that 2**S is greater than or equal to the maximum number of characters represented by a key.

In this embodiment, three indices i0, i1, and i2 are used generate a table index that in turn is used to access a particular predictive letter entry in table 902 of two bit numbers. Each letter is represented as a number, i.e., a letter entry, with letter A being zero, letter B being a one, letter C being a two, and so forth with letter Z being twenty-five. A space element is assigned a space element value of twenty-six. Thus, in this embodiment, there are twenty-seven possible characters.

Upon the initial entry to process 1100 (FIG. 11), letter indices i0, i1, and i2 were set to twenty-six in the initial processing of the entry card to indicate that the text buffer is empty. Also, as explained more completely below, as each letter of text is entered, letter indices i0 and i1 are updated and stored in memory 716.

However, in another embodiment, an initialize indices process is the first operation in predictive text entry process 1100. In this embodiment, for the first letter entered, letter indices i0 and i1 are set to twenty six; for the second letter entered, letter index i0 is set to twenty six and letter index i1 is set to the value of the letter in text buffer 903; and for all letters entered after the first two, the value associated with next to the last letter in text buffer 903 is assigned to letter index i0 and the value associated with the last letter in text buffer 903 is assigned to letter index i1.

Punctuation key check 1101 determines whether the zero key was pressed, i.e., the key selected to represent punctuation.

If the zero key was pressed, processing transfers from check 1101 to process punctuation entry 1102. Process punctuation entry 1102 sets index i2 to twenty-six, and sends the space element value to display letter process 1108. Display letter process 1108 transfers the space element value to display module 712 which in turn drives a space in the text entry on display screen 705. This completes the operation of process data entry for a zero key press and so processing returns to key press check 820.

If the zero key was not pressed, processing transfers through punctuation key check 1101 in data entry process 1100 to key one-to-nine check 1103, i.e., to a data entry key check. If the pressed key was any one of keys one to nine, check 1103 transfers to set letter index process 1104 and otherwise to rotate last entry process 1109.

In set letter index process 1104, one is subtracted from the numeric value of the pressed key and the resulting value is assigned to index i2. Set index process 1104 transfers to generate table index process 1105.

Generate table index process 1105 combines indices i0, i1 and i2 to create a table index. In this embodiment, table index TABLE_INDEX is defined as:

TABLE_INDEX=(((i0*27)+i1)*9)+i2

Upon completion of generate table index process 1105, generate text entry process 1106, retrieves the two bit value in the table at the location pointed to by table index TABLE_INDEX and converts the two bit value to a letter represented by the two bit value.

Generate text entry process 1106 transfers to update index process 1107, which in turn stores the value of letter index i1 as letter index i0; stores the value of the retrieved letter in letter index i1; and stores the predicted letter in text buffer 903. While this step assumes that letter indices i0, and i1 are stored and accessed each time in process 827, alteratively, the last two letters in text buffer 903 can be retrieved and assigned to indices i0 and i1, respectively, as described above.

Update index process 1107 transfers to display letter process 1108. Display letter process 1108 sends information to display module 712 which in turn generates the predicted letter on display screen 705.

If the pressed key is not one of keys one to nine, i.e, is not a data entry key, processing transfers from check 1103 to rotate last entry 1109. Recall that data key check 826 determined whether the pressed key was one of the zero to nine keys, or the # key. Thus, since checks 1101 and 1103 determined that keys zero to nine were not pressed, the only key press remaining is the # key, i.e., the rotate entry key, which indicates the user wants a letter different than the one entered last in text buffer 903. In rotate last entry 1109, the last character, i.e., the right most character, in text buffer 903 is replaced by the next character in the set of characters assigned to the last key pressed before the # key was pressed. Again, the use of the # key is illustrative only and is not intended to limit the invention to the use of that particular key to rotate an entry.

For example, if the last character in the text buffer 903 was a t and the # key is pressed, process 1109 changes the t to u. If the # key is pressed again, the u is changed to a v. Alternatively, if the last character in text buffer 903 was a u and the # key is pressed, process 1109 changes the u to a v. If the last character in text buffer 903 was a v and the # key is pressed, process 1109 changes the v to a t. If index i1 is stored, as the last character in text buffer 903 is rotated, index i1 is updated.

Text entry in cellular telephone 700 in different languages or contexts can be supported by using different letter frequency tables. For example, for plumbers, the prediction table can be based on text about plumbing procedures. For Frenchmen, the prediction table can be based on French text. Also, multiple letter frequency tables could be stored in cellular telephone 700, or selectively transmitted to cellular telephone 700, and a particular letter frequency table would be selected on an entry card.

In addition, an entry in the table can be more that a single letter, and thus save even more key strokes. For example, if the text buffer contains sche then typing a 3 could return dule rather than just d. Further, this novel method of text entry can be utilized with other than a cellular telephone. The method is applicable to any device that has several characters assigned to a single key on a keypad.

In the above embodiment, the English alphabet and a space element were used as the character set. Thus, the number 27 used in defining the table index is just the number N of characters in the set. Similarly, the number 9 used in defining the table index is just the number M of keys in the keypad that represent two or more different characters. Hence, predictive text entry method of this invention is not limited to text and is directly applicable to any keypad where each key represents a plurality of different characters.

Figure 9:
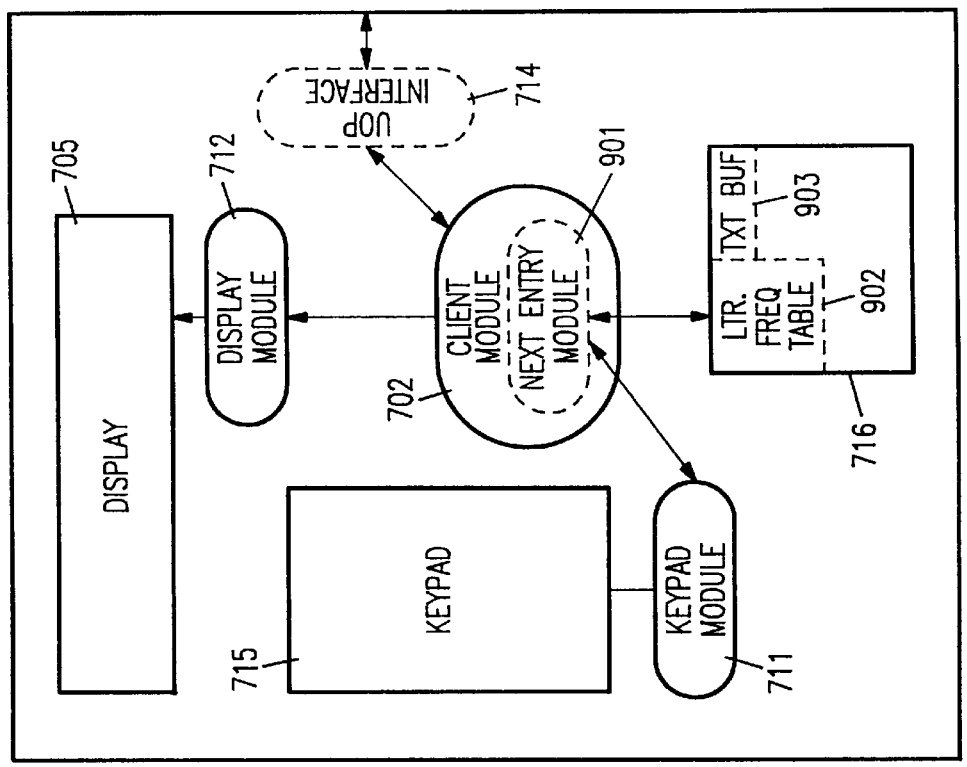
FIG. 9 is a diagram of a mobile wireless communication device of this invention that includes a novel predictive text entry system that is a part of this invention.

In the embodiment of FIGS. 7, 8, and 9, client module 702 and server module 749 communicate over CDPD network 710. However, this architecture is illustrative only of the principles of the invention and is not intended to limit the invention to the particular architecture described. Client module 702 and server module 749 can use a wide variety of two-way data communication links to exchange resource locators, e.g., URLs, and TIL decks. For example, the communications link could be a switched voice circuit in which the client module and server module communicate using modems. Alternatively, the communications link could be any other packet switched network, so long as there is some way for client module 702 to get requests to server module 749 and for server module 749 to send data back to client module 702. Further, a special purpose server could be used in place of HTTP server 749. For example, the principles of this invention can be used over various data transport mechanisms including circuit switched data and packet switched data. These data transport mechanisms are being defined and implemented for most of the cellular network standards including GSM, TDMA, and CDMA.

In the configuration of airnet network 750 (FIG. 7), client module 702 communicated directly with a server computer 743. In another embodiment, as illustrated in FIG. 5, the two-way data communication device first communicates with an airnet network translator 500 that in turn communicates with the appropriate server. In this embodiment, the operation of two-way data communication devices 100, 101, and 102 is similar to that described above for cellular telephone 700, except the method field in the request generated in process 802 has a different form. For example, using the same information as before, the method field in this embodiment is:

GET http://www.libris.com/airnet
/home.cgi?&cost=1 ANTP/1.0

The method field includes the full address of the server, the expected cost of the service, and the version of the protocol used for communicating with airnet network translator 500. The two-way data communication device transmits the HTTP request including the complete URL to airnet network translator 500.

Figure 12:
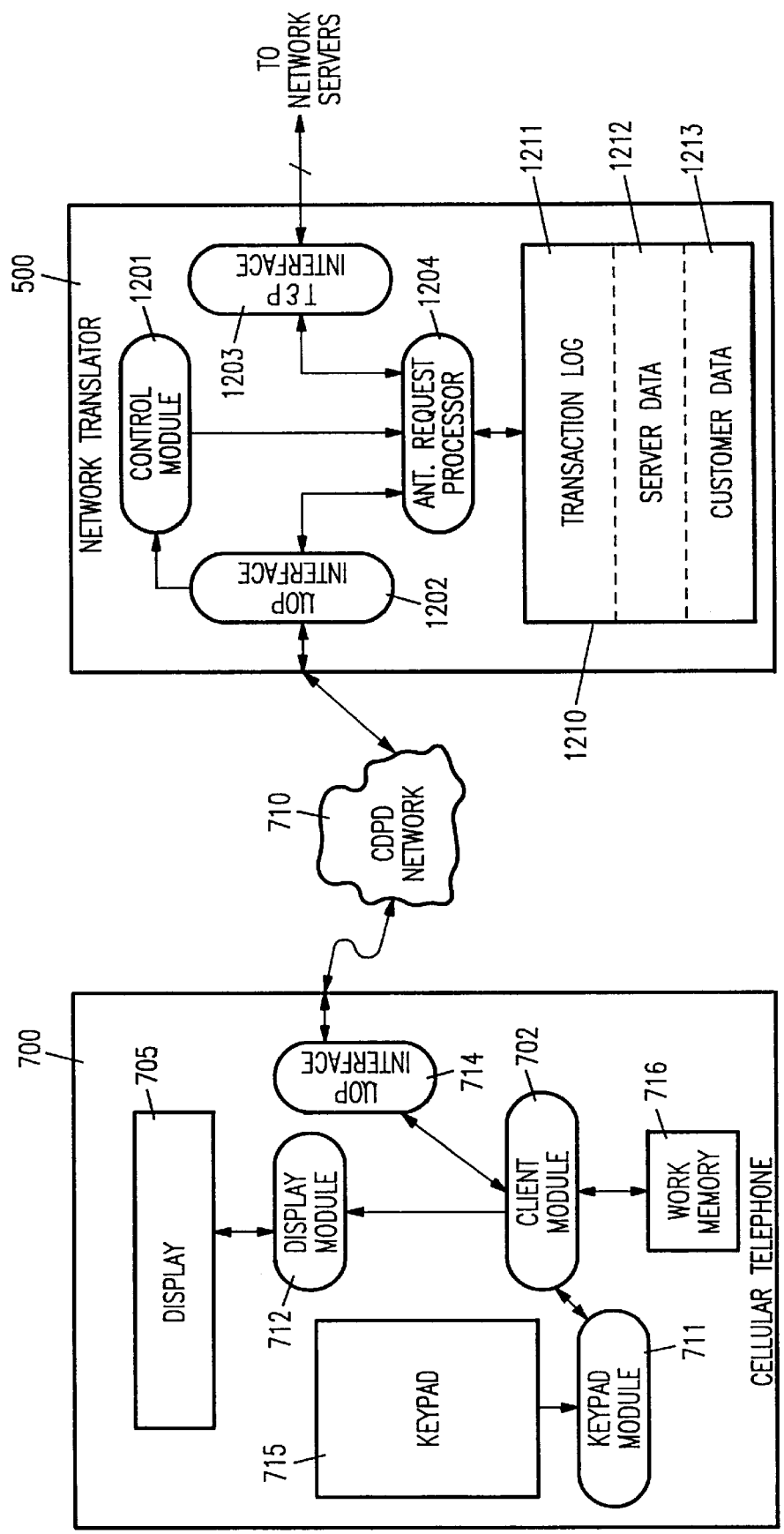
FIG. 12 is a more detailed diagram of the mobile wireless communication device and the airnet network translator within the airnet network architecture of the another embodiment of this is invention.

FIG. 12 is a more detailed block diagram that illustrates the structures in one embodiment of airnet network translator 500, according to the principles of this invention. In this embodiment, airnet network translator 500 is a computer running under the UNIX operating system with an interface to CDPD network 710. Such computers are well known to those skilled in the art. Thus, herein only the structures and processes that must be added to such a computer are described.

Airnet network translator 500 supports internet protocol (IP) connections over CDPD network 710 and with each computer network with which translator 500 can interact. In this embodiment, each of the modules in network translator 500 are processes that are executed by the processor in the computer. Control module 1201 is a daemon that listens for transmissions over an IP connection from CDPD network 710. When control module 1201 accepts a transmission, control module 1201 spawns an ANT request processor 1204, which in this embodiment is a process, as indicated above. While in FIG. 12, only one ANT request processor 1204 is shown, there is an ANT request processor spawned for each transmission that control module 1201 accepts and the ANT request processor remains active until the communication is terminated.

Figure 13:
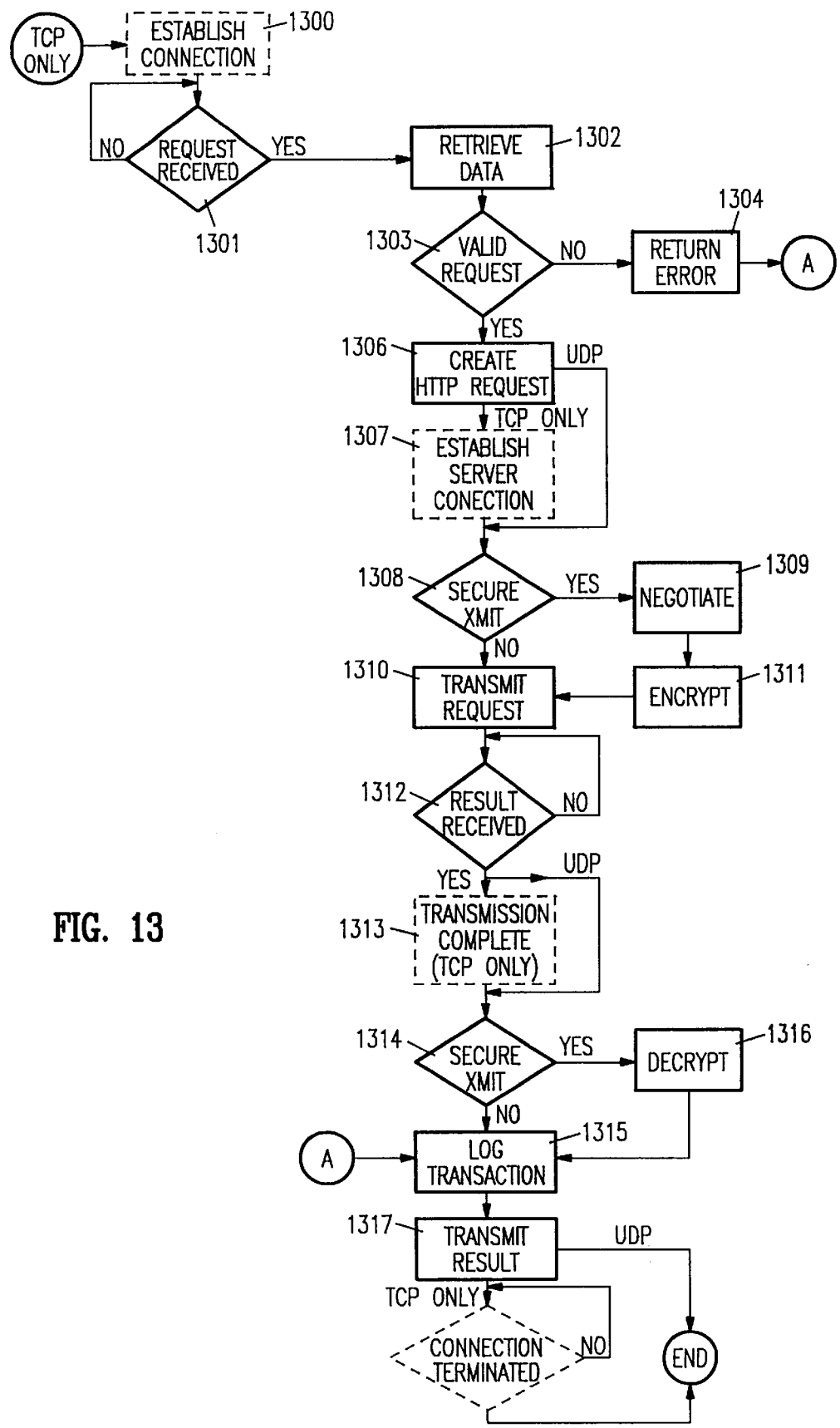
FIG. 13 is a process flow diagram showing the various processes performed by the airnet network translator of FIG. 12.
Figure 14:
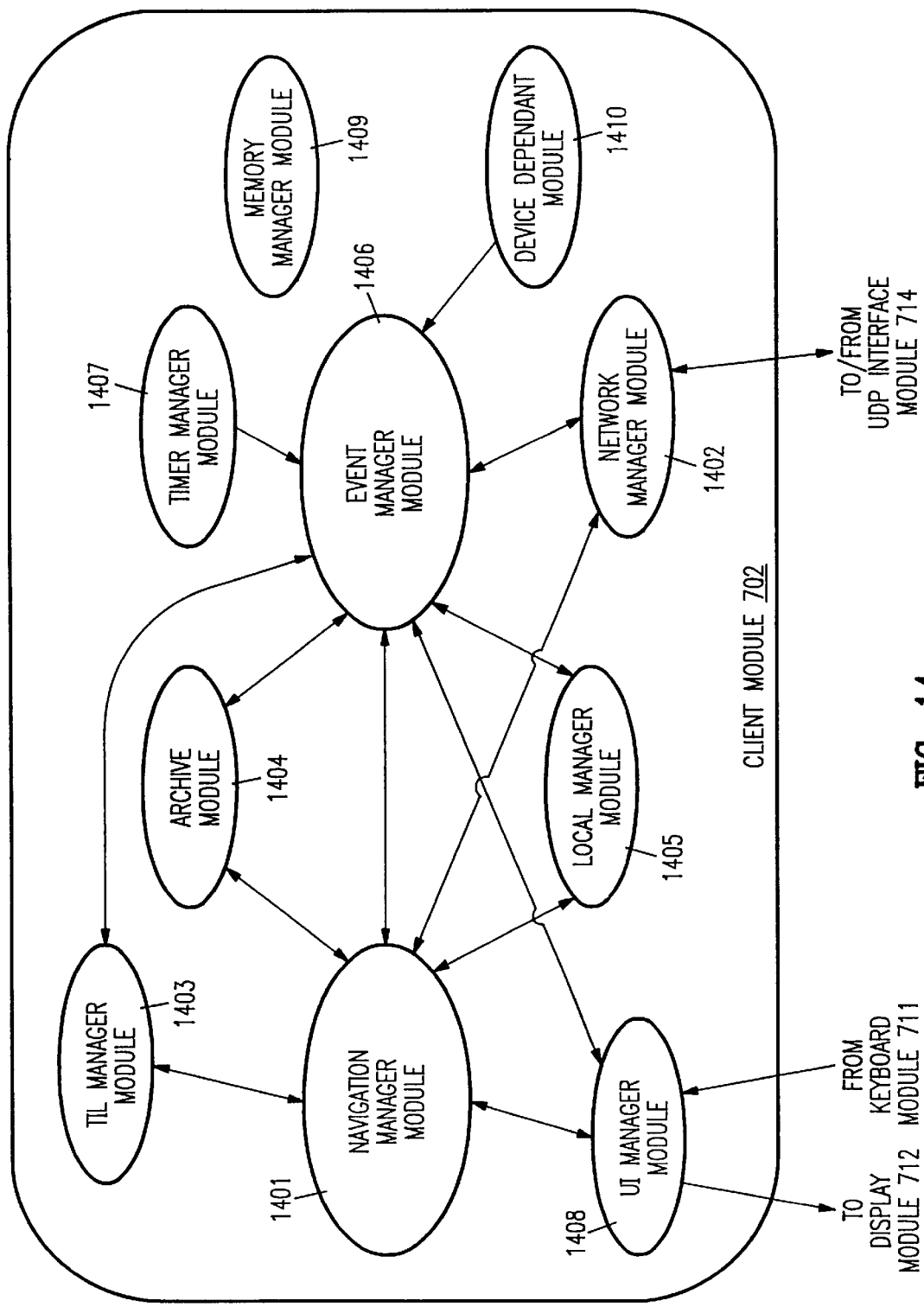
FIG. 14 is a diagram illustrating the various module managers included in one embodiment of the client module of this invention.

FIG. 13 is a process flow diagram that illustrates the operation of ANT request processor 1204. This process flow diagram considers transmissions that utilize both TCP/IP and UDP/IP. However, the processes that are specific only to TCP/IP are enclosed in dashed-line boxes. Upon being spawned for a TCP/IP, in establish connection process 1300, ANT request processor 1204 establishes a TCP connection using a TCP module in the server with the client module over CDPD network 710. After the connection is established processing transfers from process 1300 to request received check 1301.

If UDP is being used, upon being spawned ANT request processor 1204 initiates processing in request received check 1301. In check 1301, ANT request processor 1204 determines whether the request from cellular telephone 700 (FIG. 12) has been received and stored in memory 1210. Memory 1210 represents both RAM and non-volatile memory in this embodiment. When the request has been received and stored, processing transfers from check 1301 to retrieve data process 1302.

In retrieve data process 1302, ANT request processor 1204 retrieves information concerning the source of the URL, i.e., client module 702 of cellular telephone 700 from customer database 1213, and the destination specified in the URL, i.e., the designated server, from server database 1212. Both databases 1212 and 1213 are stored in memory 1210. A customer record in database 1213 includes, for example, a carrier address, e.g., an IP number, an airnet network translator account number, billing information, and server subscriptions. A server record in database 1212 includes a server IP address, name, category, and class of service. Class of service refers to the pricing of the service, e.g., basic services, premium services, or pay-per-view services. Other pricing schemes can be supported in other implementations. When the information is retrieved for the server and service specified in the URL, and for the customer, processing transfers to valid request check 1303.

In valid request check 1303, ANT request processor 1204 determines, for example, whether client module 702, i.e., the customer, is authorized to access airnet network translator 500; whether client module 702 is authorized to access the server specified in the URL; whether the specified server is available through translator 500; and whether the specified server supports the requested service. Thus, valid request check 1303, validates the client, the server, and the client/server pair. Also, since an estimated cost is included in the request, the status and credit limits on the customer's account could be checked to determine whether the estimated cost is acceptable. If all of the checks are true, processing transfers to create HTTP request process 1306. Conversely, if any one of the checks is untrue, valid request check 1303 passes information concerning the error to return error process 1304.

Return error process 1304 launches a CGI program stored in memory 1210 based on the information received and passes appropriate information to the CGI program. The CGI program builds an appropriate PIDL deck describing the error and converts the PIDL deck to a TIL deck, as described above. When the TIL deck describing the error is complete, return error process 1304 transfers processing to log transaction process 1315 that is described more completely below.

If all the checks in valid request check 1303 are true, create HTTP request 1306 converts the request in memory 1211 to a request specific to the server specified, which in this embodiment is a HTTP request. For example, for the above request, create HTTP request process 1306 generates a method field, such as GET /airnet/home.cgi?&client=xyz&cost=1 HTTP/1.0

In this embodiment, the method field includes the same information as in the embodiment described above, and in addition, the method field includes a client identification and the estimated cost.

After create HTTP request process 1306 is complete, ANT request processor 1204 accesses TCP module 1203 in establish server connection process 1307 for TCP/IP and transfers to secure transmission check 1308 for UDP/IP. In establish connection process 1307, a connection is made between the server designated in the client request and the TCP interface module (not shown) so that data can be transmitted between airnet network translator 500 and the server. When the TCP connection to the server is established, ANT request processor 1204 transfers processing from establish server connection process 1307 to secure transmission check 1308.

In secure transmission check 1308, ANT request processor 1204 determines whether the HTTP request from the client requested a server that utilizes a protocol that supports encryption. If such a server was requested, processing transfers to negotiate process 1309 and otherwise to transmit request process 1310.

In negotiate process 1309, ANT request processor 1204 negotiates an encryption technique with the server. Upon completion of the negotiation, processing transfers from process 1309 to encryption process 1311. In encryption process 1311, the HTTP request is encrypted using the negotiated encryption technique, and then processing transfers to transmit request process 1310.

In transmit request process 1310, the HTTP request is sent from memory 1210 to the HTTP server. When the transmission is complete, ANT request processor 1204 goes to result received check 1312.

As described above, upon receipt of the request, the HTTP server services the request. Upon completion of servicing the request, the HTTP server returns either a PIDL deck or a TIL deck to airnet network translator 500. The deck is stored in memory 1210. If the server does not convert the PIDL deck to a TIL deck, the translation is done by airnet network translator 500.

When the deck is received and stored, ANT request processor 1204 transitions from check 1312 to transmission completed process 1313 for TCP/IP and to secure transmission check 1314 for UDP/IP. ANT request processor 1204 closes the TCP circuit with the server in transmission completed process 1313. Upon closing the server TCP connection, processing transfers to secure transmission check 1314.

If the server utilized encryption, the deck stored in memory 1210 is encrypted. Thus, secure transmission check 1314 transfers processing to decryption process 1316 if encryption was used and otherwise to log transaction 1315.

In decryption process 1316, the encrypted deck is decoded and stored in memory 1210. Also, after the decoding, if the deck must be converted to a TIL deck, the translation is performed. Decryption process 1316 transfer to log transaction process 1315.

In log transaction process 1315, ANT request processor 1204 writes a description of the transaction to transaction log 1211 in memory 1210. In this embodiment, each transaction record includes a customer identification, a server identification, time required for the transaction, cost of the transaction, and a completion code. In one embodiment, for security purposes, each cellular telephone is assigned to only one customer and only one account.

After the transaction is logged, processing transfers to transmit result 1317. In transmit result 1317, ANT request processor 1204 returns the deck to client 702. After the deck is transmitted, ANT request processor 1204 is terminated.

In one embodiment, if an airnet network translator is fully loaded and another transmission comes in, the translator returns the address of another airnet network translator and refuses the transmission. The cellular telephone transmits the message to the other airnet network translator. In yet another embodiment, all incoming transmissions are directed to a router. A plurality of airnet network translators are connected to the router. The router monitors the status of each translator. Each incoming transmission is routed to the least busy translator, which in turn responds to the transmission and performs the necessary operations for continuing communications with the client module.

In the above description of client module 702, module 702 interacted with components within the cellular telephone to perform the various operations specified by the user. To insulate client module 702 from the exigencies of various cellular telephones to the extent possible, a general architecture for client module 702 is described more completely below. This general architecture is designed to have specific manager modules that interact with the modules described above within the cellular telephone and to provide standard information to the remaining manager modules within client module 702. The manager modules with client module 702 form an interpreter that interprets TIL decks to generate a user interface; interprets data input by the user; and interprets the TIL decks so that the data input by the user is combined with an appropriate resource locator and either a message is sent to an appropriate server, or another local TIL deck is interpreted by client module 702. While this embodiment is for a cellular telephone, the manager modules are generic and so are applicable to any client module in a two-way data communication device.

This approach limits the modifications that must be made to client module 702 to implement the principles of this invention in a wide variety of two-way data communication devices over a wide variety of two-way data communication networks. Also, in the above embodiment, client module 702 supported communications and interactions over the cellular telephone network. However, client module 702 can also support local services on cellular telephone 700. Typical local services includes local messages, an address book, and preconfigured e-mail replies, or any combination of such services.

In this embodiment, client module 702 includes a plurality of manager modules including a navigation manager module 1401, a network manager module 1402, a TIL manager module 1403, an archive manager module 1404, a local manager module 1405, an event manager module 1406, a timer manager module 1407, a user interface manager module 1408, a memory manager module 1409, and a device dependent module 1410.

Navigation manager module 1401 handles card and deck navigation as well as managing any caches. Navigation manager module 1401 owns and manages a history list and as well as a pushed card list. In addition, navigation manager module 1401 functions as the main line of client module 702; does all event distribution; and supports local services.

For local services, like local message store, there are two basic approaches that can be used. First, local services are implemented in a CGI-like manner. Each local service has an entry point which is called with an argument list. A TIL deck is returned via the event manager. From that point on, the TIL deck is processed in the standard manner. This approach limits local services to the same constraints as remote services. A less restrictive approach is to allow the local service to field events instead of the standard event loop. The local service would construct TIL cards on-the-fly and feed them to user interface manager 1406. Note that the local service would need to cooperate with the standard event loop with regard to the history, the pushed card list, and any other state that is normally managed by the event loop. Table 4 is a listing of processes for the architecture for navigation manager module 1401.

TABLE 4

ARCHITECTURE FOR NAVIGATION MANAGER MODULE 1401

ProcessEvents (void);
PushLocation (void * location, Boolean forStack);
void * PopLocation (Boolean forStack);
void * CurrentLocation();
struct LOCAL_SERVICE {
char name [50];
FUNC HandleEvent (Event * pevent);
FUNC StartLocalService (void);
FUNC StopLocalService (void);
static LOCAL_SERVICE localServices[] = { ... };
STATUS HandleEvent (Event * pevent);
STATUS StartLocalService();
STATUS StopLocalService();

Routine ProcessEvents is the main entry point for event processing in client module 702. Typical events include key presses on the keypad, choice selection for a choice card, text entry for an entry card, network events, and history events. Routine ProcessEvents can be called at any time to process an event or events. Routine ProcessEvents does not return until all events on a queue generated by event manager module 1406 are processed. If a local service is running, events are distributed to the local service before being processed by routine ProcessEvents.

The remaining routines in Table 4 are called internally to navigation manager module 1401 and by local services. Routine PushLocation pushes a location on the history list and issues a request for that location. The forStack flag indicates a stack push of local cards.

Routine *PopLocation pops a location on the history stack and issues a request for the top location of the history stack. In routine *PopLocation the forStack flag indicates that all cards since the last stack push should be popped.

Routine *CurrentLocation returns the current location the current URL being displayed.

As shown in Table 4, each local service provides a number of functions. If a local service is running, function HandleEvent, the local service's event handler, is called before any processing by navigation manager module 1401. If the event is handled by the local service, the event is not processed any further.

Function StartLocalService is the local services start function. Function StartLocalService is called before any events are distributed to the local function. Similarly, function StopLocalService is the stop function for the particular local service. Function StopLocalService is called when no more events are distributed to the local service.

Network manager module 1402 insulates the rest of client module 702 from the specific networking protocol used over the cellular telephone network. Network manager module 1402 delivers requests to the server specified in the URL via the cellular telephone network interface; segments responses from the server for lower latency; delivers responses from local services to navigation module 1401 via event module 1406; handles request/response cycle (e.g. cancellation, retry strategy) with the server over the cellular telephone network; can receive asynchronous messages from the server; performs memory management of TIL decks; performs caching of TIL decks; handles all negotiations concerning protocols and server scaling with the server; handles any encryption for information exchanged between cellular telephone 700 and the server.

In some cellular telephone, the maximum message size is fixed. However, for UDP and TCP messages, a more direct interface is used that bypasses this limitation of message passing. It is important to avoid copying network data from memory buffer to memory buffer as such copying increases the memory "high water mark" as well as decreases performance. Since different cellular telephones have different interfaces for delivering network data, network manager module 1402 manages the network data. In this way, network data is only copied from the network buffer for long-term storage.

When a message or reply arrives, network manager module 1402 uses event manager module 1406 to report that fact. However, access to the data by other manager modules in client module 702 is through a protocol that allows storage of data in a variety of fashions on different telephones. Any transparent, short-term caching of TIL data is handled by network manager module 1402. Table 5 is one architecture for network manager module 1402.

TABLE 5

SPECIFICATION FOR NETWORK MANAGER MODULE 1402

```
typedef short TID;
void NM_Init(void);
void NM_Terminate (void);
TID NM_SendRequest (void *requestData, int length,
    Boolean ignoreCache);
NM_CancelRequest (TID TRANSACTIONId);
NM_DataType(TID TRANSACTIONId);
NM_GetData(TID TRANSACTIONId, void *data, int
    *length, Boolean *complete);
void *NM_HoldData (TID TRANSACTIONId);
NM_ReleaseData(TID TRANSACTIONId);
TID NM_StartData(int data Type, char *requestData,
    int length);
STATUS NM_EndData(TID TRANSACTIONId);
STATUS NM_SetDataLength (TID TRANSACTIONId, int
    length);
STATUS NM_GrowDataLength (TID TRANSACTIONId, Int
    grow);
int NM_GetDataLength(TID TRANSACTIONId);
void *NM_GetDataPointer (TID TRANSACTIONId);
STATUS NM_DeliverData (TID TRANSACTIONId);
```

Network manager module 1402 identifies each network data transaction by a 16-bit transaction identification code TID. Network manager module 1402 increments transaction identification code TID by one for each new transaction. Transaction identification code TID rolls over after 0xffff.

Routine NM_Init initializes network manager module 1402 and so is called before any other calls in network manager module 1402. Routine NM_Terminate closes processing of network manager module 1402 and so is called after all other calls in network manager module 1402.

Network manager module 1402 uses routine TID NM_SendRequest as the standard process of sending a request to the server. Pointer *requestData in the call to routine TID MN_SendRequest is defined by the server protocol. Similarly, the state, e.g., the Boolean value, of variable ignorecache is used to indicate whether any cached replies should be ignored. After sending the request, this routine returns a server transaction identification code TRANSACTIONId. A local service can also send a request to the server.

When the user instructs client module 702 to cancel a request, network manager module 1402 calls a routine NM_CancelRequest with cellular telephone transaction identification code TID and server transaction identification code TRANSACTIONId. Routine NM_CancelRequest issues a command to the server to cancel the specified request.

When data are received from the network, the data can be either a response to a request sent by routine TID MN_SendRequest, or by a local service. Thus, in response to receiving data from the server, network manager module 1402 generates an event that includes server transaction identification code TRANSACTIONId and the type of data DATAType. For replies to requests sent by routine TID MN_SendRequest, server transaction identification code TRANSACTIONId is the same as the one returned by the matching call to routine TID MN_SendRequest and data type DATAType indicates that the data is a response. For local service originated messages, server transaction ID is new, and data type DATAType depends on whether the data is an e-mail, pushed TIL, or another type.

After the network event is received by event manager module 1406, and navigation manager module 1401 distributes control of the event to network manager module 1402, network manager module 1402 users the server transaction identification code TRANSACTIONId and the remaining routines in Table 5 to process the data.

Routine NM_DataType is used to return the particular data type dataTYPE, e.g, reply, MIME, server push, etc. Routine NM_GetData sets a pointer to the data identified by server transaction identification code TRANSACTIONId, retrieves the length of the data, and determines whether all the data has been received. The interface provided by this routine allows the first part of a data stream, e.g. the first card of a TIL deck, to be processed by client module 702 before the rest of the deck is received.

Routine NM_HoldData is called before calling routine NM_GetData to hold the data and thus insure that the data remains valid during processing by client module 702. If the data is not held, the data can be deleted or moved with the internal buffers of network manager module 1402. If the data is held, routine NM_ReleaseData is called after network data has been processed to release the data.

Routines TID NM_StartData, NM_EndData, NM_SetDataLength, NM_GrowDataLength, NM_GetDataLength, NM_GetDataPointer, and NM_DeliverData are used internally by network manager module 1402, and by local services to deliver data. By allowing local services to use these routines, the same buffers can be used to store both network and locally generated data thereby reducing the amount of memory required to support client module 702.

Routine TID NM_StartData creates a new data transaction and triggers a data delivery event. Routine NM_EndData is called when all data for the given server transaction identification code TRANSACTIONId has been transmitted. Routine NM_SetDataLength sets the data segment to a given length and may cause the location of the data to change. Routine NM_GrowDataLength grows the data segment by a given length and also may cause the location of the data to change. Routine NM_GetDataLength returns the length of the data segment. Routine NM_GetDataPointer returns a pointer to the data. This routine is preferably called before writing into the data buffer. Also, this routine is preferably called whenever the data's location may have changed. Routine NM_DeliverData can be called when at least one card has been stored to reduce latency while the other cards are being generated.

TIL manager module 1403 insulates the rest of client module 702 from changes to the TIL specification. The interface provided by TIL manager module 1403 has the following characteristics: removes the need for parsing by the rest of client module 702; uses cursors to avoid generating data structures on-the-fly; does not need an entire deck to operate; and handles TIL versioning.

Each TIL deck contains a major and a minor version number. The minor version number is incremented when TIL changes in a way that does not break existing TIL manager modules. The major version number is incremented for non-compatible versions of TIL.

Each TIL deck has the same hierarchy. One embodiment of this hierarchy is presented in Table 6. In Table 6, indentation is used to represent the relationships of the various hierarchical levels.

TABLE 6

TIL DECK HIERARCHY

```
deck
    options
    softkeys
        options
    card
        options
        softkeys
            options
        formatted text
            formatted lines
        entries
            options
        formatted line
```

The interface presented in Table 7 for TIL manager module 1403 is designed with the assumption that TIL is a direct tokenization of PIDL as described in Appendix I. However, the interface does not have any dependencies on that tokenization and can support other PIDL encoding techniques. Given the above assumption, the opaque pointers described below are actual pointers into the TIL deck itself. A rudimentary object typing scheme based on where in the deck the opaque pointer points can be used to implement the generic functions described below. If this object typing is not feasible due to details of TIL encoding, the generic functions can be replaced with specific functions.

TABLE 7

ARCHITECTURE FOR TIL MANAGER MODULE 1403

```
typedef char *opaque;
typedef opaque Deck;
typedef opaque Card;
typedef opaque Text;
typedef opaque Entry;
typedef opaque Option;
typedef opaque SoftKey;
typedef opaque Object;
/* Generic functions */
    FirstOption(Object obj, Option *o);
        /* obj is a card, softkey, entry, or deck */
    GetSoftkey(Object obj, Option *o);
        /* obj is a card or deck */
    GetText(Object obj, Option *o);
```

TABLE 7-continued

ARCHITECTURE FOR TIL MANAGER MODULE 1403

```
    /* obj is a card or entry */
/* Deck functions */
    SetDeck(Deck d, int length);
        /* tells module which deck to use */
    DeckGetCard(Card *c, int num);
-or-
    DeckGetCard(Deck d, Card *c, int num);
/* Card functions */
    int CardType(Card c);
    CardFirstEntry(Card c, Entry *e);
    CardLookupSoftkey(Card c, int num, Softkey *s);
    CardIsLast (Card c);
/* Option cursor functions */
    OptionNext (Option *o);
    char *OptionKey(option o);
    char *OptionValue(Option o)
/* Entry cursor functions */
/* Text (and image) cursor functions */
    TextNextToken(Text *t, int *type, int *subtype,
            int *length, char *data);
```

Archive manager module 1404 stores and retrieves long-lived information. This information includes: data related to the server's location and/or required to support server scaling; data related to encryption; TIL caching (transparent to user); TIL storage (specified by user); and message storage and retrieval (see local manager module). Archive manager module 1404 should support a variety of nonvolatile memory schemes that are provided by the two-way data communication devices.

Local manager module 1405 is an interface to local device resources, such as local messages, address book entries, and preconfigured e-mail replies. Local manager module 1405 should also define an abstract interface to navigation manager module 1401 for use by archive manager module 1404.

Table 8 is an architecture for an interface within local manager module 1405 to access to an address book stored on cellular telephone 700. The name of a routine in Table 8 is descriptive of the operations performed by the routine.

TABLE 8

ARCHITECTURE FOR ADDRESS BOOK ACCESS

```
int NumAddresses();
char *AddressName(int num);
char *AddressGetEMail (int num);
    // returns e-mail address
char *AddressGetPhone(int num);
    // returns phone number
char * AddressGetFax(int num);
    // returns fax number
SetAddress(int num, char *name, char *email,
        char *phone, char *fax);
DeleteAddress(int num);
InsertAddress (int before);
```

Table 9 is an architecture for an interface within local manager module 1405 to access predetermined replies stored on cellular telephone 700. The name of a routine in Table 9 is descriptive of the operations performed by the routine.

TABLE 9

ARCHITECTURE FOR PREDETERMINED REPLY ACCESS

```
int NumReplies();
char * GetReply(int num);
DeleteReply(int num);
SetReply(int num, char *text);
InsertReply(int before);
```

Table 10 is an architecture for an interface within local manager module 1405 to access messages stored locally on cellular telephone 700. The name of a routine in Table 10 is descriptive of the operations performed by the routine.

TABLE 10

ARCHITECTURE FOR LOCALLY STORED MESSAGE ACCESS

```
int NumMessages();
void *FirstMessage();
void *NextMessage();
int MessageType(void *msg);
    // e.g. e-mail, TIL, etc.
void *MessageContent (void *msg);
void *SaveMessage(int type, void *content, int
    contentLength);
DeleteMessage (void *msg);
```

Event manager module 1406 handles the distribution of events. In this embodiment, events include low-level events like key presses and higher level navigation and user interface events. There are typically only a small number of events at any one time. The main event loop in the two-way data communication device dependent module keeps calling EM_GetNextEven( ) until no events are left in the queue. Note that processing one event can cause another event to be pushed onto the queue. The main event loop is not restarted until another event is pushed onto the queue due to a user key press or a network event.

In this embodiment, the event types include:

1) keypad events, i.e., pressing of a key;
2) choice events relating to a current choice card, e.g., the user selecting choice three;
3) text entry events relating to a current entry card, e.g., the user keying in "Hello";
4) network events, e.g., response arrived, request arrived, transaction terminated, network status; and
5) history events, e.g., pop, pop to marker.

Table 11 is an architecture for event manager module 1406. As in the other tables herein, the name of a routine in Table 11 is descriptive of the operations performed by the routine and in addition a brief description is given in the comment field.

TABLE 11

ARCHITECTURE FOR EVENT MANAGER MODULE 1406

```
struct Event {
    int type;
    void *data;
        /* e.g. keycode, choice num, entry
        text, status code, other data */
EM_QueueEvent(int type, void * data);
    /* Adds event at end of queue*/
EM_GetNextEvent(Event * event);
    /*Pops next event*/
EM_PeekNextEvent(Event event);
    /*Peeks at next event*/
```

Timer manager module 1407 allows timer events to support timeouts, animation, and other time-domain features. Timeouts are delivered via event manager module 1406.

Table 12 is an architecture for timer manager module 1407. As in the other tables herein, the name of a routine in Table 12 is descriptive of the operations performed by the routine.

TABLE 12

ARCHITECTURE FOR TIMER MANAGER MODULE 1407

```
TimerInit( );
int TimerSet(int milliseconds, int code, void
    *clientData);
    /*Returns a timer identification timerId to
    be used for cancellations*/
TimerCancel(int timerId);
TimerCancelAll( )
```

User interface manager module 1408 handles interactions with the keypad and the display. Each of the three types of user interfaces defined in Table 1 above requires a different version of user interface manager module 1408. For most cellular telephones, only one card at a time is used. However, some cellular telephones can display multiple cards at once and so would require a different version of user interface manager module 1408 from the version that handled display of only one card at a time.

In this embodiment, user interface manager module provides a user interface for the three types of cards display, choice, and entry; provides hooks for custom user interfaces for the address list and e-mail reply entry; only cares about the user interface aspects of cards and provides no navigation, argument, or option processing; handles all text and graphic layout including word wrapping; handles scrolling of text; operates from PIDL data structures; generates keyboard events, some of which may be generated by soft keys; and generates high-level events, e.g. next card, choice entry 3, text entry "IBM".

Table 13 is an architecture for processing cards by user interface manager module 1408. As in the other tables herein, the name of a routine in Table 13 is descriptive of the operations performed by the routine.

TABLE 13

ARCHITECTURE FOR CARD PROCESSING BY UI MANAGER MODULE 1408

```
void UI_StartCard(Card c);
    /* called to begin display and processing of
    a given card*/
void UI_EndCard(Card c);
    /*called when a card is no longer to be
    displayed*/
Boolean UI_HandleEvent(Event *pevent) ;
    /*returns true if the event is handled, false
    if not*/
```

Table 14 is an architecture for the user interface implementation by user interface manager module 1408. As in the other tables herein, the name of a routine in Table 14 is descriptive of the operations performed by the routine.

TABLE 14

ARCHITECTURE FOR UI IMPLEMENTATION BY UI MANAGER MODULE 1408

```
UI_LayoutCard(Card c, Boolean draw, Proc
                                       callback)
    /* relies on global data; needs to be able
      to: draw as it goes; and note the
      special function of the currentLine
      (e.g. none, choice, softkey)*/
    int numLines, firstVisible, lastVisible,
                                       currentLine;
    char currentEntry[80];
    int currentChoice;
    void *currentSoftkey;
    Card currentCard; and
    ... other info as needed far in-line
                                       scrolling
```

The callback routine is notified of the special function of each line as the line is laid out. Thus, routine UI_LayoutCard can be used to scroll to a particular choice. If the current line is too wide to display all at once, horizontal scrolling is used to display the complete line, one display width at a time.

Memory manager module 1409 is optional, and is used in two-way data communication devices that do not support dynamic memory allocation. In these devices, all memory allocation and releases must go through memory manager module 1409. Also, by allocating memory in advance via memory manager module 1409, client module 702 does not run out of memory due to some other process on the device using up memory.

Microfiche Appendix A is a computer source code listing in the C++ computer language of one embodiment of a client module within a cellular telephone, and one embodiment of an airnet network translator that was used with an Internet server to communicate with client module. The Internet server was a UNIX computer running the Mosaic HTTP server. The source code was used to generate executable code by compiling the source code on a computer running the Sun Microsystems Operating System Solaris 2.4 using Sun Microsystems compiler SunPro C and C#, and the Sun Microsystems SDK make utility. All of these products are available from Sun Microsystems of Mountain View, Calif.

This application is related to copending and commonly filed U.S. patent application Ser. No. 08/XXX,XXX entitled "A Method and Architecture For An Interactive Two-Way Data Communication Network" of A. Rossmann, which is incorporated herein by reference in its entirety.

Various embodiments of a novel interactive two-way data communication system, a two-way data communication device, an airnet network architecture, and a predictive text entry system have been described herein. These embodiments are illustrative only of the principles of the invention and are not intended to limit the invention to the specific embodiments described. In view of this disclosure, those skilled in the art will be able to use the principles of this invention in a wide variety of applications to obtain the advantages of this invention, as described above.

The main structure of PIDL is described by an abstract syntax. This appendix describes the elements of the language and their semantics. In the syntax description of each element, an element is defined in an enhanced BNF.

| | |
|---|---|
| a ::= b | the element a is defined as b |
| a ::= b<br>    ::= c | the element a is defined as b or c |
| b c | the element b followed by element c, the intervening space is just for clarity |
| a\|b\|c | element a or element b or element c |
| {a} | the element a is optional |
| {a}* | the element a may appear zero or more times in a row |
| {a}+ | the element a may appear one or more times in a row |
| abc | the characters abc literally |
| ol(a) | an option list with zero or more topions of the element a, see Options below |

In general, the element blank-space can optionally appear between any two other elements. To keep the diagram clear, it has been omitted except where required. Where a blank-space is illegal or treated specially, it is noted.

The PIDL Elements

```
deck         ::= deck-header {softkey}* {card}+ deck-
                    footer
deck-header  ::= <PIDL ol(deck-options) >
deck-options ::= o-args | o-cost | o-ttl
deck-footer  ::= </PIDL>
```

A deck consists of one or more cards. There must be at least one card. A deck may also have a number of softkeys defined that stay in force for the whole deck. See soft keys below for the syntax and full description.

```
o-cost ::= cost= value
o-ttl  ::= ttl= integer
```

Additional arguments to be passed on the next deck request are given in o-args. See Arguments below for syntax and full description.

The cost of retrieving this page (exclusive of telephone system charges) is represented in o-cost. If no o-cost is given, the deck cost is included with the user's standard service contract.

Decks can be cached by the cellular telephone for a period of time. The o-ttl entry indicates the number of seconds that the deck can be cached from time of reception. If no o-ttl entry is given, the deck can only be cached for short periods of time, for example, to implement a back function similar to that of most Web browsers. If the value of o-ttl is zero, the deck must not be cached.

Card Elements

```
card ::= display-card | choice card | entry-
            card
```

A card is one of three types of card in this embodiment. These are described in the sections below.

```
card-options  ::= o-name | o-next | o-prev
     o-name   ::= name= identifier
     o-next   ::= next= destination
     o-prev   ::= prev= destination
```

All cards can have these options. The optional o-name option gives a name to the card. If a card has a name, the card can be referred to by a destination.

The o-next and o-prev give destinations for the NEXT and PREV keys. If omitted, the defaults are the next and previous sequential card in the deck. If o-prev is omitted from the first card, the PREV key returns to the deck last visited. If o-next is omitted from the last card, the NEXT key returns to the first card of the current deck. However, this default behavior is only a fail-safe: the last card in a deck should always have either an o-next option, or be a choice card where each choice entry indicates a new destination.

Display Card

```
display-card    ::= display-header display-content
                    display-footer
display-header  ::= <DISPLAY option-list >
display-options ::= card-options
display-content ::= { softkey }* formatted text
display-footer  ::= </DISPLAY>
```

Display cards give information for the user to read. See Formatted Text below for a full description of the format of information that can be displayed. Softkeys can b e described for this card only, see Softkeys below.

Choice Card

```
choice-card    ::= choice-header display-content
                   { entries } choice-footer
choice-header  ::= <CHOICE ol{choice-options} >
choice-options ::= card-options | o-method | o-key
                   | o-default
o-method       ::= method= method-type
method-type    ::= number | list | alpha | group
entries        ::= { choice-entry }+
               ::= { group-entry { choice-entry }+ )+
choice-footer  ::= </CHOICE>
```

Choices let user pick one from a list. The initial display content is shown to the user, followed by the choices. Each choice can have one line of formatted text (which may be wrapped or scrolled by the phone if too long).

How the choices are displayed and chosen is based on the o-method option. Note that this option is a hint only, and can be disregarded by the phone. The number method is the default and indicates that the choices are numbered sequentially from one and are chosen by pressing the appropriate digit on the keypad. If there are more than nine options, the phone may choose some other method of selection. The list method indicates that the list should be unnumbered and that the user should scroll through the list and hit some designated enter key to choose an entry. The alpha method is like list, only it is an indication that the text of the entries should be used to aid selection if at all possible. In this case, the entries are assumed to be alphabetically sorted. The group method is described in more detail below.

The o-key option indicates, if present, the key of an argument to be added to the argument list. See Arguments below for more information. The value of the argument comes from the choice entry; see below. The o-default option indicates the default value if the user just hit ENTER. See o-default under Entry Card below for more information.

```
choice-entry   ::= <CE ol(entry-options) >
                   formatted-line
entry-options  ::= action-options | o-value
```

Each choice has text displayed to the user. If the action-options are given, the indicated action is performed if the choice is made. If the o-value option is present, it supplies the value to the argument identified with the o-key option in the choice header. If no o-value is given, the text of the entry is used (without any formatting) as the argument value.

```
group-entry   ::= <GE ol(group-options) >
group-options ::= label= value
```

If the group method is used, the choices are divided into a number of groups. Each group is headed by a group-entry, which, via the label option, gives a short name to the group. The phone can then give the user a hierarchial interface for choosing among a large number of choices. The text of the label should be limited to eight characters and may be truncated by the phone.

Entry Card

```
entry-card    ::= entry-header display-content entry-
                  footer
entry-header  ::= <ENTRY ol(entry-options) >
entry-options ::= card-options | o-format | o-key
                  | o-default
entry-footer  ::= </ENTRY>
```

Entries let the user enter a value. The display content is shown to the user, followed by an entry line. The user's entry is controlled by the format. The o-key option indicates the argument that is being set by this entry. The value of the argument are the user's entry.

```
o-format    ::= format= value { ; format-hint }
format-hint ::= value
```

This option specifies the format for user input entries. The string consists of format control characters and static text which is displayed in the input area. Most of the format control characters control what data is expected to be keyed in by the user. They are displayed as blanks until the user types into them.

The format codes are:

| | |
|---|---|
| A | entry of any alphabetic character |
| 9 | entry of any numeric character |
| X | entry of any alphabetic or numeric character |

| | |
|---|---|
| *f | allow entry of any number of characters; the next character, f, is one of A, 9 or X and specifies what kind of characters can be entered. |
| \c | display the next character, c, in the entry field; allows display of the formatting characters in the entry field. |

Format hints indicate what kind of value is expected. If a format hint is not understood, it is ignored. Currently defined format hints are:

| | |
|---|---|
| text | text is expected to be text, use special input techniques; generally follows *A or *X |
| mail-reply | like text, but expected text is for an e-mail message or page; may affect input algorithm |
| address-list | entry is a list of e-mail addresses |
| o-default | ::= default= value |

The o-default option supplies a value that is used if the user simply hits NEXT. If no default value is given, then the user must supply a value.

Formatted Text

```
formatted-text ::= { { flow-image } { line-format }
                   text-line )*
formatted-line ::= text-line
    text-line  ::= { text | image | text-format |
                   alignment-format }*
```

Formatted text is what is shown to the user in most cards. Formatted lines are used for choice entries.

```
text-format ::= <B> | <I> | <BL>
            ::= </B> | <I> | <BL>
```

The format codes control Bold, Italic and Blinking. The slash versions cancel the formatting. Unlike HTML, these needn't be strictly nested and over application and over cancellation are tolerated. Formatted-text and formatted-line elements start in plain mode (no bold, italic, or blinking).

```
alignment-format ::= <CENTER>| <BOLD> | <TAB>
```

The alignment codes specify how parts of a line are to be laid out. The text following the alignment code is either centered or right justified on the same line as the other text. The text or image following the code is considered to be all text up to the next alignment code or line break. All lines start implicitly aligned left. Note that these do not include an implicit line break so that one can have both left and right justified text on a single line. If there is too much text and not enough room on the line then, if in wrap mode, the non-fitting text is moved to the next line and aligned the same way. If in line mode, the line may end up running together with two spaces between the left, center, and right justified segments.

The tab code is used to create aligned columns. Rather than tab to specific character positions, the tab code separates the text for each column. The width of the column is determined by the maximal width of the text (or images) in each line. The extent of the columns is from the first line with tab codes through the last contiguous line with tab codes. Some lines may have fewer tab codes than others, in which case they are assumed to have no text for the extra columns.

```
line-format ::= <WRAP> | <LINE>
            ::= <BR>
```

Multiple lines of text are separated by the <BR> code. If a line is too long to fit on the screen and, if in wrap mode, the line is word wrapped onto multiple lines. If in line mode, the line is left as one line and is scrolled horizontally. Formatted-text and formatted-line elements start in wrap mode and may be changed with either the <WRAP> or <LINE> codes. These codes are an implicit line break.

Images

```
image ::= <IMAGE ol(image-options) >
      ::= <INLINE ol(image-options) >
          inline-data </INLINE>
flow-image ::= <IMAGE ol(flow-image-options) >
           ::= <INLINE ol(flow-image-options) >
               inline-data </INLINE>
image-options ::= o-source
flow-image-options ::= image-options | o-flow
inline-data ::= ASCII85 encoding of image data
```

Images are treated as large words and, by default, are simply displayed as part of the text. Flow-Images have a flow option that causes them to be treated differently. The image data is stored in a separate data stream as identified by the source option.

Inline images are treated identically, only the data is part of the current data stream. ASCII85 is a standard way of encoding binary data in printable ASCII, whereby each four bytes of data is encoded in five characters. Note that TIL only uses inline images, and uses a different encoding.

```
o-source ::= src= location
```

This option specifies the location of the source for images.

```
o-flow ::= flow= { left | right }
```

This option controls the alignment of flow-images. The option specifies that the image is flush left or flush right with the screen. Subsequent lines of text flow in the remaining right or left hand space.

Softkeys

```
softkey      ::= <SOFTKEY ol(softkey-options) >
softkey-options ::= o-label | o-button | action-options
```

Softkeys supply definitions for two buttons known as SOFT-L and SOFT-R. They do not show up in the normal text and graphics area displayed to the user, but on a separate line for soft key labels. (Note: in some implementations, where screen real estate is scarce, this label line may get used for normal text and graphics display when there are no softkeys defined on the current card).

When the softkey is pressed, the indicated action takes place.

```
o-button ::= button= side
    side ::= left | right
 o-label ::= label= value
```

The button option specifies which physical key the softkey applies to. The label option is the text that is displayed on screen for that key. The phone may truncate the label. It is suggested that labels be fewer than eight characters.

Softkeys can be specified both for the deck as a whole and per card. When specified for the deck (after the deck-header, but before the first card) they remain in effect for the entire deck. When specified for a card (at the beginning of the formatted-text for the card), they temporarily override any deck softkeys while the card is visible. Note that the override is done independently for the two keys (a card can override one softkey, but not the other). To override a deck softkey with no softkey (in effect, to remove a softkey for the duration of a card) use a softkey with no label and no action.

Syntax: Options

Many of the syntactic elements of PIDL have option lists associated with them. Options refine the operation of the elements they are part of. Unless otherwise noted, options do not nest, even when the same option is given in two nested elements. Options that are not defined for an element are ignored, even if valid for an enclosing element.

```
ol(valid-option) ::= { blank-space valid-option }*
                     {blank-spaces }
     option-list ::= ol(option)
          option ::= key = value
             key ::= identifier
           value ::= plain-text
                 ::= " { text } "
```

An option list contains zero or more options. Each option is separated by blank-space (required!) and optionally followed by blank-space. In the syntax diagrams, option lists are shown as: ol(valid-option) where valid-option is replaced with an element that defines the possible options in this context. ol is a generic syntactic description of option-lists.

Each option is a key and a value. They may be given in any order within the list of options. The key is always an alpha-numeric name that is case insensitive. The value, if it is composed of only alphanumeric characters, may appear directly after the equals sign. Otherwise, the value must be quoted. In quotes, blank-space is treated literally and is considered part of the value.

In the syntax diagrams, the possible values for various options are specified without quotes. However, quotes are always acceptable around an option value.

Unlike almost all other syntactic elements, blank space is not permitted between the key and the equals sign or between the equals sign and the value.

Many options have a more restricted set of possible values than represented by the above syntax. See the individual options for details.

Destinations

```
destination  ::= location { ; animation }
             ::= card-loc { ; animation }
             ::= stack-operation { ; animation }
    location ::= full-loc | partial-loc
              | relative-loc
    full-loc ::= : service-id / deck-path
             ::= : service-host / deck-path
 partial-loc ::= / deck-path
relative-loc ::= { ../ }* deck-path
    card-loc ::= # identifier
   deck-path ::= plain-text { / plain-text }*
  service-id ::= % plain-text
service-host ::= plain-text
```

Destinations are used in some options to indicate the next, or previous deck or card to show. A deck is specified either with a full location (service-id and deck-path), just a deck-path (in which case the service is the same as the current deck's service), or a relative deck-path. In the later case, the last component of the current deck-path is removed, (and one additional component for each ../ in the relative deck-path), and the deck-path appended.

A particular card can be a destination and is specified by a card-loc element.

```
stack-operation ::= + card-loc
                ::= -
```

In addition to the normal history list of where a user has been that is kept by a phone, the phone also keeps a short stack of locations. Using a plus sign form causes the current location (deck and card, and location in the history list, and animation used) to be pushed on the stack before going to the new card. Using the minus sign form causes a return to the location on the top of the stack, and the history list to be pruned back to the saved point. If no animation is given, the inverse animation is used. The stack is popped.

```
animation ::= slideN | slideS
          ::= slideW | slideE
          ::= slideSW | slideNE
          ::= slideSE | slideNW
          ::= flipV
          ::= flipH
          ::= fade
          ::= none
```

The optional animation argument indicates what form of screen animation, if available, is to be used when going to the destination. The animation is remembered with the destination in the history and destination stack. If the user moves to a destination via a 'go' or 'next' operation, then the animation is performed. If the user moves to a destination via a 'prev' or 'pop' operation, the reverse animation associated with the current location is performed.

Actions

Choice entries and soft keys can specify actions to be performed when the user selects the choice or softkey.

```
action-options ::= o-args | o-call
                 | o-page
         o-go ::= go= destination
       o-call ::= call= value
```

The go operation indicates that the destination should be moved.

Argument Processing

Each time a deck is requested, arguments may be passed along with the request. These arguments may be used by the service end to compute a deck specific for the user rather than just return a pre-written deck.

Arguments are built-up as the user traverses the deck. Each argument is a key-value pair. While arguments superficially look like options, these two entities are quite distinct: Options are a part of PIDL and affect the operation of the phone. Arguments are information gathered by the phone and returned to the service. Neither PIDL nor the phone understands the arguments beyond their basic syntactic structure.

Arguments come from three places: Choice cards, Entry cards, and the args option. Each of these specifies a key-value pair that is added to a buffer of arguments to be sent. In the case of the args option, multiple arguments may be specified. When an argument key-value pair is added to the argument buffer, if the key is already present in the buffer, its value is replaced.

```
       o-args ::= args= arg-list
argument-list ::= arg-key-value { { & | ; }
                  key-value }*
arg-key-value ::= arg-key = arg-value
      arg-key ::= identifier
    arg-value ::= plain-text
```

Note: The entire o-args element is actually the value of an option. If it has more than one arg-key-value it will need to be in quotes. Since the ampersand (&) and semi-colon (;) are used as key-value pair separators, these characters cannot be part of argument values.

```
o-key   ::= key= arg-key
o-value ::= value= arg-value
```

These options are used in choice and entry cards to specify the key and value for the arguments those cards set.

Basic Elements

```
        alpha ::= any alphabetic character
      numeric ::= any digit
alpha-numeric ::= alpha | numeric
          hex ::= numeric | any letter A through F,
                  either case
  blank-space ::= { space | tab | new-line }+
        space ::= the space character
          tab ::= the tab character
     new-line ::= the carriage return character
              ::= the line feed character
              ::= the sequence carriage return, line
                  feed
         word ::= { alpha-numeric }+
   identifier ::= alpha { alpha-numeric }*
      integer ::= { + | - } { numeric }+
         text ::= any 7-bit ASCII character except <,
                  >, ", or &
              ::= > | < | " | &
                |  
              ::= any ISO-Latin-1 named entity
              ::= &# hex hex ;
```

In text, runs of blank-space are treated as single spaces and my be used as point for word wrapping.

```
plain-text ::= { alpha | numeric | safe }*
      safe ::= $ | - | _ | @ | . | & | !
             | * | ,
```

TIL Encoding

Except where noted, TIL is identical to PIDL in structure. To translate PIDL to TIL several steps are conceptually needed (these may be done in one pass by a translator):

1. Escape characters with the high bit set.
2. Compress or remove all blank space where possible.
3. Tokenize comment elements with a single byte with the high bit set.
4. Inline images.

Fundamentally, TIL is just PIDL with certain common character sequences replaced by single bytes with the high-bit set. The first two steps above support this. Additionally, images are further compacted by including them inline in a dense format.

The tokenizing follows the encoding given in the table below. Note that for purposes of element separation, the tokens that represent option key identifiers (with the equal sign) can be considered to include all preceding blank space. Similarly, the tokens that represent option values can be considered to include all following blank space.

| <PIDL>     | 90 | args=    | C0 | alpha  | E0 |
| </PIDL>    | 91 | button=  | C1 | center | E1 |
| <DISPLAY>  | 92 | call=    | C2 | fade   | E2 |
| </DISPLAY> | 93 | cost=    | C3 | flipH  | E3 |
| <CHOICE>   | 94 | default= | C4 | flipV  | E4 |
| </CHOICE>  | 95 | flow=    | C5 | group  | E5 |
| <ENTRY>    | 96 | format=  | C6 | inline | E6 |
| </ENTRY>   | 97 | go=      | C7 | left   | E7 |
| <CE        | A0 | key=     | C8 | list   | E8 |
| <GE        | A1 | label=   | C9 | none   | E9 |
| <IMAGE     | A2 | method=  | CA | number | EA |
| <INLINE    | A3 | name=    | CB | right  | EB |
| <SOFTKEY   | A4 | next=    | CC | slideE | EC |
| <B>        | B0 | page=    | CD | slideN | ED |

-continued

| | | | | | | | |
|---|---|---|---|---|---|---|---|
| </B> | B1 | prev= | CE | slideNE | EE | | |
| <I> | B2 | src= | CF | slideNW | EF | | |
| </I> | B3 | ttl= | D0 | slideS | F0 | | |
| <BL> | B4 | value= | D1 | slideSE | F1 | | |
| </BL> | B5 | | | slideSw | F2 | | |
| <CENTER> | B6 | | | slideW | F3 | | |
| <RIGHT> | B7 | | | | | | |
| <WRAP> | B8 | | | | | | |
| <LINE> | B9 | | | | | | |
| <BR> | BA | | | | | | |

APPENDIX II

A COMPUTER PROGRAM TO GENERATE
A LETTER FREQUENCY TABLE
FOR USE IN THE PREDICTIVE DATA ENTRY PROCESS
Unpublished ® 1995 Libris, Inc.

```
/*    This program opens a text file selected by the
      user, generates the frequency table for that fiie,
      and then writes the frequency table to another
      file also selected by the user.
*/
#include <stdio.h>
#include <string.h>
#include <console.h>
#include <assert.h>
typedef unsigned char byte;
typedef byte triplet [3];
typedef byte tristorage [27] [27] [27];
IncrementTrigram(triplet t, tristorage trigrams)
{
    byte * pb;
    assert (t[0] < 27);
    assert (t[1] < 27);
    assert (t[2] < 27);
    pb = &trigrams [t[0]] [t[1]] [t[2]];
    if (*pb < 255) *pb = *pb + 1;
    return *pb;
}
StoreTrigramValue(triplet t, tristorage trigrams, byte
value)
{
    assert (t[0] < 27);
    assert (t[1] < 27);
    assert (t[2] < 27);
    trigrams [t[0]] [t[1]] [t [2]] = value;
}
byte FetchTrigramvalue(triplet t, tristorage trigrams)
{
    assert (t[0] < 27);
    assert (t[1] < 27);
    assert (t[2] < 27);
    return trigrams [t[0]] [t[1]] [t[2]];
}
byte DumpTrigram (triplet t; tristorage trigrams)
{
    byte value;
    assert (t[0] < 27);
    assert (t[1] < 27);
    assert (t[2] < 27);
    value = FetchTrigramvalue(t, trigrams);
    if (value != 0)
    {
        printf("%c%c%c = ", t[0] + 'a', t[1] + 'a', t[2] +
'a');
        if (value == 255) printf("***");
        else\\\printf("%3d", value);
    }
return value;
}
int IdFromChar(short c)
{
    c = tolower(c);
    if (c < 'a' || c >'z') return 26;
    return c - 'a';
}
```

APPENDIX II-continued

A COMPUTER PROGRAM TO GENERATE
A LETTER FREQUENCY TABLE
FOR USE IN THE PREDICTIVE DATA ENTRY PROCESS
Unpublished ® 1995 Libris, Inc.

```
Addchar(tristorage trigrams, triplet t, byte b)
{
    byte value;
    unsigned short r;
    assert (b <= 26);
    if (b == 26) { t[0] = t[1] = t[2] = 26; return; }
    t[0] = t[1];
    t[1] = t[2];
    t[2] = b;
    value = FetchTrigramValue (t, trigrams);
    if (value == 255) return;
#if 0
    if (value > 64) {
        r = Random( );
        if (value > 192 && r & 0xE0000) return;
        else if (value > 128 && r & 0xC000) return;
        else if (value > 64 && r & 0x8000) return;
    }
#endif
    storeTrigramValue (t, trigrams, value + 1);
}
DumpTrigrams (tristorage trigrams)
{
    int i, j, k;
    int x;
    triplet t;
    x = 0;
    for (i = 0; i < 26; ++i)
        for (j = 0; j < 26; ++j)
            for (k = 0; k < 26; ++k)
            {
                byte value;
                t[0] = i;
                t[1] = j;
                t[2] = k;
                value = DumpTrigram (t, trigrams);
                if (value == 0) continue;
                if (++x == 6) {
                    printf ("\n"); x = 0;
                }
                else
                    printf(" ");
            }
}
OSErr BuildTrigram (short refNum, tristorage trigrams)
{
    OSErr err;
    triplet t;
    t[0] = t[1] = t[2] = 26;
    while (true)
    {
        long count = 80;
        char buf[80];
        int i;
        err = FSRead (refNum, &count, buf);
        if (count ==0) return err;
        for (i = 0; i < count; ++i) {
            AddChar (trigrams, t, IdFromChar(buf [i]));
        }
        if (err) return err;
    }
    return 0;
}
Handle OpenTrigrams (void)
{
    OSErr err;
    OSType type;
    StandardFileReply reply
    short refNum;
    short id;
    Handle h;
    Str63 name;
    tristorage *trigrams;
    type = 'TEXT';
```

APPENDIX II-continued

A COMPUTER PROGRAM TO GENERATE
A LETTER FREQUENCY TABLE
FOR USE IN THE PREDICTIVE DATA ENTRY PROCESS
Unpublished ® 1995 Libris, Inc.

```
    StandardGetFile (nil, 1, &type, &reply);
    if (!reply.sfGood) return nil;
    err = FSpOpenDF (&reply.sfFile, fsCurPerm, &refNum);
    if (err) return nil;
    memcpy(name, reply.sfFile.name, sizeof(name));
    h = NewHandle(sizeof(tristorage)) ;
    HLock (h);
    trigrams = (tristorage *) (*h);
    memset (*trigrams, 0, sizeof(tristorage));
    BuildTrigram (refNum, *trigrams);
    FSClose (refNum);
    DumpTrigrams (*trigrams);
    Hunlock (h);
    type = 'rsrc';
    StandardGetFile (nil, 1, &type, &reply);
    if (!reply.sfGood) return;
    refNum = FSpOpenResFile (&reply.sfFile, fsCurPerm);
    if (refNum == -1) return;
    UseResFile(refNum);
    id = Unique1ID('smrt');
    //id = 128;
    AddResource (h, 'smrt', id, name);
    UpdateResFile (refNum);
    FSClose (refNum);
    return h;
}
main( )
{
    OSErr err;
    Handle h;
    cshow (stdout);
    TEInit ( );
    InitDialogs (OL);
    InitCursor ( );
    h = OpenTrigrams ( );
```

I claim:

1. A predictive data entry method in a device having a keypad and a display, wherein said keypad includes a plurality of keys and each key in said plurality of keys represents a plurality of different characters, said predictive data entry method comprising:

generating, in said device, a table index using at least one character in a memory buffer of said device in combination with information characterizing a first key pressed by a user wherein said first key is one key in said plurality of keys;

said generating said table index is performed upon said one key being pressed;

retrieving at least one predictive character entry from a table of predictive character entries stored in a memory of said device using said table index wherein said at least one predictive character entry represents a first character in the plurality of characters represented by said first key;

displaying on said display a character corresponding to said predictive character;

detecting a second key pressed on said keypad; and wherein if said second key pressed is a designated control key, substituting said first character by a second character in said plurality of characters represented by said first key.

2. The method of claim 1 wherein each predictive character entry in said table of predictive character entries is an S bit entry wherein S selected such that 2**S is approximately equal to a maximum plurality of characters represented by a key in said keypad.

3. The method of claim 1 wherein said keypad represents a telephone keypad that includes key number zero through key number nine with key number seven representing letters P, Q, R, and S and key number nine representing letters W, X, Y, and Z.

4. The method of claim 1 wherein said at least one character in said buffer memory is included in a plurality of characters in said memory buffer and further wherein said plurality of characters are used in generating said table index.

5. The method of claim 4 wherein said plurality of characters used in generating said table index comprises two characters.

6. The method of claim 5 wherein each character in said plurality of characters in said memory buffer is a character in a set of characters and further wherein each character in said set of characters is represented by a unique number and said unique numbers range from 0 to (N−1) where N is a number of characters in said set.

7. The method of claim 6 wherein said set of characters includes an alphabet.

8. The method of claim 7 wherein said set of characters further includes a space element.

9. The method of claim 6 wherein said plurality of keys comprises M keys where M is an integer.

10. The method of claim 9 wherein each key in said plurality of keys is assigned a unique number from one to M.

11. The method of claim 10 further comprising:

defining an index i0 for a first character in said two characters as said unique number representing said first character.

12. The method of claim 11 further comprising:

defining an index i1 for a second character in said two characters as said unique number representing said second character.

13. The method of claim 12 wherein said information characterizing a key pressed by a user is an index i2.

14. The method of claim 13 wherein said index i2 is defined as said unique number assigned to said pressed key minus one.

15. The method of claim 14 wherein said index is a TABLE_INDEX defined as:

$$TABLE\_INDEX=(((i0*N)+i1)*M)+i2.$$

16. The method of claim 15 wherein each predictive character entry in said table of predictive character entries is an S bit entry wherein S selected such that 2**S is approximately equal to a maximum plurality of characters represented by a key in said keypad.

17. A predictive data entry method in a device having a telephone keypad and a display, wherein said telephone keypad includes key number zero through key number nine with letters Q and Z and a space element being represented on keys included in said key number zero through key number 9, said predictive data entry method comprising:

generating, in said device, a table index using at least one character in a memory buffer of said device in combination with information characterizing a first key pressed by a user wherein said key pressed is one of key number one through key number nine; and said generating a table index is performed upon said key being pressed;

retrieving at least one predictive character entry from a table of predictive character entries stored in a memory of said device using said table index wherein said at least one predictive character entry represents a first character in the plurality of characters represented by said first key, displaying on said display a character corresponding to said predictive character entry;

detecting a second key pressed on said key pad; and wherein if said second key is a designated control key, substituting said first character by a second character in said plurality of characters represented by said first key.

18. The method of claim 17 wherein each predictive character entry in said table of predictive character entries is a two bit entry.

19. The method of claim 17 wherein said at least one character in said buffer memory is included in a plurality of characters in said memory buffer and further wherein said plurality of character are used in generating said table index.

20. The method of claim 19 wherein said plurality of characters used in generating said table index comprises two characters.

21. The method of claim 20 wherein each character in said plurality of characters in said memory buffer is a character in a set of characters and further wherein each character in said set of characters is represented by a unique number and said unique numbers range from 0 to (N−1) where N is a number of characters in said set.

22. The method of claim 21 wherein N is twenty-seven.

23. The method of claim 21 further comprising:

defining an index i0 for a first character in said two characters as said unique number representing said first character.

24. The method of claim 23 further comprising:

defining an index i1 for a second character in said two characters as said unique number representing said second character.

25. The method of claim 24 wherein said information characterizing said key pressed by said user is an index i2.

26. The method of claim 25 wherein said index i2 is defined as said number of said pressed key minus one.

27. The method of claim 26 wherein said table index is a TABLE_INDEX defined as:

$$TABLE\_INDEX=(((i0*27)+i1)*9)+i2.$$

28. The method of claim 27 wherein each predictive character entry in said table of predictive character entries is an two bit entry.

* * * * *